US012805299B2

(12) United States Patent
(10) Patent No.: US 12,805,299 B2
(45) Date of Patent: Nov. 17, 2026

Zhu et al.

(54) SRAM CELL WITH INCREASED STORAGE DENSITY, MEMORY INCLUDING THE SAME, AND ELECTRONIC APPARATUS INCLUDING THE SAME

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Xinhao Li, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 449 days.

(21) Appl. No.: 18/397,579

(22) Filed: Dec. 27, 2023

(65) Prior Publication Data

US 2025/0183167 A1 Jun. 5, 2025

(30) Foreign Application Priority Data

Nov. 30, 2023 (CN) ......................... 202311633366.8

(51) Int. Cl.
*H10W 20/41* (2026.01)
*H10B 10/00* (2023.01)
(Continued)

(52) U.S. Cl.
CPC ........ *H10W 20/435* (2026.01); *H10B 10/125* (2023.02); *H10D 30/43* (2025.01); *H10D 30/6757* (2025.01); *H10D 62/121* (2025.01)

(58) Field of Classification Search
CPC .. H10W 20/435; H10W 20/43; H10B 10/125; H10B 10/12; H10D 30/6757; H10D 30/014
(Continued)

(56) References Cited

U.S. PATENT DOCUMENTS 8,647,938 B1 2/2014 Baars et al.
9,419,003 B1 * 8/2016 Colinge ................ H10B 10/12
(Continued)

FOREIGN PATENT DOCUMENTS

CN 110634870 A 12/2019

OTHER PUBLICATIONS

First Chinese Office Action dated Apr. 17, 2026, for corresponding Chinese Patent Application No. 202311633366.8, 12 pgs.

*Primary Examiner* — Eliseo Ramos Feliciano
*Assistant Examiner* — Mikka Liu
(74) *Attorney, Agent, or Firm* — Kinney & Lange, P.A.

(57) ABSTRACT

A static random access memory (SRAM) cell includes: a substrate; first and second interconnection structures parallel to an upper surface of the substrate and opposite to each other; a first pull-down (PD) transistor and a first pass gate (PG) transistor on the first interconnection structure; a second PD transistor and a second PG transistor on the second interconnection structure; a first pull-up (PU) transistor under the first interconnection structure and overlapping vertically with the first PD transistor; and a second PU transistor under the second interconnection structure and overlapping vertically with the second PD transistor. Channel layers of the first PU, PD, PG transistors are offset from the first interconnection structure on a side away from the second interconnection structure. Channel layers of the
(Continued)

second PU, PD, PG transistors are offset from the second interconnection structure on a side away from the first interconnection structure.

23 Claims, 63 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |

(58) Field of Classification Search
USPC .......................................................... 257/734
See application file for complete search history.

(56) References Cited

U.S. PATENT DOCUMENTS

| | | | | |
|---|---|---|---|---|
| 2022/0122993 | A1* | 4/2022 | Chiu | H10D 89/10 |
| 2022/0181453 | A1 | 6/2022 | Liebmann et al. | |
| 2022/0208258 | A1* | 6/2022 | Zhu | H10B 10/12 |

* cited by examiner

SRAM CELL WITH INCREASED STORAGE DENSITY, MEMORY INCLUDING THE SAME, AND ELECTRONIC APPARATUS INCLUDING THE SAME

CROSS REFERENCE TO RELATED APPLICATION(S)

This application claims priority to Chinese Patent Application No. 202311633366.8, filed on Nov. 30, 2023 and entitled "SRAM CELL, MEMORY INCLUDING SRAM CELL, AND ELECTRONIC APPARATUS INCLUDING SRAM CELL", the entire content of which is incorporated herein by reference.

TECHNICAL FIELD

The present disclosure relates to a field of semiconductors, and in particular to a static random access memory (SRAM) cell, a method of manufacturing the SRAM cell, a memory including the SRAM cell, and an electronic apparatus including the SRAM cell.

BACKGROUND

In a horizontal device such as a metal oxide semiconductor field effect transistor (MOSFET), a source, a gate and a drain are arranged in a direction substantially parallel to a surface of a substrate. Due to such an arrangement, the horizontal device is difficult to be further scaled down. In contrast, in a vertical device, a source, a gate and a drain are arranged in a direction substantially perpendicular to the surface of the substrate. As a result, the vertical device is easier to be scaled down compared to the horizontal device.

In addition, it is desired to improve an integration to increase a storage density. Therefore, the vertical device has a promising application in a memory device such as a static random access memory (SRAM).

SUMMARY

In view of this, an objective of the present disclosure is at least partially to provide a static random access memory (SRAM) cell with an improved performance, a method of manufacturing the SRAM cell, a memory including the SRAM cell, and an electronic apparatus including the SRAM cell.

According to an aspect of the present disclosure, an SRAM cell is provided, including: a substrate; a first interconnection structure and a second interconnection structure on the substrate, where the first interconnection structure and the second interconnection structure extend substantially parallel to an upper surface of the substrate and are arranged opposite to each other; a first pull-down transistor and a first pass gate transistor, where the first pull-down transistor and the first pass gate transistor are arranged on the first interconnection structure; a second pull-down transistor and a second pass gate transistor, where the second pull-down transistor and the second pass gate transistor are arranged on the second interconnection structure; a first pull-up transistor arranged under the first interconnection structure and at least partially overlapping with the first pull-down transistor in a vertical direction; a second pull-up transistor arranged under the second interconnection structure and at least partially overlapping with the second pull-down transistor in the vertical direction. Each of the first pull-up transistor, the second pull-up transistor, the first pull-down transistor, the second pull-down transistor, the first pass gate transistor and the second pass gate transistor includes a first source/drain layer, a channel layer and a second source/drain layer arranged sequentially in the vertical direction. The channel layer of the first pull-up transistor, the channel layer of the first pull-down transistor and the channel layer of the first pass gate transistor are offset relative to the first interconnection structure on a side away from the second interconnection structure. The channel layer of the second pull-up transistor, the channel layer of the second pull-down transistor and the channel layer of the second pass gate transistor are offset relative to the second interconnection structure on a side away from the first interconnection structure.

According to another aspect of the present disclosure, a method of manufacturing an SRAM cell is provided, including: providing a stack of a first source/drain layer, a first channel defining layer and a second source/drain layer in a first group and a first source/drain layer, a second channel defining layer and a second source/drain layer in a second group sequentially on a substrate; forming a hard mask layer on the stack, where the hard mask has a rectangular ring pattern, a first protruding pattern, a second protruding pattern, a third protruding pattern, and a fourth protruding pattern, where the rectangular ring pattern has a first side and a third side extending in a first direction and opposite to each other, and a second side and a fourth side extending in a second direction intersecting with the first direction and opposite to each other, and the first protruding pattern and the second protruding pattern are provided on the first side of the rectangular ring pattern, and the third protruding pattern and the fourth protruding pattern are provided on the third side of the rectangular ring pattern; patterning an outer side of the stack by using the hard mask layer; refining the channel defining layers so that a first pull-up portion and a second pull-up portion that respectively overlap with the first protruding pattern and the third protruding pattern in the vertical direction are retained in the first channel defining layer and are recessed laterally relative to the first protruding pattern and the third protruding pattern, respectively, and that a first pull-down portion, a first pass gate portion, a second pull-down portion and a second pass gate portion that respectively overlap with the first protruding pattern to the fourth protruding pattern in the vertical direction are retained in the second channel defining layer and are recessed laterally relative to the first protruding pattern to the fourth protruding pattern, respectively; forming channel layers on vertical sidewalls of end portions in the second direction of the first pull-up portion, the second pull-up portion, the first pull-down portion, the first pass gate portion, the second pull-down portion and the second pass gate portion of the channel defining layers; and patterning an inner side of the stack using the hard mask layer, where the patterning further includes: performing a selective etching on the second source/drain layer in the second group, so that the second source/drain layer in the second group is separated into four separate portions respectively corresponding to the first protruding pattern to the fourth protruding pattern; removing the second channel defining layer; cutting off the second source/drain layer in the first group and the first source/drain layer in the first group in a region between the first protruding pattern and the fourth side and in a region between the third protruding pattern and the second side, so as to form a first interconnection structure and a second interconnection structure; and removing the first channel defining layer.

According to another aspect of the present disclosure, an electronic apparatus is provided, including a memory device including the SRAM cell described above.

BRIEF DESCRIPTION OF THE DRAWINGS

The above and other objectives, features and advantages of the present disclosure will be more clear through the following description of embodiments of the present disclosure with reference to the accompanying drawings, where in the drawings.

Throughout the accompanying drawings, the same or similar reference signs indicate the same or similar components.

DETAILED DESCRIPTION OF EMBODIMENTS

Embodiments of the present disclosure will be described under with reference to accompanying drawings. However, it should be understood that these descriptions are just exemplary and are not intended to limit the scope of the present disclosure. In addition, in the following, descriptions of well-known structures and technologies are omitted to avoid unnecessarily obscuring the concepts of the present disclosure.

Various schematic structural diagrams according to embodiments of the present disclosure are shown in the accompanying drawings. These figures are not drawn to scale. Some details are enlarged and some details may be omitted for clarity of presentation. Shapes of various regions and layers as well as the relative size and positional relationship thereof shown in the figures are just exemplary. In practice, there may be deviations due to manufacturing tolerances or technical limitations, and those skilled in the art may additionally design regions/layers with different shapes, sizes and relative positions according to actual needs.

In the context of the present disclosure, when a layer/element is referred to as being located "on" a further layer/element, the layer/element may be located directly on the further layer/element, or there may be an intermediate layer/element between them. In addition, if a layer/element is located "on" a further layer/element in an orientation, the layer/element may be located "under" the further layer/element when the orientation is reversed.

According to embodiments of the present disclosure, a static random access memory (SRAM) cell based on vertical nanosheet/nanowire metal oxide semiconductor field effect transistor (MOSFET) is provided. In the SRAM cell, vertical devices as constitute elements of the SRAM cell may be stacked in a vertical direction so as to further improve an integration.

Figure 1:
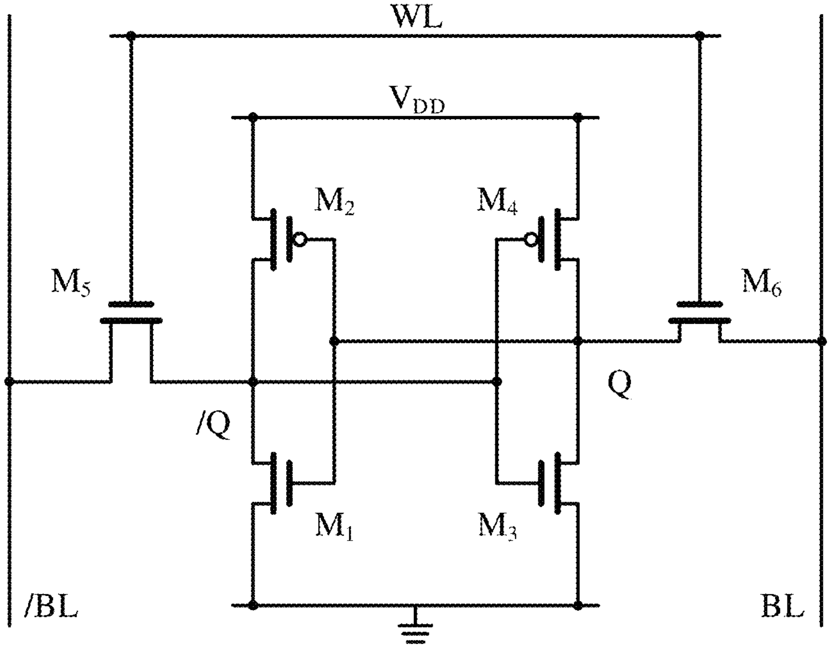
FIG. 1 schematically shows an equivalent circuit diagram of a static random access memory (SRAM) cell.

FIG. 1 schematically shows an equivalent circuit diagram of an SRAM cell.

As shown in FIG. 1, the SRAM cell may have a 6T structure, which includes six constituent transistors $M_1$ to $M_6$, such as field effect transistors (FETs). Four transistors $M_1$, $M_2$, $M_3$ and $M_4$ among the six transistors may form two cross-coupled inverters, which serve as a storage position for storing a bit in the SRAM cell. The other two transistors $M_5$ and $M_6$ may respectively control a data transmission between the storage position and a bit line BL and a data transmission between the storage position and a complementary bit line /BL under a control of a word line WL, so as to achieve read/write.

Among the four transistors $M_1$, $M_2$, $M_3$ and $M_4$ forming the cross-coupled inverters, two p-type transistors $M_2$ and $M_4$ may be connected to a power voltage $V_{DD}$, and may therefore be referred to as "pull-up transistors" (PUs); two n-type transistors $M_1$ and $M_3$ may be connected to a ground voltage and may therefore be referred to as "pull-down transistors" (PDs). The transistors $M_5$ and $M_6$ (which may also be n-type transistors) may control read/write, or data transmission, and may therefore be referred to as "access control transistors" or "pass gate transistors" (PGs).

Hereinafter, read/write operations of such a 6T SRAM cell will be briefly described.

Firstly described is a read operation. Assuming that a bit "1" is stored at the storage position, that is, a node Q is at a high level and a node /Q is at a low level. At the beginning of a read cycle, the bit line BL and the complementary bit line /BL may be pre-charged as logic 1, and then the word line WL may be charged with a high level, so that the access control transistors $M_5$ and $M_6$ are turned on. Due to the high level at the node Q, the pull-up transistor $M_2$ is turned off and the pull-down transistor $M_1$ is turned on, then the pull-down transistor $M_1$ and the access control transistor $M_5$ connect the complementary bit line /BL to ground. Accordingly, the pre-charged value of the complementary bit line /BL is discharged, resulting in a zero value on the complementary bit line /BL. Moreover, due to the low level at the node /Q, the pull-up transistor $M_4$ is turned on and the pull-down transistor $M_3$ is turned off, then the pull-up transistor $M_4$ and the access control transistor $M_6$ connect the bit line BL to the power voltage VDD. Accordingly, the pre-charged value of the bit line BL is maintained, that is, a value 1 is on the bit line BL. If the bit "0" is stored, an opposite circuit state may result in a value 1 on the complementary bit line /BL and a value 0 on the bit line BL. By identifying which of the bit line BL and the complementary bit line /BL is at a high level, the stored bit "0" or "1" may be read out.

In a write operation, at the beginning of a write cycle, a state to be written is loaded onto the bit line BL. For example, in order to write "0", it is needed to set the bit line BL to "0" (and set the complementary bit line /BL to "1"). Then, the word line WL may be charged with a high level, so that the access control transistors $M_5$ and $M_6$ are turned on and thus load the state of the bit line BL into the storage position of the SRAM cell. The above is achieved by designing (transistors) driven through an input of a bit line to be stronger than (transistors at) the storage position, so that a state of the bit line may cover a previous state of the cross-coupled inverters at the storage position.

Figure 2:
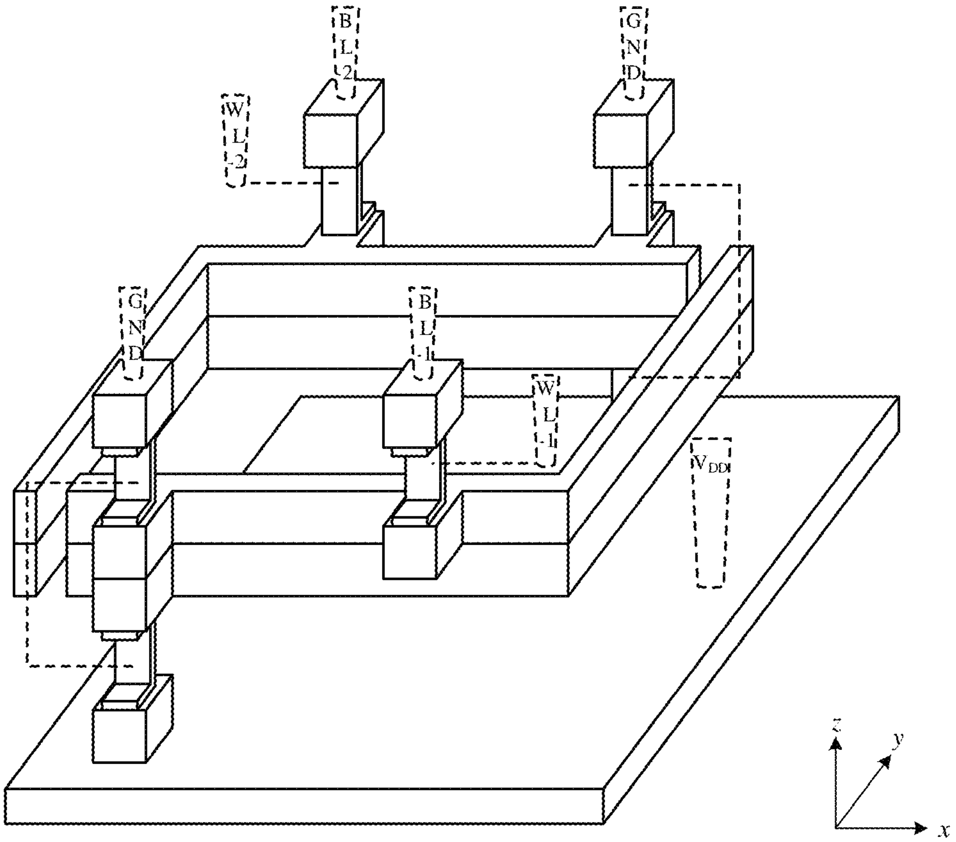
FIG. 2 schematically shows a perspective view of an SRAM cell according to embodiments of the present disclosure.
Figure 3A:
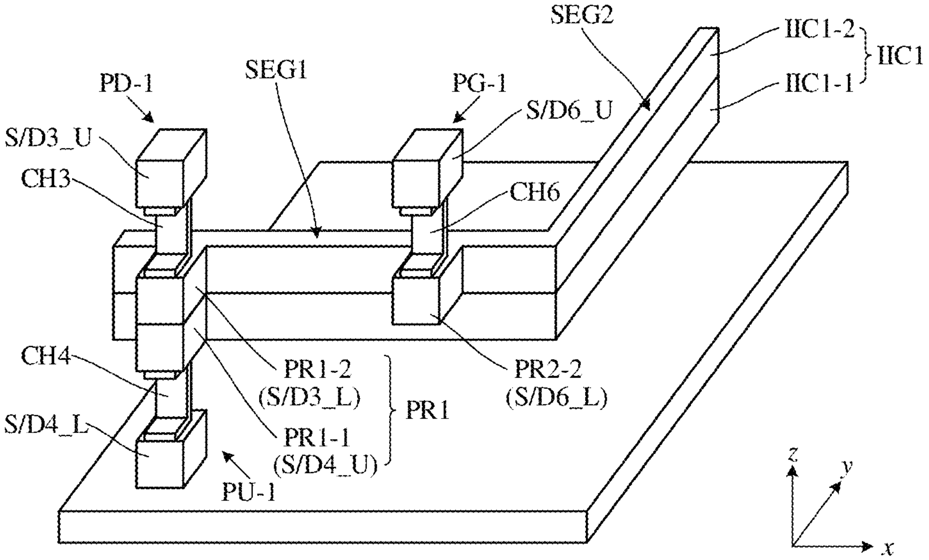
FIG. 3(*a*), FIG. 3(*b*) and FIG. 3(*c*) show exploded perspective views of the SRAM cell shown in FIG. 2.
Figure 3B:
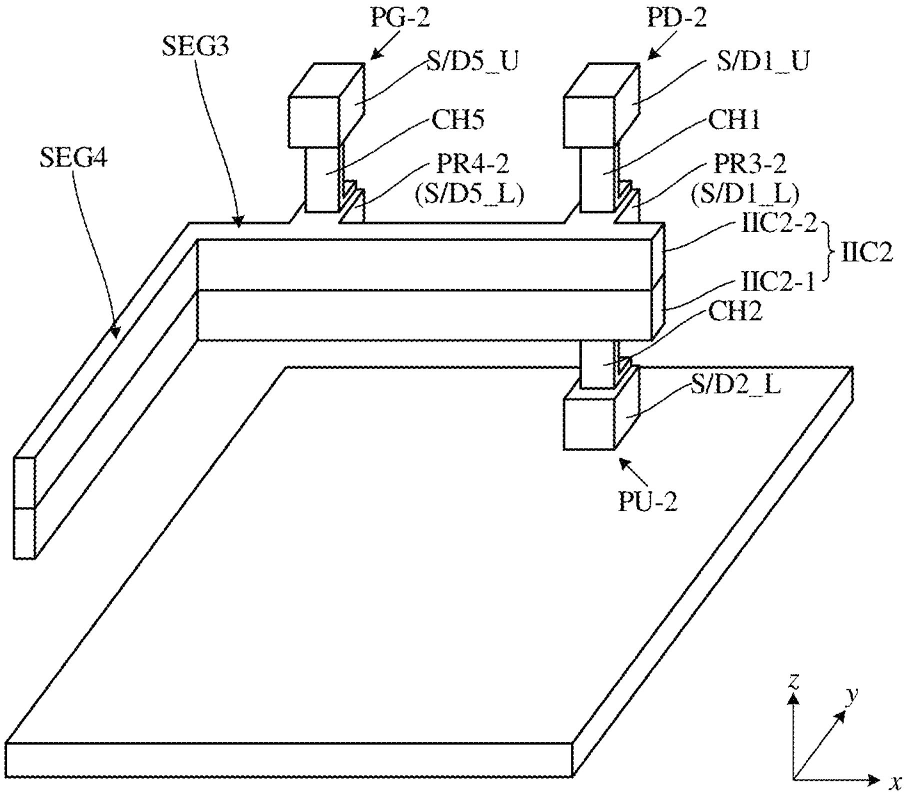
Figure 3C:
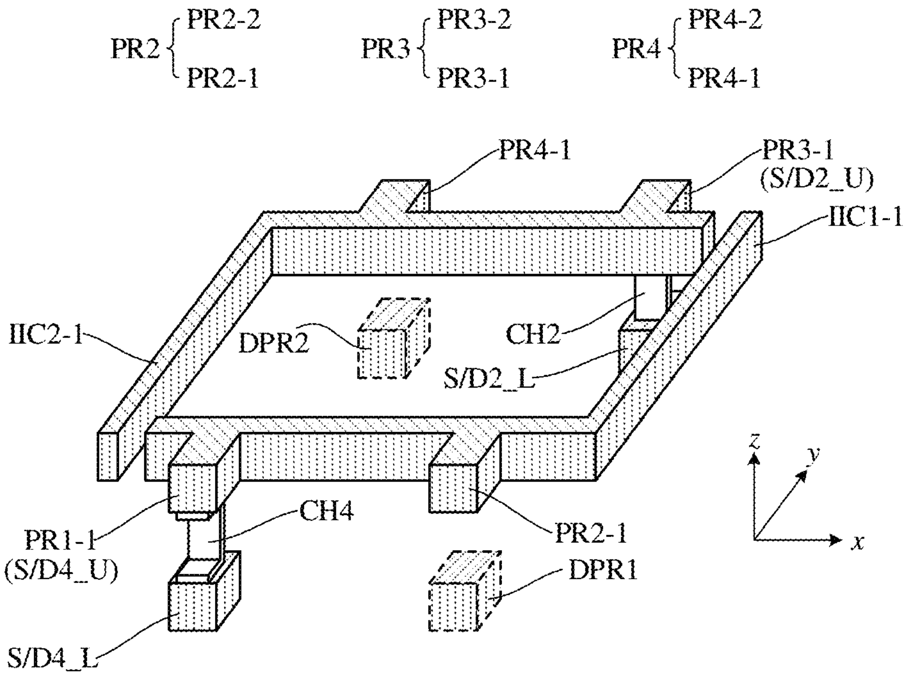

FIG. 2 schematically shows a perspective view of an SRAM cell according to embodiments of the present disclosure. FIG. 3(*a*), FIG. 3(*b*) and FIG. 3(*c*) show exploded perspective views of the SRAM cell shown in FIG. 2.

As shown in FIG. 2, FIG. 3(*a*), FIG. 3(*b*) and FIG. 3(*c*), the 6T SRAM cell may include six transistors, specifically including two pull-up transistors PU-1 and PU-2, two pull-down transistors PD-1 and PD-2, and two pass gate transistors PG-1 and PG-2. These transistors may all be vertical nanosheet/nanowire transistors.

Each transistor may include an active region extending in a vertical direction with respect to an upper surface of a substrate (for example, a direction substantially perpendicular to the upper surface of the substrate). The active region may include a channel region and source/drain regions located on opposite sides of the channel region in the vertical direction. As described under, the active region of the transistor may include a first source/drain layer, a channel layer, and a second source/drain layer that are stacked sequentially in the vertical direction. The source/drain regions may be formed substantially in the first source/drain layer and the second source/drain layer respectively, and the channel region may be formed substantially in the channel layer. For example, the source/drain regions may be achieved through doping regions in the source/drain layers. A gate stack may be formed around at least partial or even entire periphery of the channel region. For the sake of illustration, a position of the gate stack is shown by dashed lines in the perspective view of FIG. 2.

As shown, the active region, especially the channel layer, may have a form of nanosheet. The nanosheet may have a width in a first direction (for example, x-direction), a thickness in a second direction (for example, y-direction) intersecting with (for example, perpendicular to) the first direction, and a height in the vertical direction (for example, z-direction). The width of the nanosheet is generally greater than the thickness of the nanosheet. In a case of a small width, the nanosheet may become a nanowire. In this example, the nanosheet is shown as including a lateral extension portion extending laterally with respect to the substrate (more specifically, extending on a top or bottom surface of the corresponding source/drain layer) and a vertical extension portion extending vertically with respect to the substrate. Depending on process parameters (for example, an etching depth in an etching process, a grown film thickness in an epitaxial growth process, etc. to be described later), the lateral extension portion of the nanosheet may be relatively small or inconspicuous, so that the overall channel layer is in a form of a vertical nanosheet (or nanowire). The first source/drain layer and the second source/drain layer may be substantially self-aligned with the channel layer in the vertical direction.

The pull-up transistors PU-1 and PU-2 may be respectively self-aligned with and overlap at least partially with the pull-down transistors PD-1 and PD-2 in the vertical direction.

According to embodiments of the present disclosure, such a transistor may be a conventional FET. In a case of a conventional FET, the source/drain regions on both sides of the channel region may be doped with the same conductive type (for example, n-type or p-type). A conductive channel between the source/drain regions at both ends of the channel region may be formed through the channel region. Alternatively, such a transistor may be a tunneling FET. In a case of a tunneling FET, the source/drain regions on both sides of the channel region may be doped with different conductive types (for example, n-type and p-type, respectively). In this case, charged particles such as electrons may tunnel through the channel region from the source region and enter the drain region, so that a conductive path is formed between the source region and the drain region. Although having different conduction mechanisms, the conventional FET and the tunneling FET both exhibit an electrical property of controlling a conduction between the source/drain regions by a gate. Therefore, the conventional FET and the tunneling FET are uniformly described with terms "source/drain layer (source/drain region)" and "channel layer (channel region)", although there is no general "channel" in the tunneling FET.

Unlike a conventional SRAM cell in which the constituent transistors are arranged in a planar layout, the constituent transistors in the SRAM cell according to embodiments of the present disclosure may be stacked in the vertical direction to further save an area occupied by the SRAM cell.

According to embodiments, the constituent transistors in the SRAM cell may be stacked in the vertical direction to save the area occupied by the SRAM cell. For example, transistors of the same conductive type may be provided in a same layer (for example, at a substantially same height from the upper surface of the substrate), while transistors of different conductive types may be provided in two layers (for example, at different heights from the upper surface of the substrate), and the two layers may overlap at least partially in the vertical direction.

In the example shown in FIG. 2, FIG. 3(*a*), FIG. 3(*b*) and FIG. 3(*c*), the pull-up transistors PU-1 and PU-2 as p-type transistors are provided in a same layer, and the pull-down transistors PD-1, PD-2 and the pass gate transistors PG-1, PG-2 as n-type transistors are provided in a same layer. In this example, the p-type transistors are in a lower layer and the n-type transistors are in an upper layer, but the present disclosure is not limited thereto. For example, by flipping the structures shown in FIG. 2, FIG. 3(*a*), FIG. 3(*b*) and FIG. 3(*c*) up and down (with the substrate still at the bottom) and adjusting the interconnection structures accordingly, the p-type transistors may be in the upper layer and the n-type transistors may be in the lower layer.

As an electrical connection to the pull-down transistors PD-1, PD-2 and the pass gate transistors PG-1, PG-2 as n-type transistors is relatively complex, providing the n-type transistors in the upper layer is advantageous to, for example, a production of the electrical connection. The n-type transistors being provided in the upper layer is illustrated by way of example in all the accompanying drawings and the following description.

These transistors may be electrically connected to each other according to the 6T layout described above.

As shown in FIG. 2, FIG. 3(*a*), FIG. 3(*b*) and FIG. 3(*c*), a source/drain layer S/D4_U (for example, in which a drain region is formed) on an upper side of the first pull-up transistor PU-1 may be connected to a source/drain layer S/D3_L (for example, in which a drain region is formed) on a lower side of the first pull-down transistor PD-1, and a first node between the two corresponds to, for example, the node Q in FIG. 1. A source/drain layer S/D6_L on a lower side of the first pass gate transistor PG-1 may be connected to the first node, and a source/drain layer S/D6_U on an upper side of the first pass gate transistor PG-1 may be connected to a first bit line (for example, the bit line BL in FIG. 1) through a corresponding contact plug BL-1. Here, a connection between the source/drain layer of the first pull-up transistor PU-1, the source/drain layer of the first pull-down transistor PD-1 and the source/drain layer of the first pass gate transistor PG-1 is shown as a first interconnection structure IIC1.

Similarly, a source/drain layer S/D2_U (for example, in which a drain region is formed) on an upper side of the second pull-up transistor PU-2 may be connected to a source/drain layer S/D1_L (for example, in which a drain region is formed) on a lower side of the second pull-down transistor PD-2, and a second node between the two corresponds to, for example, the node /Q in FIG. 1. A source/drain layer S/D5_L on a lower side of the second pass gate transistor PG-2 may be connected to the second node, and a source/drain layer S/D5_U on an upper side of the second pass gate transistor PG-2 may be connected to a second bit line (for example, the bit line /BL in FIG. 1) through a corresponding contact plug BL-2. Here, a connection between the source/drain layer of the second pull-up transistor PU-2, the source/drain layer of the second pull-down transistor PD-2 and the source/drain layer of the second pass gate transistor PG-2 is shown as a second interconnection structure IIC2. As described below, the first interconnection structure IIC1 and the second interconnection structure IIC2 may not be separate additional conductive layers, but may also be achieved through a material layer where the source/drain layers of the transistors are located.

The first interconnection structure IIC1 may include a first segment SEG1 extending in the first direction (for example, x-direction) and a second segment SEG2 extending in the second direction (for example, y-direction). The first segment SEG1 and the second segment SEG2 may be continuous with each other (for example, integrated with each other). Here, the first interconnection structure IIC1 is shown as an L-shaped structure formed by the first segment SEG1 and the second segment SEG2. However, it should be noted that due to manufacturing processes or process margins, the first interconnection structure IIC1 may also include other portions. For example, a small segment that extends substantially parallel to the first segment SEG1 may be connected to an end of the second segment SEG2.

Similarly, the second interconnection structure IIC2 may include a third segment SEG3 extending in the first direction (for example, x-direction) and a fourth segment SEG4 extending in the second direction (for example, y-direction). The third segment SEG3 and the fourth segment SEG4 may be continuous with each other (for example, integrated with each other). Here, the second interconnection structure IIC2 is shown as an L-shaped structure formed by the third segment SEG3 and the fourth segment SEG4. However, it should be noted that due to manufacturing processes or process margins, the second interconnection structure IIC2 may also include other portions. For example, a small segment that extends substantially parallel to the third segment SEG3 may be connected to an end of the fourth segment SEG4. In a top view, the first interconnection structure IIC1 and the second interconnection structure IIC2 may form a substantially closed ring (for example, a rectangle).

The first interconnection structure IIC1 may include a first interconnection sub-structure IIC1-1 and a second interconnection sub-structure IIC1-2 stacked on the first interconnection sub-structure IIC1-1. The first interconnection sub-structure IIC1-1 and the second interconnection sub-structure IIC1-2 may be in contact with each other. Although an interface is shown between the first interconnection sub-structure IIC1-1 and the second interconnection sub-structure IIC1-2, the first interconnection sub-structure IIC1-1 and the second interconnection sub-structure IIC1-2 may be integrated with each other (for example, as described below, formed by a same material layer but with different doping). The first interconnection sub-structure IIC1-1 and the second interconnection sub-structure IIC1-2 may have substantially the same pattern, for example, they may substantially overlap completely with each other in the top view.

Similarly, the second interconnection structure IIC2 may include a third interconnection sub-structure IIC2-1 and a fourth interconnection sub-structure IIC2-2 stacked on the third interconnection sub-structure IIC2-1. The third interconnection sub-structure IIC2-1 and the fourth interconnection sub-structure IIC2-2 may be in contact with each other. Although an interface is shown between the third interconnection sub-structure IIC2-1 and the fourth interconnection sub-structure IIC2-2, the third interconnection sub-structure IIC2-1 and the fourth interconnection sub-structure IIC2-2 may be integrated with each other (for example, as described below, formed by a same material layer but with different doping). The third interconnection sub-structure IIC2-1 and the fourth interconnection sub-structure IIC2-2 may have substantially the same pattern, for example, they may substantially overlap completely with each other in the top view.

The first interconnection sub-structure IIC1-1 and the third interconnection sub-structure IIC2-1 may be substantially coplanar and may have substantially the same doping. The second interconnection sub-structure IIC1-2 and the fourth interconnection sub-structure IIC2-2 may be substantially coplanar and have substantially the same doping.

The first segment SEG1 may include a body portion extending in the first direction (for example, x-direction), and a first protruding portion PR1 and a second protruding portion PR2 that protrude from the body portion in a direction away from the third segment SEG3 (for example, y-direction). The first protruding portion PR1 (more specifically, a portion PR1-1 on the first interconnection sub-structure IIC1-1 of the first protruding portion PR1 and a portion PR1-2 on the second interconnection sub-structure IIC1-2 of the first protruding portion PR1) may form the source/drain layer S/D4_U on the upper side of the first pull-up transistor PU-1 and the source/drain layer S/D3_L on the lower side of the first pull-down transistor PD-1. The second protruding portion PR2 (more specifically, a portion PR2-2 on the second interconnection sub-structure IIC1-2 of the second protruding portion PR2) may form the source/drain layer S/D6_L on the lower side of the first pass gate transistor PG-1. It should be noted that the second protruding portion PR2 may include a portion PR2-1 on the first interconnection sub-structure IIC1-1 (referring to FIG. 3(*c*), and for clarity, the portion PR2-1 is not shown in FIG. 2, FIG. 3(*a*) or FIG. 3(*b*)).

Similarly, the third segment SEG3 may include a body portion extending in the first direction (for example, x-direction), and a third protruding portion PR3 and a fourth protruding portion PR4 that protrude from the body portion in a direction away from the first segment SEG1 (for example, y-direction). The third protruding portion PR3 (more specifically, a portion PR3-1 on the third interconnection sub-structure IIC2-1 of the third protruding portion PR3 and a portion PR3-2 on the fourth interconnection sub-structure IIC2-2 of the third protruding portion PR3) may form the source/drain layer S/D2_U on the upper side of the second pull-up transistor PU-2 and the source/drain layer S/D1_L on the lower side of the second pull-down transistor PD-2. The fourth protruding portion PR4 (more specifically, a portion PR4-2 on the fourth interconnection sub-structure IIC2-2 of the fourth protruding portion PR4) may form the source/drain layer S/D5_L on the lower side of the second pass gate transistor PG-2. It should be noted that the fourth protruding portion PR4 may include a portion PR4-1 on the third interconnection sub-structure IIC2-1 (referring to FIG. 3(*c*), and for clarity, the portion PR4-1 is not shown in FIG. 2, FIG. 3(*a*) or FIG. 3(*b*)).

The first protruding portion PR1 and the fourth protruding portion PR4 may be self-aligned in the second direction (for example, y-direction). Similarly, the second protruding portion PR2 and the third protruding portion PR3 may be self-aligned in the second direction (for example, y-direction).

The first pull-down transistor PD-1 may include an upper source/drain layer S/D3_U corresponding to the first protruding portion PR1 (or the lower source/drain layer S/D3_L), with a channel layer CH3 extending vertically between the two. The upper source/drain layer S/D3_U may be self-aligned with the lower source/drain layer S/D3_L in the vertical direction (for example, z-direction). The first pass gate transistor PG-1 may include an upper source/drain layer S/D6_U corresponding to the second protruding portion PR2 (or the lower source/drain layer S/D6_L), with a channel layer CH6 extending vertically between the two. The upper source/drain layer S/D6_U may be self-aligned with the lower source/drain layer S/D6_L in the vertical direction (for example, z-direction).

The second pull-down transistor PD-2 may include an upper source/drain layer S/D1_U corresponding to the third protruding portion PR3 (or the lower source/drain layer S/D1_L), with a channel layer CH1 extending vertically between the two. The upper source/drain layer S/D1_U may be self-aligned with the lower source/drain layer S/D1_L in the vertical direction (for example, z-direction). The second pass gate transistor PG-2 may include an upper source/drain layer S/D5_U corresponding to the fourth protruding portion PR4 (or the lower source/drain layer S/D5_L), with a channel layer CH5 extending vertically between the two. The upper source/drain layer S/D5_U may be self-aligned with the lower source/drain layer S/D5_L in the vertical direction (for example, z-direction).

The first pull-up transistor PU-1 may include a lower source/drain layer S/D4_L corresponding to the first protruding portion PR1 (or the upper source/drain layer S/D4_U), with a channel layer CH4 extending vertically between the two. The lower source/drain layer S/D4_L may be self-aligned with the upper source/drain layer S/D4_U in the vertical direction (for example, z-direction). Similarly, the second pull-up transistor PU-2 may include a lower source/drain layer S/D2_L corresponding to the third protruding portion PR3 (or the upper source/drain layer S/D2_U), with a channel layer CH2 extending vertically between the two. The lower source/drain layer S/D2_L may be self-aligned with the upper source/drain layer S/D2_U in the vertical direction (for example, z-direction).

Figure 47:
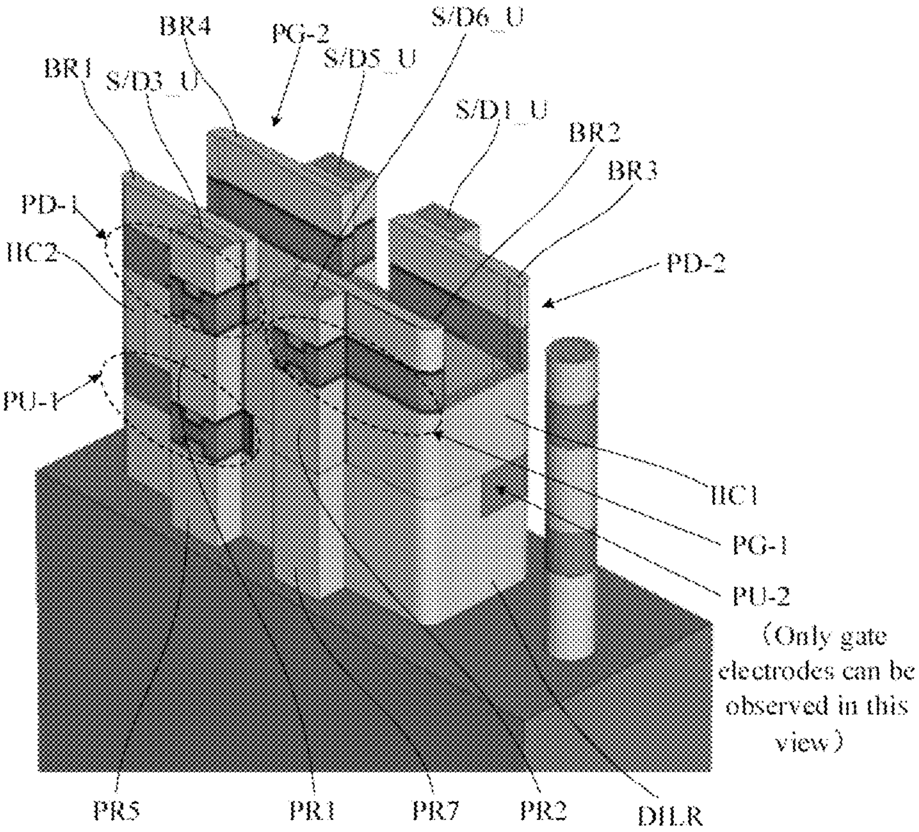
FIG. 47 schematically shows a perspective view of an SRAM according to embodiments of the present disclosure.

The lower source/drain layer S/D4_L of the first pull-up transistor PU-1 and the lower source/drain layer S/D2_L of the second pull-up transistor PU-2 may be embedded in a ring structure of dielectric (referring to FIG. 47, especially a DILR therein). The ring structure may have a first side corresponding to the first segment SEG1, a second side corresponding to the second segment SEG2, a third side corresponding to the third segment SEG3, and a fourth side corresponding to the fourth segment SEG4. For example, the ring structure may be substantially self-aligned with the first interconnection structure IIC1 and the second interconnection structure IIC2, and may substantially overlap with the first interconnection structure IIC1 and the second interconnection structure IIC2 in the vertical direction (for example, z-direction) in the top view. In the ring structure, in addition to the lower source/drain layer S/D4_L of the first pull-up transistor PU-1 and the lower source/drain layer S/D2_L of the second pull-up transistor PU-2, a first dummy source/drain layer DPR1 may be embedded into the first side, and a second dummy source/drain layer DPR2 may be embedded into the third side. The first dummy source/drain layer DPR1 and the second dummy source/drain layer DPR2 may be made of substantially the same material as the lower source/drain layer S/D4_L of the first pull-up transistor PU-1 and the lower source/drain layer S/D2_L of the second pull-up transistor PU-2. The ring structure will be further described in detail below.

Each of the channel layers CH1 to CH6 may be self-aligned between the corresponding lower source/drain layer and the corresponding upper source/drain layer. As described above, the lower source/drain layer and the upper source/drain layer of each transistor may appear as a protruding portion on the interconnection structure or a structure corresponding to a protruding portion (self-aligned with the protruding portion and overlapping with the protruding portion in the vertical direction in the top view). Therefore, the channel layer self-aligned between the lower source/drain layer and the upper source/drain layer may be offset relative to the interconnection structure. Specifically, the channel layer CH4 of the first pull-up transistor PU-1, the channel layer CH3 of the first pull-down transistor PD-1 and the channel layer CH6 of the first pass gate transistor PG-1 are offset relative to the first interconnection structure IIC1 (especially the first segment SEG1) on a side away from the second interconnection structure IIC2, especially may be offset from the body portion of the first segment SEG1 (for example, not overlap with the body portion of the first segment SEG1 in the top view). Similarly, the channel layer CH2 of the second pull-up transistor PU-2, the channel layer CH1 of the second pull-down transistor PD-2 and the channel layer CH5 of the second pass gate transistor PG-2 are offset relative to the second interconnection structure IIC2 (especially the third segment SEG3) on a side away from the first interconnection structure IIC1, especially may be offset from the body portion of the third segment SEG3 (for example, not overlap with the body portion of the third segment SEG3 in the top view).

Each of the channel layers CH1 to CH6 may have a C-shaped cross-section. More specifically, each of the channel layers CH1 to CH6 may include a first lateral extension portion extending on a top surface of the corresponding lower source/drain layer, a second lateral extension portion extending on a bottom surface of the corresponding upper source/drain layer, and a vertical portion extending vertically and connecting the first lateral extension portion and the second lateral extension portion. The lower source/drain layer and the upper source/drain layer define a space around the channel layer, especially around the vertical portion of the channel layer, so that the gate stack embedded in the space may surround a peripheral of the channel layer, especially a peripheral of the vertical portion of the channel layer.

It should be noted that due to manufacturing processes, materials and other factors, the C-shaped cross-sections of the channel layers CH1 to CH6 in a resultant device may be inconspicuous or unobservable, and substantially in a vertical extension form.

A gate electrode of the first pull-up transistor PU-1 and a gate electrode of the first pull-down transistor PD-1 may be electrically connected to (for example, in direct contact with) the second interconnection structure IIC2, and thus may be electrically connected to each other (defining the second node, such as the node /Q shown in FIG. 1). Similarly, a gate electrode of the second pull-up transistor PU-2 and a gate electrode of the second pull-down transistor PD-2 may be electrically connected to (for example, in direct contact with) the first interconnection structure IIC1, and thus may be electrically connected to each other (defining the first node, such as the node Q shown in FIG. 1).

The lower source/drain layers (for example, in which the source regions are formed) of the first pull-up transistor PU-1 and the second pull-up transistor PU-2 may be provided on the substrate and may receive the power voltage VDD through contact plugs to the substrate. The upper source/drain layers (for example, in which the source regions are formed) of the first pull-down transistor PD-1 and the second pull-down transistor PD-2 may receive ground voltage GND through corresponding contact plugs. The gate electrodes of the first pass gate transistor PG-1 and the second pass gate transistor PG-2 may be electrically connected to the word line (for example, the word line WL shown in FIG. 1) through respective contact plugs WL-1 and WL-2.

As shown in FIG. 3(*a*) and FIG. 3(*b*), based on the first node and the second node, the six constituent transistors may be divided into two groups. One group includes the first pull-up transistor PU-1, the first pull-down transistor PD-1 and the first pass gate transistor PG-1 that are connected to the first node (referring to FIG. 3(*a*)), and the other group includes the second pull-up transistor PU-2, the second pull-down transistor PD-2 and the second pass gate transistor PG-2 that are connected to the second node (referring to FIG. 3(*b*)). These two groups may be the same or symmetrical in terms of layout (the layout shown in FIG. 3(*b*) may be obtained by a 180 degree rotation of the layout shown in FIG. 3(*a*)). However, the present disclosure is not limited thereto. The two groups may be different or asymmetric in terms of layout.

FIG. 4 to FIG. 46(*c*) schematically show some stages in a process of manufacturing an SRAM cell according to embodiments of the present disclosure.

Materials of various layers are listed in the following description. However, these are just examples. The material of each layer is mainly determined according to a function of that layer (for example, a semiconductor material is used to provide an active region, a dielectric material is used to provide gap filling and an electrical isolation, etc.) and a required etching selectivity. In the description, it may not be explicitly stated which layer of material a particular layer of material has an etching selectivity with respect to, or the “required etching selectivity” is just simply mentioned. The “required etching selectivity” may be determined at least partially according to a related etching process.

Figure 4:
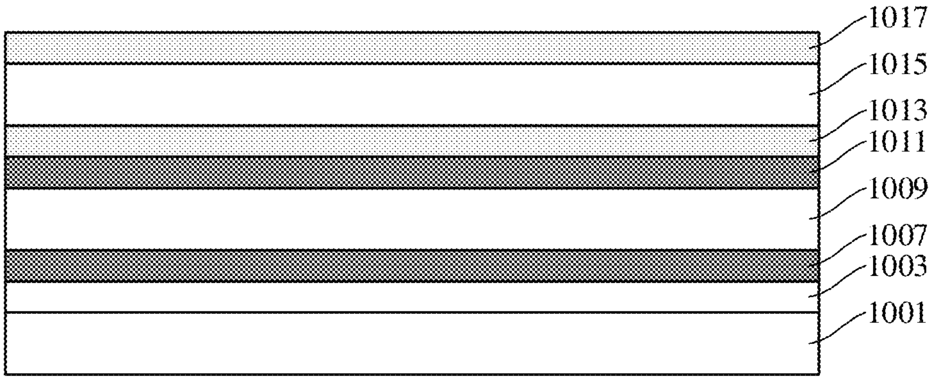
FIG. 4 to FIG. 46(*c*) schematically show some stages in a process of manufacturing an SRAM cell according to embodiments of the present disclosure.

As shown in FIG. 4, a substrate 1001 is provided. The substrate 1001 may be in various forms. The substrate 1001 may contain a semiconductor material, which may be, for example but not limited to a bulk semiconductor material such as bulk Si, a semiconductor on insulator (SOI), a compound semiconductor material such as SiGe, etc. In the following description, for sake of explanation, a bulk Si substrate is taken as an example. In the substrate 1001, a well region (not shown) may be formed as desired, for example, by implanting impurities. In the example where the p-type transistors are provided in the lower layer, the implanted impurities may be n-type impurities.

A contact layer 1003 may be formed on the substrate 1001 for a connection of the source/drain layers of the transistors in the lower layer (for example, p-type pull-up transistors) in the SRAM cell, where the source/drain layers are on a side of the transistors in the lower layer facing the substrate. The contact layer 1003 may be formed by implanting impurities into an upper portion of the substrate 1001. In the example where the p-type transistors are provided in the lower layer, the implanted impurities may be p-type impurities such as B or In, and a concentration may be in a range of, for example, about 1E18 to 1E21 $cm^{-3}$, such as 1.5E20 $cm^{-3}$. Alternatively, the contact layer 1003 may be additionally formed on the substrate 1001 through an epitaxial growth.

An active material layer may be provided on the contact layer 1003. For example, a first source/drain layer 1007, a channel defining layer 1009 and a second source/drain layer 1011 for the p-type transistors and a first source/drain layer 1013, a channel defining layer 1015 and a second source/drain layer 1017 for the n-type transistors may be sequentially formed through an epitaxial growth. With an in-situ doping during growth or an impurity implantation after growth, these layers may have required conductivities.

Adjacent layers among the semiconductor material layers formed on the substrate 1001 may have etching selectivity with respect to each other, except for the second source/drain layer 1011 for the p-type transistors and the first source/drain layer 1013 for the n-type transistors. The second source/drain layer 1011 for the p-type transistors and the first source/drain layer 1013 for the n-type transistors may have no etching selectivity or a low etching selectivity with respect to each other, because they are almost treated as a same layer in subsequent processing except for being doped into different conductive types to serve as the source/drain layer for the p-type transistors and the source/drain layer for the n-type transistors respectively. In addition, for the p-type transistors, the first source/drain layer 1007 and the second source/drain layer 1011 may contain a same material. Similarly, for the n-type transistors, the first source/drain layer 1013 and the second source/drain layer 1017 may contain a same material.

In an example, these semiconductor material layers may include alternating stacked layers of Si and SiGe. For example, in a case that the substrate 1001 contains Si, the contact layer 1003 may contain SiGe. For the p-type transistors, the first source/drain layer 1007 may contain Si with a thickness in a range of about 20 to 50 nm; the channel defining layer 1009 may contain SiGe with a thickness in a range of about 10 to 100 nm; the second source/drain layer 1011 may contain Si with a thickness in a range of about 10 to 30 nm. The first source/drain layer 1007 and the second source/drain layer 1011 may be p-doped (for example, doped with B), with a doping concentration in a range of about 1E19 to 1E21 $cm^{-3}$ (for example, 1.5E20 $cm^{-3}$). Similarly, for the n-type transistors, the first source/drain layer 1013 may contain Si with a thickness in a range of about 10 to 30 nm; the channel defining layer 1015 may contain SiGe with a thickness in a range of about 10 to 100 nm; the second source/drain layer 1017 may contain Si with a thickness in a range of about 20 to 50 nm. The first source/drain layer 1013 and the second source/drain layer 1017 may be n-doped (for example, doped with As), with a doping concentration in a range of about 1E19 to 1E21 $cm^{-3}$ (for example, 2.5E20 $cm^{-3}$).

Although the second source/drain layer 1011 for the p-type transistors and the first source/drain layer 1013 for the n-type transistors are shown as two layers here to better reflect structures of the p-type transistors and the n-type transistors, they may be a same material layer. For example, different types of in-situ doping may be performed at different stages of growth to achieve different types of doping for upper and lower halves of the material layer. Therefore, there may be no actual physical interface between the second source/drain layer 1011 for the p-type transistors and the first source/drain layer 1013 for the n-type transistors.

A hard mask may be provided on the active material layer to subsequently define the active region and an interconnection pattern. The hard mask is used for a purpose of providing an appropriate pattern definition, an etching stop, etc. in subsequent processes. A number of layers of the hard mask and a material of each layer may vary according to the process. In this example, a layer configuration of the hard mask may allow (at least one layer in) the hard mask to be retained at least before completion of the production of transistors. In the setting of the hard mask, a spacer is used to achieve a more precise control of a pattern size.

Figure 5A:
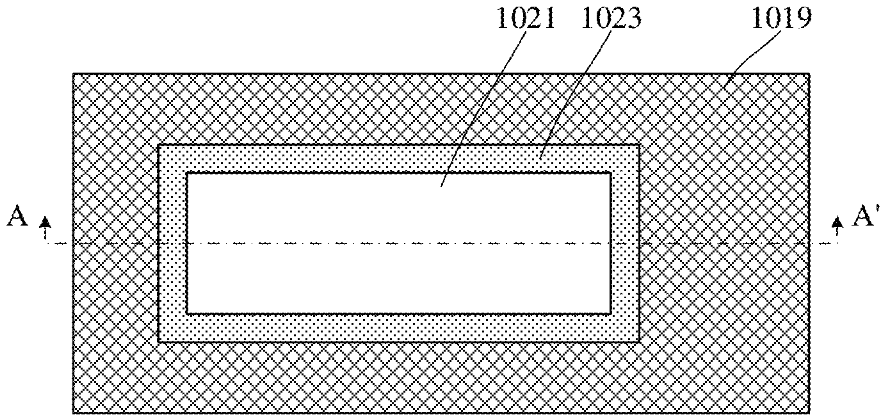
Figure 5B:
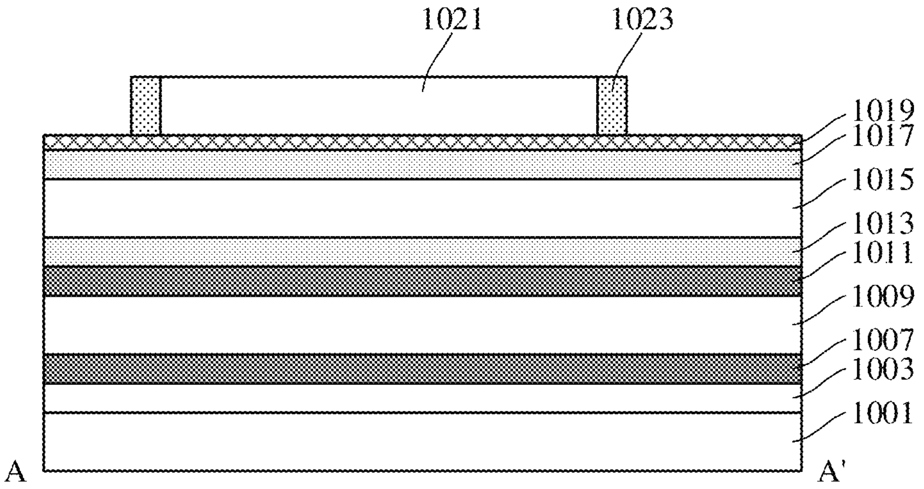

For example, as shown in FIG. 5(*a*) and FIG. 5(*b*) (which are respectively a top view and a cross-sectional view taken along line AA'), an aluminum oxide ($Al_2O_3$) layer 1019 with a thickness in a range of about 2 to 10 nm may be formed by deposition. Here, a main reason for selecting aluminum oxide is to consider an etching selectivity with respect to dielectric materials used in subsequent processes, such as an oxide (for example, silicon oxide), a nitride (for example, silicon nitride), a nitrogen oxide (for example, silicon oxynitride), etc. The aluminum oxide layer 1019 may be retained in most stages of subsequent processes as (a part of) the hard mask, particularly to define the body portions of the interconnection structures.

As described above, the interconnection structures may form a substantially closed pattern, such as a rectangle, in the top view. According to embodiments, such pattern may be defined by a spacer. To form the spacer, a mandrel 1021 such as polycrystalline silicon may be formed on the aluminum oxide layer 1019. The mandrel 1021 may be patterned into, for example, a rectangle by photolithography. A spacer 1023 such as a nitride may be formed on a sidewall of the rectangular mandrel 1021 by a spacer formation process. The spacer formation process may include depositing a thin nitride layer in a substantially conformal manner on the aforementioned structure, and performing an anisotropic etching on the deposited thin nitride layer, for example, by reactive ion etching (RIE) in vertical direction so as to remove a lateral extension portion and leave a vertical extension portion of the thin nitride layer. Accordingly, the spacer 1023 is formed as a closed pattern around a peripheral of the mandrel 1021. In this example, the spacer 1023 has a shape of a rectangular ring, and thus includes two sides extending in the first direction (for example, a horizontal direction on a paper surface of FIG. 5(*a*)) and two sides extending in the second direction (for example, a vertical direction on the paper surface of FIG. 5(*a*)) intersecting with (for example, perpendicular to) the first direction. These sides may have substantially uniform thickness. The closed pattern may then define the body portions of the interconnection structures. The pattern of the spacer 1023 changes with the pattern of the mandrel 1021. It is possible to differently change the pattern of the mandrel 1021 and therefore change the pattern of the spacer 1023 according to a device layout design.

In addition, protruding patterns may be defined on the sides (for example, the two sides extending in the first direction) of the rectangular ring pattern to act as (a part of) the hard mask in subsequent processes to define the protruding portions of the interconnection structures.

Figure 6A:
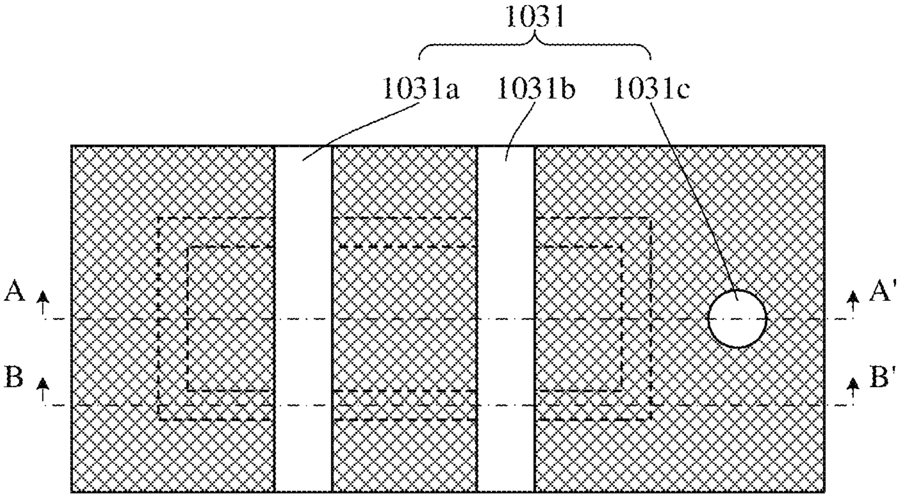
Figure 6B:
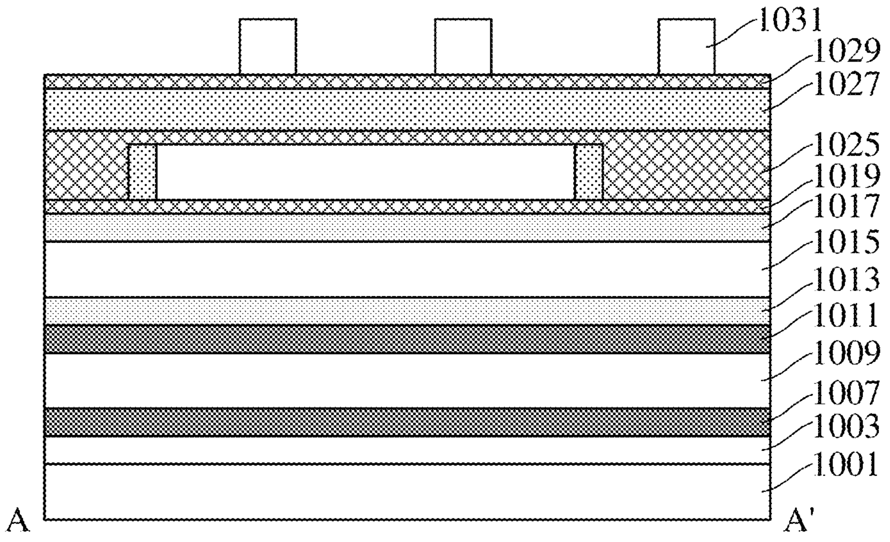

For example, as shown in FIG. 6(*a*) and FIG. 6(*b*) (which are respectively a top view and a cross-sectional view taken along line AA'), an aluminum oxide layer 1025, a nitride layer 1027 with a thickness in a range of about 10 to 100 nm, and an aluminum oxide layer 1029 with a thickness in a range of about 2 to 10 nm may be sequentially formed by deposition on the aluminum oxide layer 1019 on which the mandrel 1021 and the spacer 1023 have been formed. The thickness of the aluminum oxide layer 1025 may exceed the thickness of the mandrel 1021, so that the aluminum oxide layer 1025 may cover a top surface of the mandrel 1021 (and the spacer 1023 on the sidewall of the mandrel 1021). The aluminum oxide layer 1025 may be planarized by, for example, chemical mechanical polishing (CMP), and thus may have a substantially flat top surface.

A photoresist 1031 may be formed on the hard mask. The photoresist 1031 may be patterned into two strip portions 1031*a* and 1031*b* extending in the second direction (and intersecting with the two sides of the spacer 1023 extending in the first direction) by exposure and development. In addition, the photoresist 1031 may also include, for example, a circular portion 1031*c* outside the spacer 1023 to define a contact plug used to apply the power voltage $V_{DD}$. A line width (for example, a width) of the strip portions 1031*a* and 1031*b* in the photoresist 1031 and a line width (for example, a diameter) of the circular portion 1031*c* may be greater than a line width of the spacer 1023.

Figure 7:
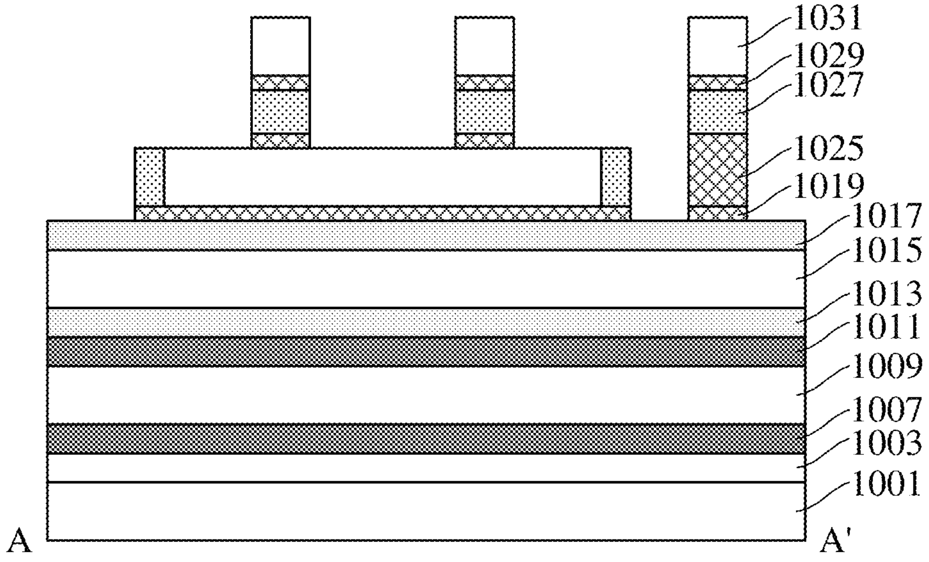

As shown in FIG. 7 (which is a cross-sectional view taken along line AA'), with the photoresist 1031 patterned in this way as an etching mask, an anisotropic etching, such as an RIE in vertical direction, may be performed sequentially on the aluminum oxide layer 1029, the nitride layer 1027 and the aluminum oxide layers 1025 and 1019. When etching the nitride layer 1027, the spacer 1023 (and also the nitride in this embodiment) is covered by the aluminum oxide layer 1025 and may not be affected. Therefore, the mandrel 1021 and the spacer 1023 on the sidewall of the mandrel 1021 may be retained (the aluminum oxide layer 1019 below may be retained), and at positions of the strip portions 1031*a* and 1031*b* of the photoresist, the strip structure extends across the mandrel 1021 and the spacer 1023 on the sidewall of the mandrel 1021. In addition, a vertical column structure is formed at a position of the circular portion 1031*c* of the photoresist. After that, the photoresist 1031 may be removed.

Figure 8:
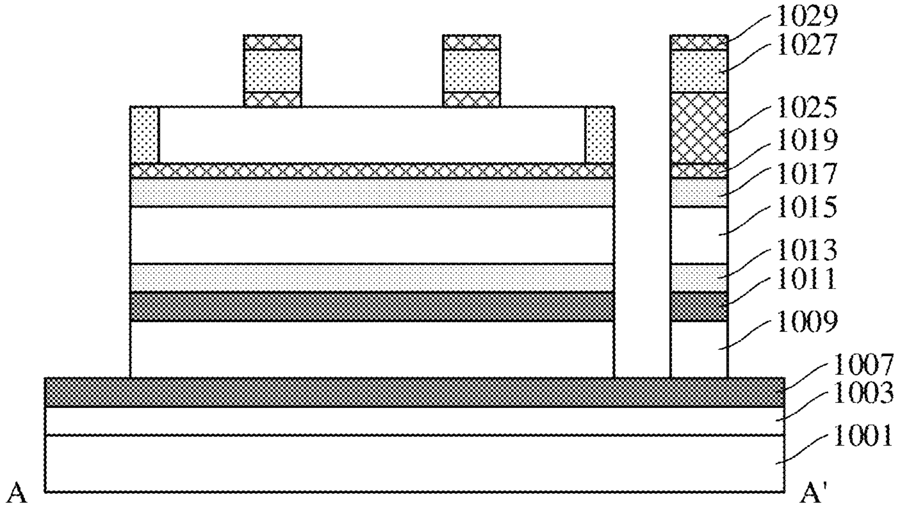

The active layer may be patterned using the hard mask patterned as described above. For example, as shown in FIG. 8 (which is a cross-sectional view taken along line AA'), the second source/drain layer 1017, the channel defining layer 1015 and the first source/drain layer 1013 for the n-type transistors and the second source/drain layer 1011 and the channel defining layer 1009 for the p-type transistors may be etched sequentially by, for example, RIE. The RIE may proceed in a direction substantially perpendicular to the surface of the substrate and may stop at the first source/drain layer 1007 for the p-type transistors. In this example, the patterning of the active material layer for the p-type transistors does not proceed to the first source/drain layer 1007. This is mainly because that if the first source/drain layer 1007 is also etched here in the same way, the contact layer 1003 below may be exposed, and in a subsequent process of refining the channel defining layer (which is SiGe in this example), the exposed contact layer 1003 (which is SiGe in this example) may be unexpectedly etched.

Figure 9:
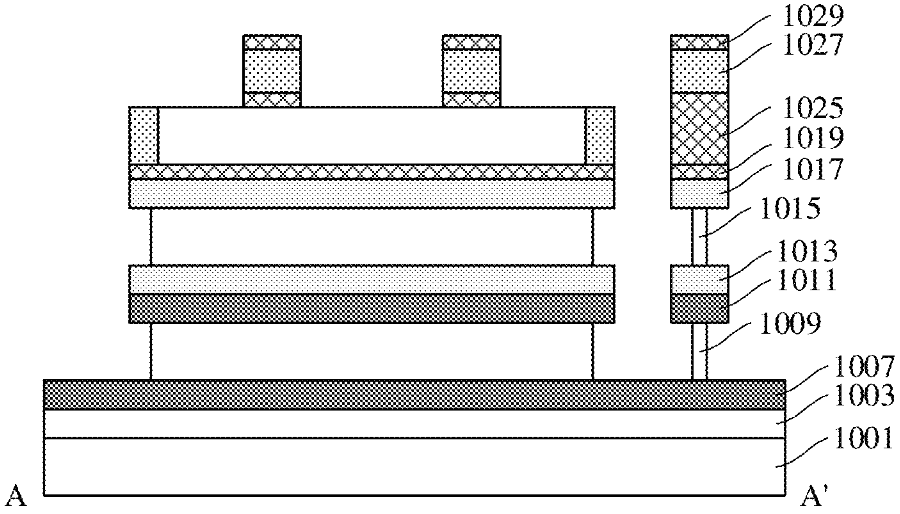

As described above, the channel defining layer may be refined. For example, as shown in FIG. 9 (which is a cross-sectional view taken along line AA'), a further selective etching may be performed on the channel defining layers 1009 and 1015. The selective etching may be achieved using an atomic layer etching (ALE) to precisely control an etching depth. Here, the etching depth may be controlled such that a space left between the source/drain layers after a channel layer is subsequently grown on the surface of the channel defining layer is sufficient to form a gate stack surrounding the periphery of the channel layer.

In addition, the etching depth may be controlled to be, for example, less than the line width of the spacer 1023, so that the refined channel defining layers 1009 and 1015 may not be recessed into an inner side of the spacer 1023, so as to prevent other material layers formed in subsequent processes from entering the inner side of the spacer 1023 through the recesses of the channel defining layers 1009 and 1015 to complicate the subsequent etching of the active material layer on the inner side of the spacer 1023. In addition, the etching depth may also be controlled to be less than half of the line width of the strip structure (referring to the strip portions 1031*a* and 1031*b* in the top view of FIG. 6(*a*)), so that the channel defining layers 1009 and 1015 may not be cut off when being etched from both sides of the strip structure, that is, the channel defining layers 1009 and 1015 may still have strip portions corresponding to the strip structure on an outer side of the spacer 1023. This is to ensure that the channel layers subsequently grown on the surfaces of the channel defining layers 1009 and 1015 may be located on the outer side of the spacer 1023.

Figure 10A:
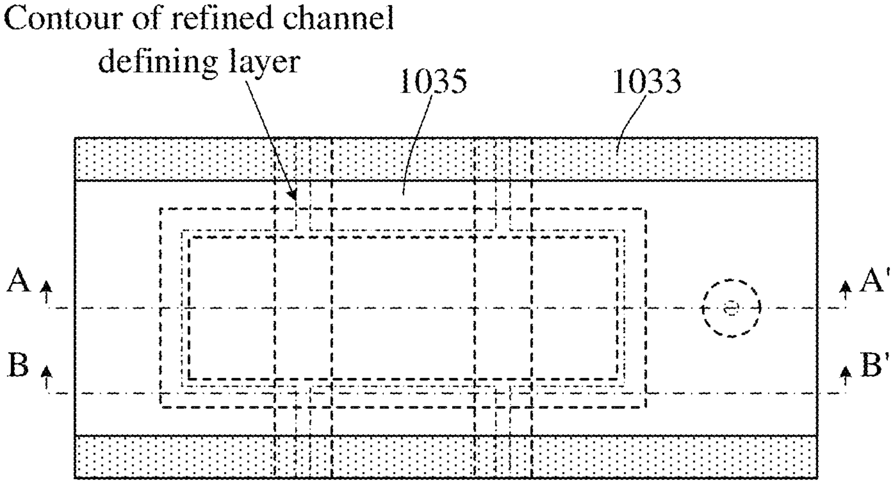
Figure 10B:
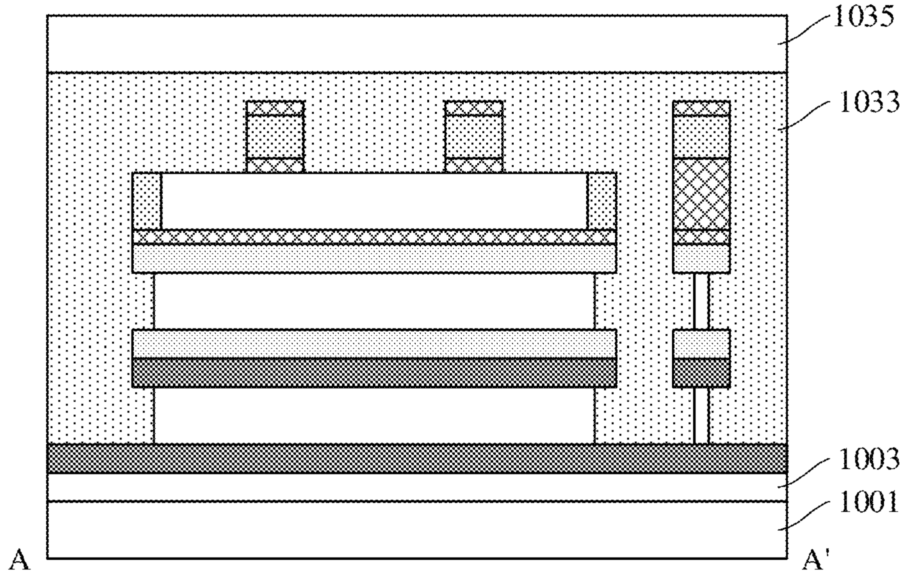

Such a refinement may control a width of the channel defining layer under the strip structure on the outer side of the spacer 1023 (referring to the top view in FIG. 10(*a*)). The width of the channel defining layer may determine a size of the channel layer to be subsequently grown on the surface of the channel defining layer (and thus may at least partially determine a channel width defined by the channel layer). The width of the channel may be flexibly controlled by controlling a parameter of the refining process. Furthermore, as described above, a length of the channel may be flexibly controlled by a thickness of the channel defining layer. Therefore, a driving capability of the transistor may be flexibly adjusted according to the device design.

Currently, the strip structure of the hard mask and the corresponding portion in the active layer below extend continuously in the second direction (referring to the top view in FIG. 10(*a*)). These portions may be separated in the second direction to achieve inter-device isolation.

For example, as shown in FIG. 10(*a*) and FIG. 10(*b*) (which are respectively a top view and a cross-sectional view taken along line AA'), a filling layer 1033 such as an oxide may be formed on the obtained structure to fill various gaps in the structure. A planarization such as CMP may be performed on the filling layer 1033, so that the filling layer 1033 has a substantially flat top surface. A mask layer 1035 such as polycrystalline silicon may be formed on the filling layer 1033. The mask layer 1035 may be patterned to cover a region where the mandrel 1021 and the spacer 1023 are located. In the second direction, a range of the mask layer 1035 may extend beyond the region where the mandrel 1021 and the spacer 1023 are located, thereby covering a portion of the strip structure on the outer side of the spacer 1023 (which may then define the protruding portion). In addition, the mask layer 1035 may cover a region where the column structure is located.

Figure 11A:
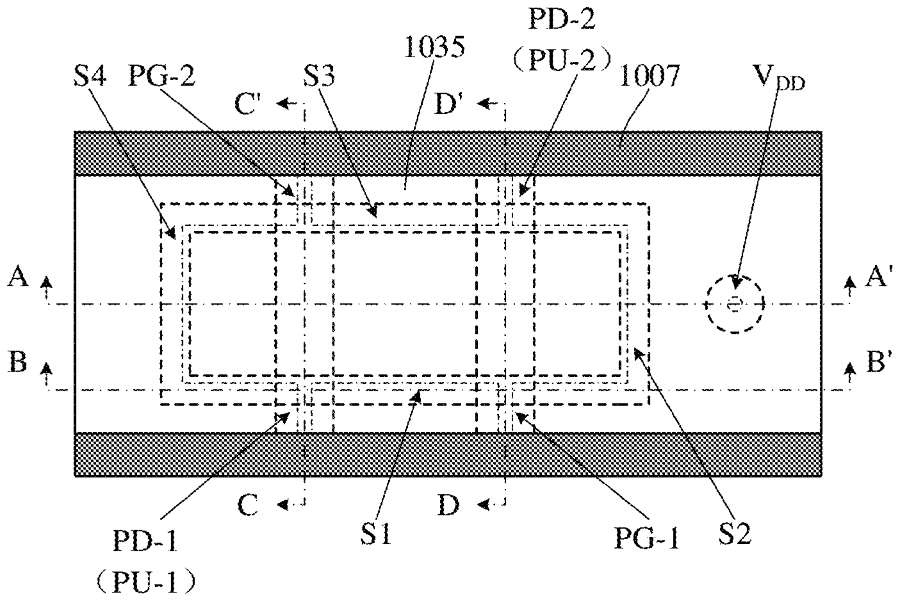
Figure 11B:
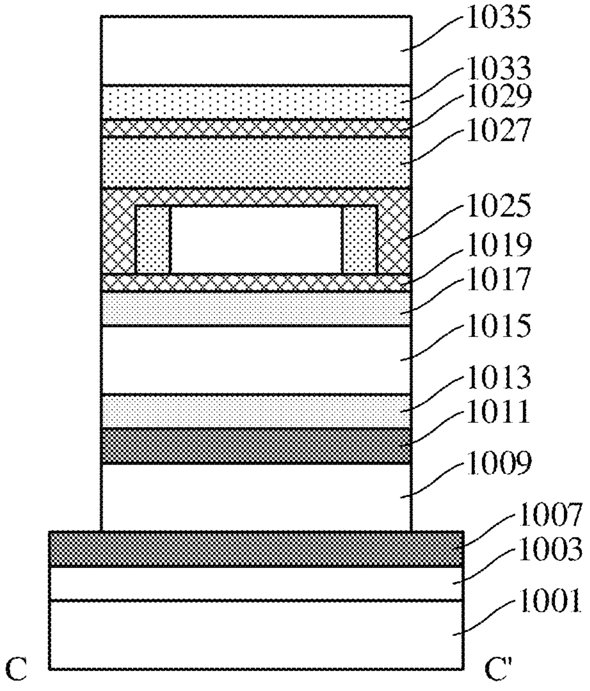

As shown in FIG. 11(*a*) and FIG. 11(*b*) (which are respectively a top view and a cross-sectional view taken along line CC'), with the mask layer 1035 as an etching mask, the filling layer 1033, the hard mask and the active layer below may be etched sequentially, for example, by RIE in vertical direction. Similarly, the etching may stop at the first source/drain layer 1007 for the p-type transistors. Accordingly, the active layers (except for the first source/drain layer 1007) may be separated from each other in the second direction.

As shown in FIG. 11(*a*), the obtained structure includes the following patterns: a closed pattern such as a rectangular ring defined by the spacer 1023, which may subsequently mainly define positions of the body portion of the interconnection structure and the gate stack; a pattern protruding with respect to the spacer 1023, defined by the portion of the strip structure on the outer side of the spacer 1023, which may subsequently mainly define a position of the active region (including the channel layer and the source/drain layers) of the constitute transistor of the SRAM cell.

More specifically, the closed pattern may include a first side S1, a second side S2, a third side S3, and a fourth side S4. The body portion of the first interconnection structure IIC1 may be mainly defined by the first side S1 and the second side S2, and the body portion of the second interconnection structure IIC2 may be mainly defined by the third side S3 and the fourth side S4. On the first side S1, there is a protruding pattern defined by the strip structure. The protruding pattern on the first side S1 may define a position of the active region of the first pull-down transistor PD-1 and a position of the active region of the first pass gate transistor PG-1 in the upper active layer (for the n-type transistors), and may also define a position of the active region of the first pull-up transistor PU-1 (which may be aligned or overlapped with the first pull-down transistor PD-1 in the vertical direction) in the lower active layer (for the p-type transistors). Similarly, on the third side S3, there is a protruding pattern defined by the strip structure. The protruding pattern on the third side S3 may define a position of the active region of the second pull-down transistor PD-2 and a position of the active region of the second pass gate transistor PG-2 in the upper active layer (for the n-type transistors), and may also define a position of the active region of the second pull-up transistor PU-2 (which may be aligned or overlapped with the second pull-down transistor PD-2 in the vertical direction) in the lower active layer (for the p-type transistors).

In addition, there may also be a circular pattern used to define the contact plug for applying the power voltage $V_{DD}$. However, the present disclosure is not limited thereto. The contact plug may be formed separately. In this case, the circular pattern may be omitted.

As shown in FIG. 11(*b*), on opposite sides in the second direction, the sidewalls of the upper and lower channel defining layers 1009 and 1015 are exposed to the outside. As described above, the pattern of the hard mask (the protruding pattern on the first side S1 and the protruding pattern on the third side S3) may define the positions of four active regions. However, in the active regions of the lower layer, only two transistors (the first pull-up transistor PU-1 and the second pull-up transistor PU-2) may be formed. Therefore, two active region positions (a position under the first pass gate transistor PG-1 and a position under the second pass gate transistor PG-2) among the four active region positions in the lower layer may be shielded using a shielding layer, so as to avoid an unnecessary device formation.

Figure 12:
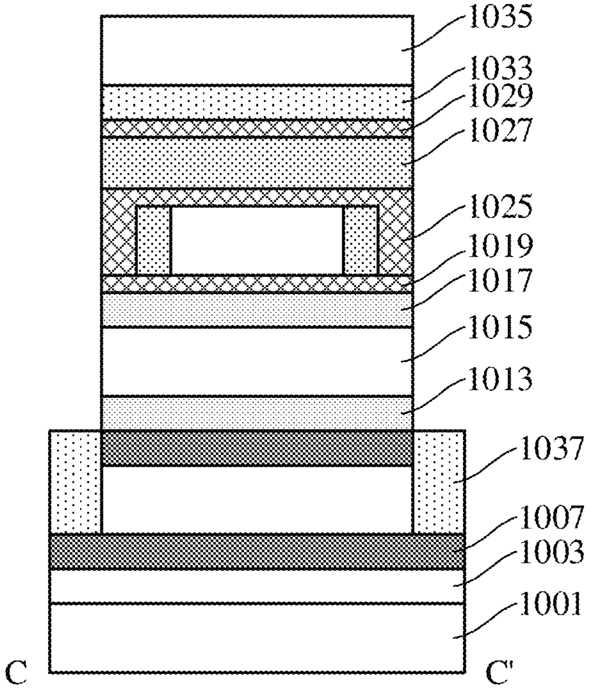

For example, as shown in FIG. 12 (which is a cross-sectional view taken along line CC'), a shielding layer 1037 may be formed on the obtained structure to shield the sidewall of the lower active layer, especially the sidewall of the channel defining layer 1009. For example, the shielding layer 1037 may be formed by depositing an oxide, performing a planarization such as CMP on the deposited oxide (which may stop at the mask layer 1035), and then etching back the planarized oxide. A top surface of the shielding layer 1037 may be higher than the top surface of the channel defining layer 1009 so as to fully shield the channel defining layer 1009. For example, the top surface of the shielding layer 1037 may be located near an interface between the second source/drain layer 1011 for the p-type transistors and the first source/drain layer 1013 for the n-type transistors.

Figure 13A:
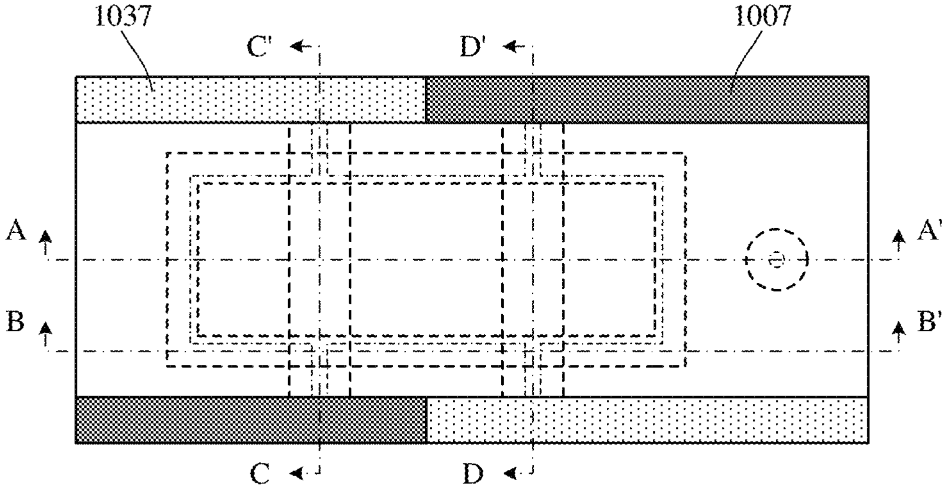
Figure 13B:
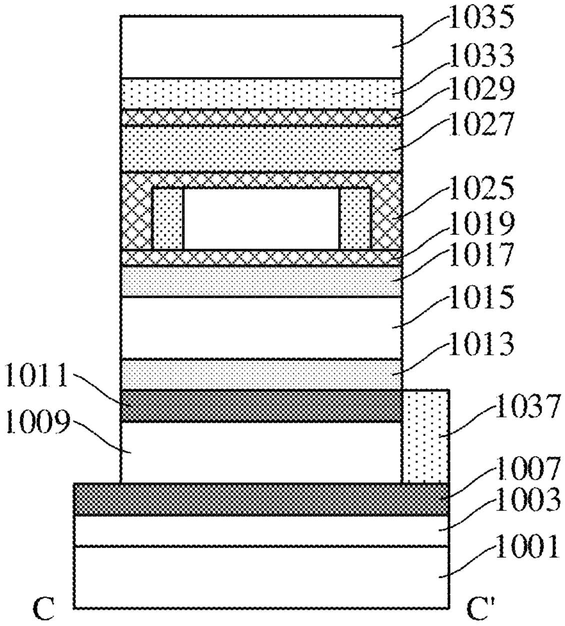
Figure 13C:
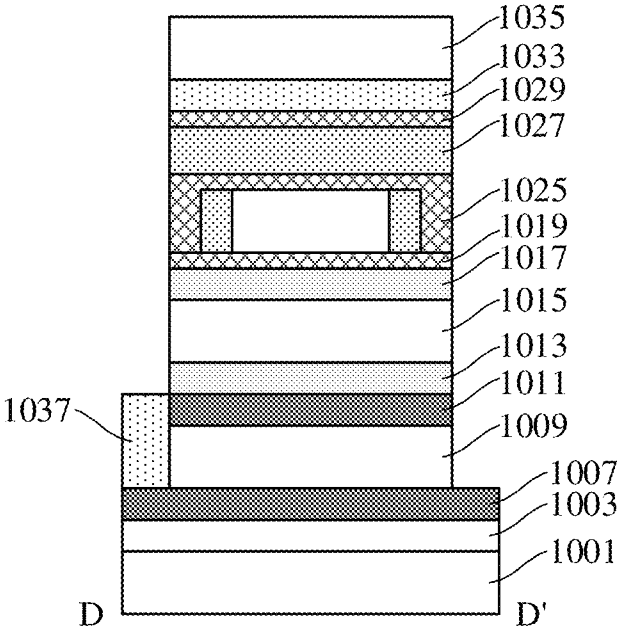

Then, as shown in FIG. 13(*a*), FIG. 13(*b*) and FIG. 13(*c*) (which are respectively a top view, a cross-sectional view taken along line CC' and a cross-sectional view taken along line DD'), the shielding layer 1037 may be further patterned in combination with, for example, a photoresist (not shown), so as to shield a region where no devices need to be formed and expose a region where a device needs to be formed. More specifically, as shown in the top view of FIG. 13(*a*), on the first side S1, the shielding layer 1037 in a region where one protruding pattern (the protruding pattern on a left side in the figure) is located may be removed to expose the sidewall of the lower active layer, especially the sidewall of the channel defining layer 1009, to facilitate a subsequent growth of a channel layer (based on which the first pull-up transistor PU-1 is formed) thereon, while the shielding layer 1037 in a region where the other protruding pattern (the protruding pattern on a right side in the figure) is located may be retained to shield the sidewall of the lower active layer, especially the sidewall of the channel defining layer 1009, so that no channel layer may be grown thereon (and therefore no device may be formed); on the third side S3, the shielding layer 1037 in a region where one protruding pattern (the protruding pattern on the right side in the figure) is located may be removed to expose the sidewall of the lower active layer, especially the sidewall of the channel defining layer 1009, so as to facilitate a subsequent growth of a channel layer (based on which the second pull-up transistor PU-2 is formed), while the shielding layer 1037 in a region where the other protruding pattern (the protruding pattern on the left side in the figure) is located may be retained to shield the sidewall of the lower active layer, especially the sidewall of the channel defining layer 1009, so that no channel layer may be grown thereon (and therefore no device may be formed).

Figure 14A:
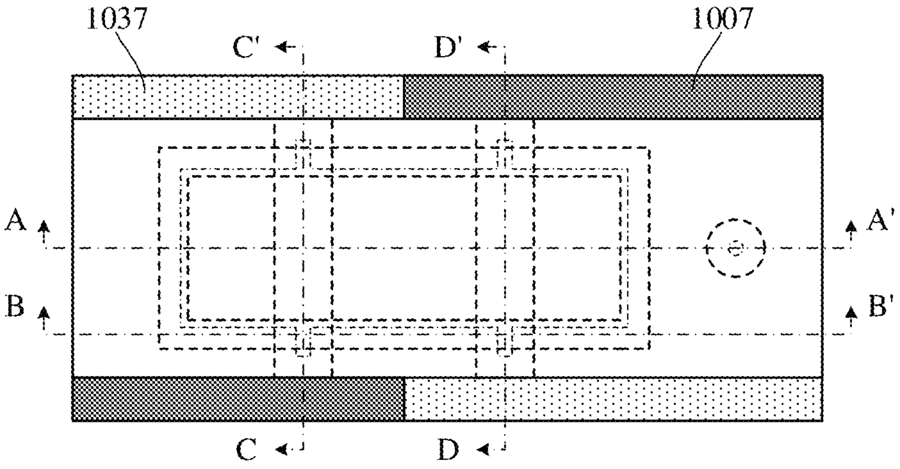
Figure 14B:
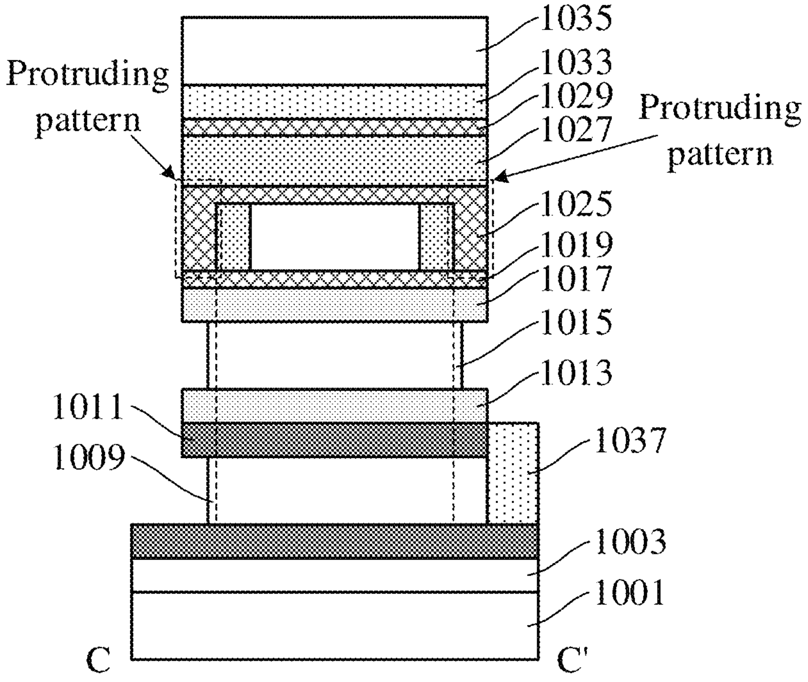
Figure 14C:
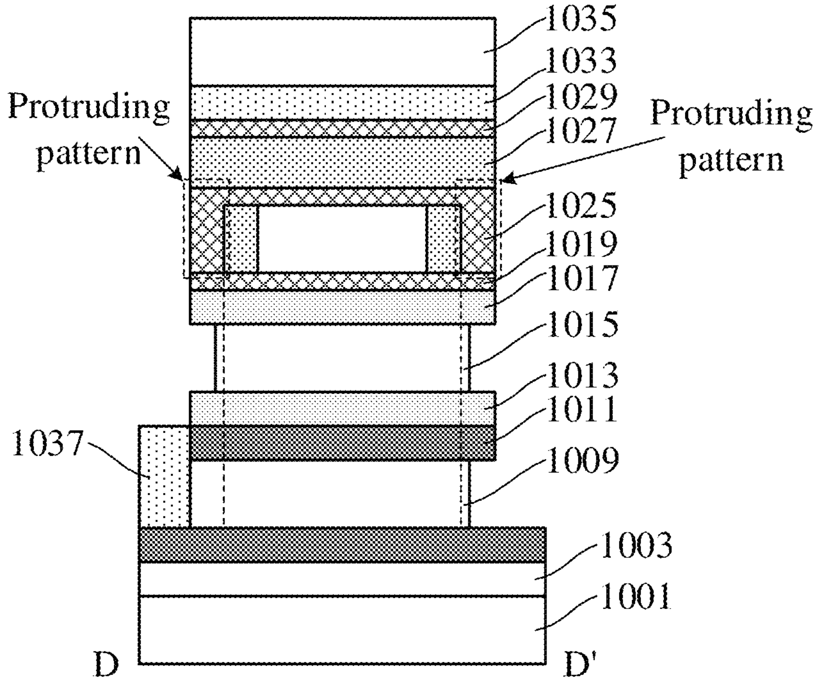

Similarly, the channel defining layer may be refined. For example, as shown in FIG. 14(*a*), FIG. 14(*b*) and FIG. 14(*c*) (which are respectively a top view, a cross-sectional view taken along line CC' and a cross-sectional view taken along line DD'), a further selective etching may be performed on the channel defining layers 1009 and 1015, for example, by ALE. Here, end portions in the second direction of the strip portions of the channel defining layers 1009 and 1015 on the outer side of the spacer 1023 are mainly etched and recessed, and the remaining surfaces may be shielded by the shielding layer 1037 (this is due to a formation process of the shielding layer 1037, such as deposition and then etching back as described above, so that the shielding layer 1037 may be filled into the recess of the channel defining layer formed by the refinement previously described with reference to FIG. 9 and may shield the corresponding surfaces of the channel defining layer). Similarly, an etching depth may be controlled so that a space left between the source/drain layers after the channel layer is subsequently grown on the surface of the channel defining layer is sufficient to form a gate stack surrounding the periphery of the channel layer.

In addition, the etching depth may be controlled so that the strip portions of the refined channel defining layers 1009 and 1015 still protrude from the spacer 1023, for example, overlapping with the protruding pattern in the vertical direction. In FIG. 14(*b*) and FIG. 14(*c*), the positions of the protruding patterns are illustrated with dashed boxes, and outer walls of the spacer 1023 are illustrated with vertical dashed lines. The end portions in the second direction of the strip portions of the channel defining layers 1009 and 1015 are located on an outer side of the outer walls of the spacer 1023 indicated by the vertical dashed lines, and overlap with the protruding patterns indicated by the dashed boxes in the vertical direction. This may ensure that the channel layers subsequently grown on the sidewalls of the channel defining layers 1009 and 1015 may be located on the outer side of the spacer 1023.

As shown in the top view in FIG. 14(*a*), due to the refinement of the channel defining layers, the channel defining layers 1009 and 1015 already have such patterns: the upper channel defining layer 1015 has four strip portions respectively overlapping with the four protruding patterns in the vertical direction, and the sidewalls of the four strip portions are recessed laterally relative to the corresponding protruding patterns; the lower channel defining layer 1009 has two strip portions overlapping with two of the four protruding patterns in the vertical direction, and the sidewalls of the two strip portions are recessed laterally relative to the corresponding protruding patterns (the lower channel defining layer 1009 also has portions overlapping with the other two protruding patterns in the vertical direction, but the sidewalls of these portions, especially the sidewalls shielded by the shielding layer 1037, are not recessed laterally). It should be noted that a contour of the upper channel defining layer 1015 with four strip portions is shown in the top view of FIG. 14(*a*).

Figure 15A:
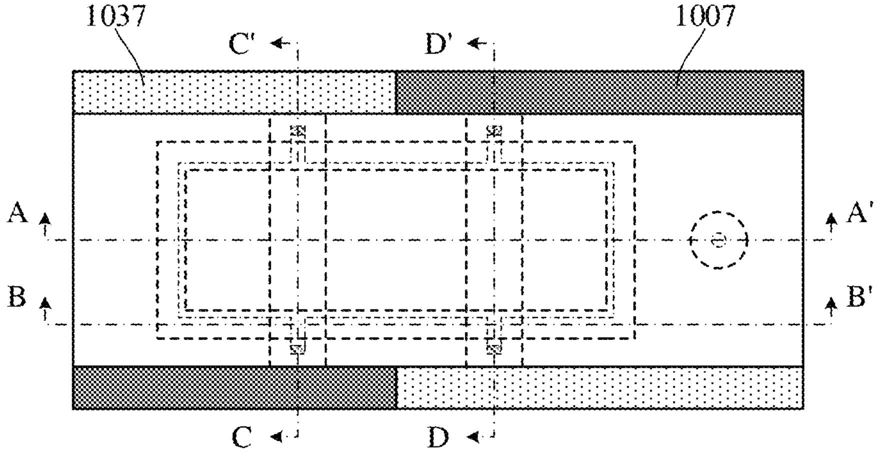
Figure 15B:
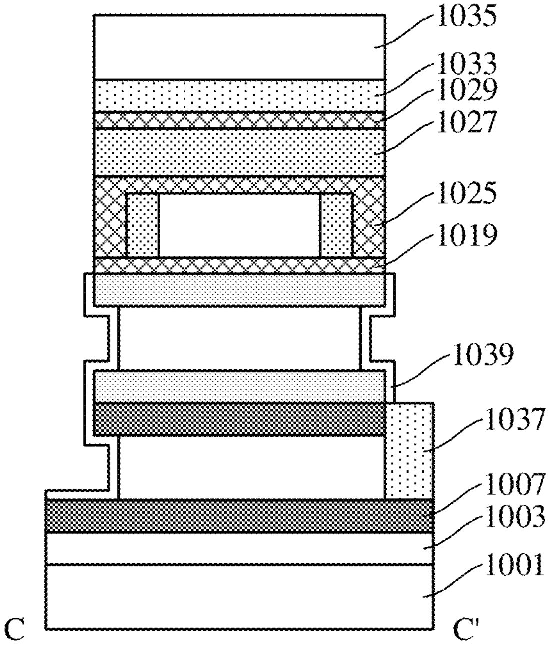
Figure 15C:
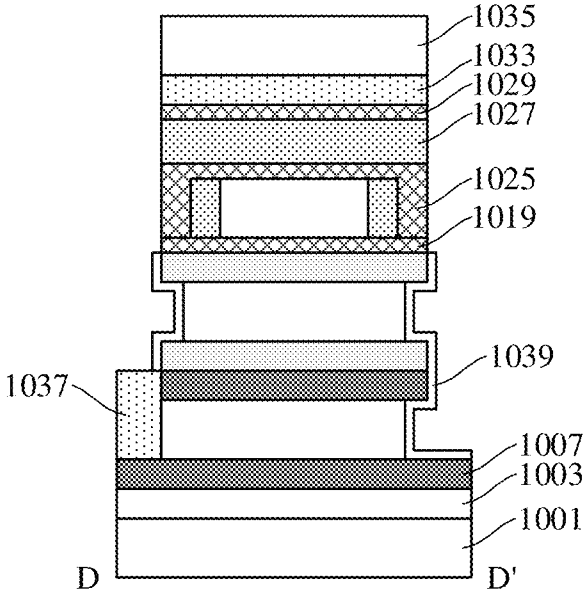

The channel layers may be grown on the surfaces of the channel defining layers 1009 and 1015 with such patterns. For example, as shown in FIG. 15(*a*), FIG. 15(*b*) and FIG. 15(*c*) (which are respectively a top view, a cross-sectional view taken along line CC' and a cross-sectional view taken along line DD'), a channel layer 1039 may be formed by, for example, a selective epitaxial growth. A thickness of the grown film may be controlled so that a space left between the source/drain layers due to the refinement of the channel defining layer is not completely filled after the channel layer 1039 is formed. The channel layer 1039 may have a vertical extension portion extending at the above-mentioned end portions in the second direction of the strip portion of the channel defining layer (referring to dashed boxes with shaded lines in the top view of FIG. 15(*a*)) and a lateral extension portion extending on the top surface or bottom surface of the corresponding source/drain layer. Due to the selective epitaxial growth, the channel layer 1039 may be grown on the surface of the active layer of the semiconductor, rather than on the surface of the dielectric layer. Especially, the channel layer 1039 may not be formed at a portion shielded by the shielding layer 1037. In a case that the mask layer 1035 is polycrystalline silicon, the channel layer may also be grown on the surface of the mask layer 1035 (not shown), but this may not affect the subsequent processes. As the channel layer 1039 is formed by a separate epitaxial growth, a film thickness and a crystal quality of the channel layer 1039 may be controlled well.

A material of the channel layer 1039 may be selected according to the device design. For example, the channel layer 1039 may contain a semiconductor material substantially same as the source/drain layer (which is Si in this example). Alternatively, the channel layer 1039 may contain a semiconductor material different from the source/drain layer, such as SiGe, so as to improve a device performance (for example, enhance a carrier mobility).

According to embodiments, the channel defining layers 1009 and 1015 may have dopants (for example, by in-situ doping during growth). An annealing treatment may be performed to drive the dopants in the channel defining layers 1009 and 1015 into the channel layer 1039, so that the channel layer 1039 has a particular doping distribution. For example, for the p-type transistors, the channel defining layer 1009 may contain n-type dopants (such as As), and after the annealing treatment, the channel layer 1039, especially the vertical extension portion of the channel layer 1039 on the sidewall of the channel defining layer 1009, may have an n-type doping concentration in a range of about 1E17 to 2E18 $cm^{-3}$ (for example, 2E18 $cm^{-3}$); for the n-type transistors, the channel defining layer 1015 may contain p-type dopants (for example, B), and after the annealing treatment, the channel layer 1039, especially the vertical extension portion of the channel layer 1039 on the sidewall of the channel defining layer 1015, may have a p-type doping concentration in a range of about 1E17 to 2E18 $cm^{-3}$ (for example, 2E18 $cm^{-3}$). Such a doping concentration distribution in the channel layer may help to adjust a threshold voltage ($V_t$) of the transistor. Dopants from the source/drain layers may be driven into the lateral extension portion of the channel layer.

Figure 16A:
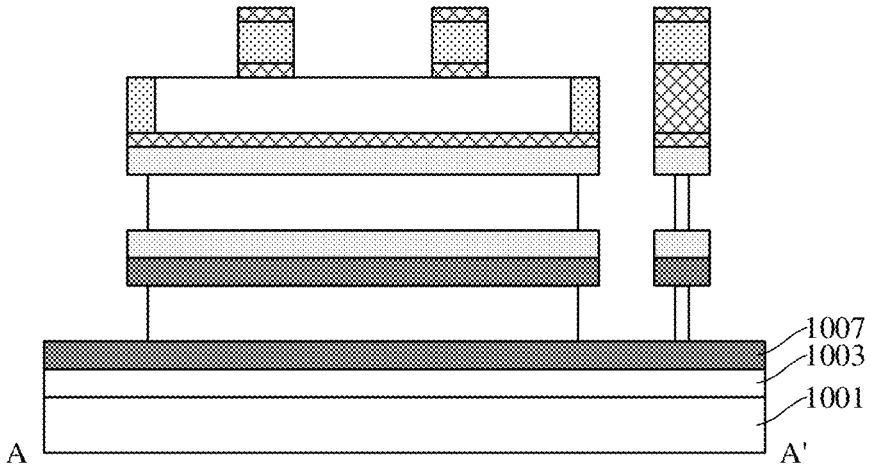
Figure 16B:
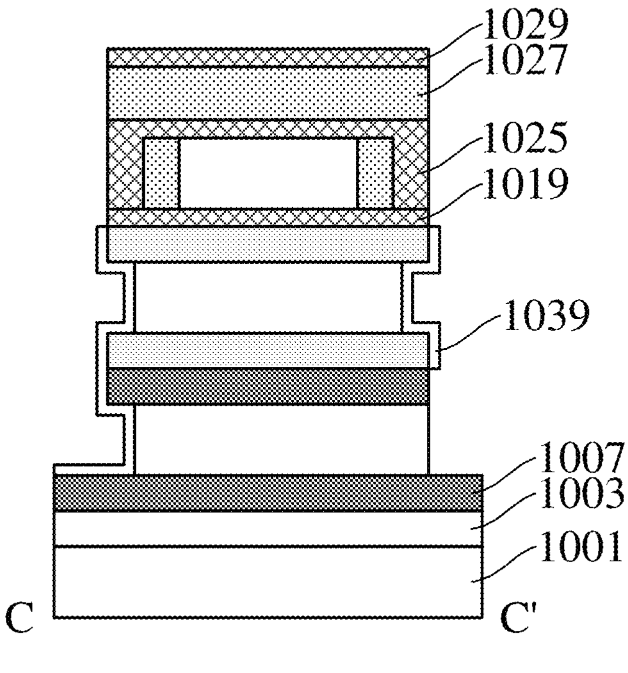
Figure 16C:
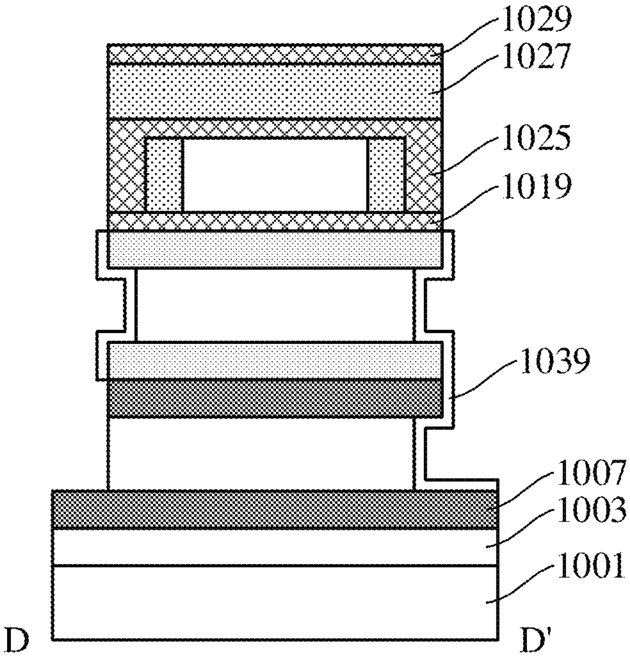
Figure 17:
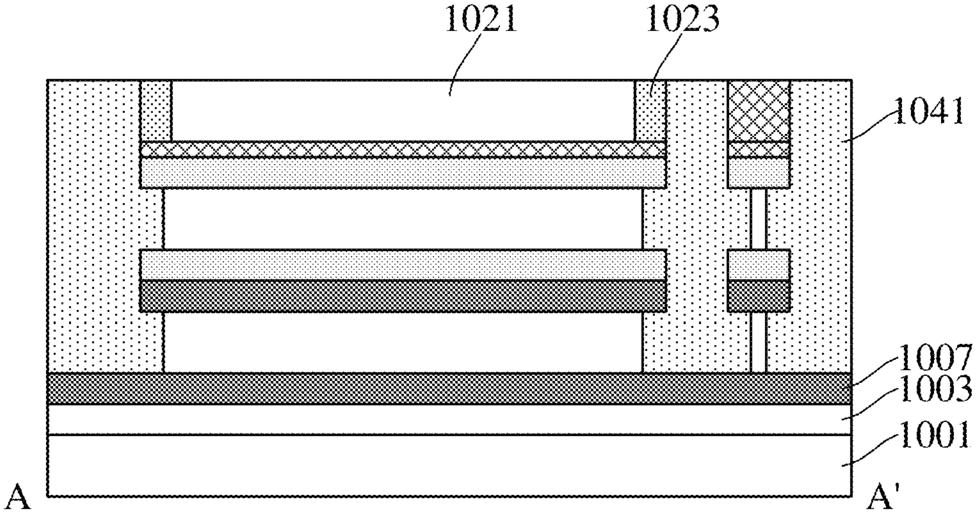

So far, except for the first source/drain layer 1007 and the contact layer 1003 at the bottom (which will be patterned at the end), the position of the active material layer on the outer side has been substantially defined using the outer side of the pattern of the hard mask (the rectangular ring pattern and the protruding pattern described above). In addition, a channel layer overlapping with the protruding pattern in the vertical direction is formed on the outer side of the spacer 1023. Next, a position of the active material layer on an inner side may be defined using an inner side of the pattern of the hard mask. To this end, a shielding layer may be formed on the substrate to shield the outer sides of various structures on the substrate. For example, as shown in FIG. 16(*a*), FIG. 16(*b*) and FIG. 16(*c*) (which are respectively a cross-sectional view taken along line AA', a cross-sectional view taken along line CC', and a cross-sectional view taken along line DD'), the mask layer 1035, the shielding layer 1037 and the filling layer 1033 may be removed by a selective etching. Then, as shown in FIG. 17 (which is a cross-sectional view taken along line AA'), a shielding layer 1041 may be formed by depositing, for example, an oxide, and performing a planarization, such as CMP, on the deposited oxide. The planarization may stop at the mandrel 1021. In this way, a portion above the mandrel 1021 in the hard mask may be removed.

Next, the inner side of the active material layer may be patterned.

Figure 18:
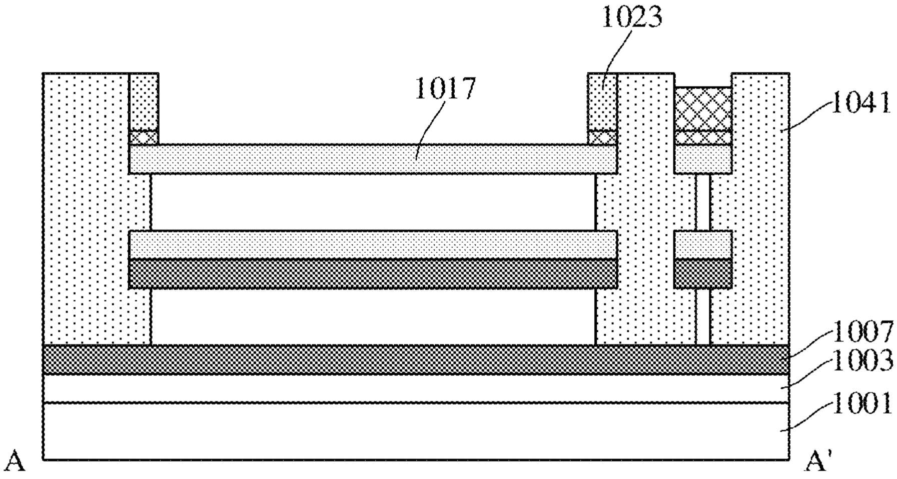

For example, as shown in FIG. 18 (which is a cross-sectional view taken along line AA'), the mandrel 1021 exposed due to the planarization may be removed by a selective etching, and an anisotropic etching may be performed on the aluminum oxide layer 1019 exposed due to a removal of the mandrel 1021, for example, by RIE in vertical direction. The etching of the aluminum oxide layer 1019 may stop at the second source/drain layer 1017 for the n-type transistors. The etching of the aluminum oxide layer 1019 may cause the aluminum oxide layer 1025 at the column structure corresponding to the circular portion 1031*c* to be recessed to a certain depth (about the thickness of the aluminum oxide layer 1019).

Figure 19A:
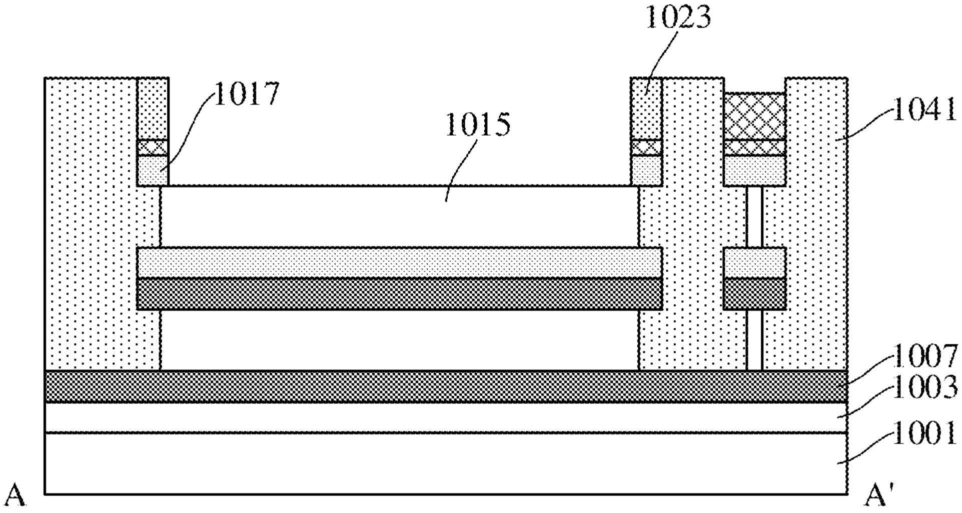
Figure 19B:
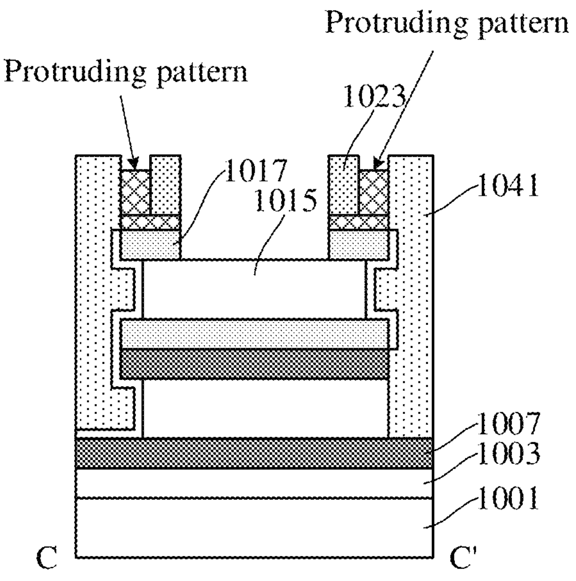
Figure 19C:
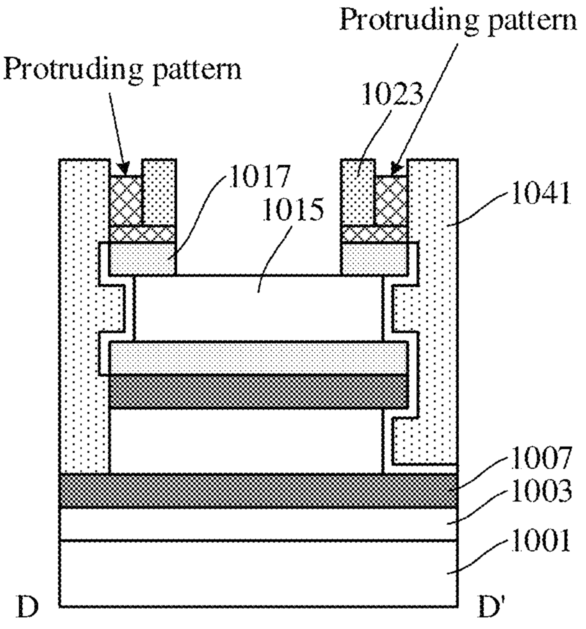

Thus, the aluminum oxide layer 1019 has a rectangular ring pattern defined by the spacer 1023 (with a protruding pattern on the outer side, as shown in the cross-sectional views in FIG. 19(*b*) and FIG. 19(*c*)), and then the source/drain layers and the interconnection structures may be patterned based on this. Such patterning may be performed on each layer from top to bottom.

For example, as shown in FIG. 19(*a*), FIG. 19(*b*) and FIG. 19(*c*) (which are respectively a cross-sectional view taken along line AA', a cross-sectional view taken along line CC', and a cross-sectional view taken along line DD'), an anisotropic etching may be performed on the second source/drain layer 1017 for the n-type transistors exposed due to the etching of the aluminum oxide layer 1019, for example, by RIE in vertical direction, and the etching may stop at the channel defining layer 1015. Accordingly, the second source/drain layer 1017 for the n-type transistors may be formed as a rectangular ring pattern corresponding to the spacer 1023, and also with protruding patterns.

Figure 20A:
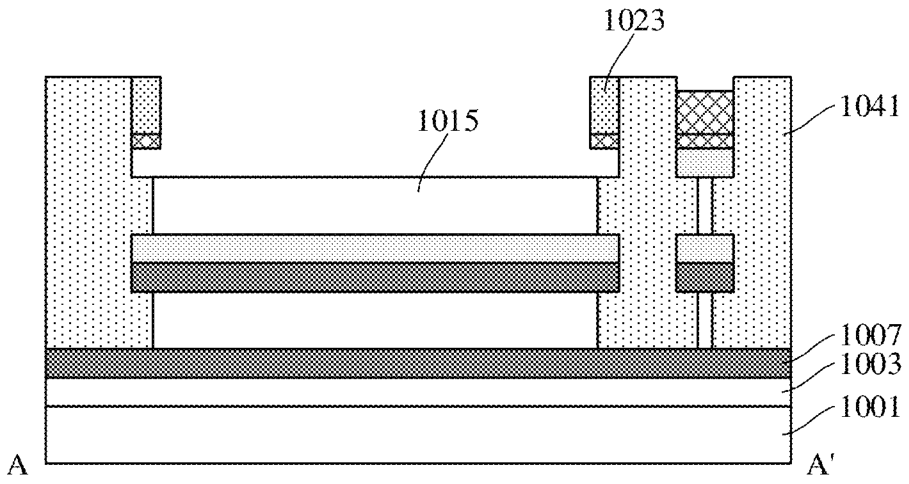
Figure 20B:
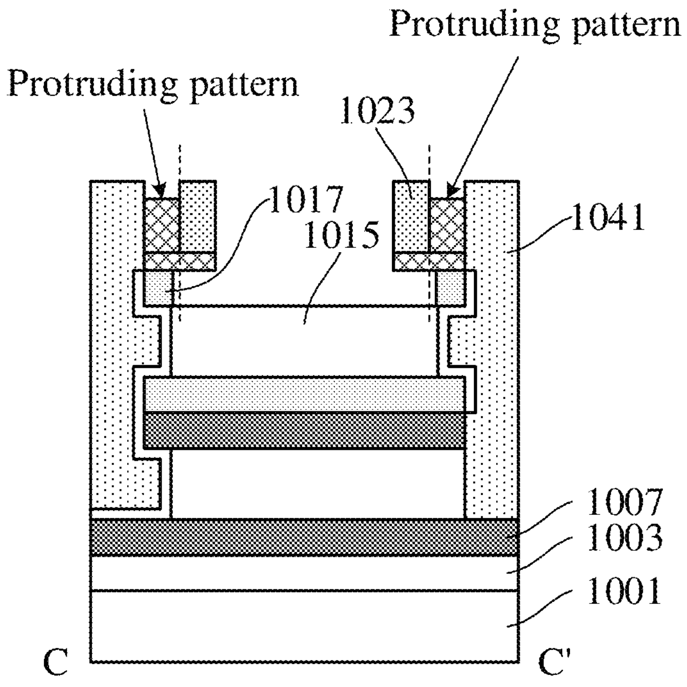
Figure 20C:
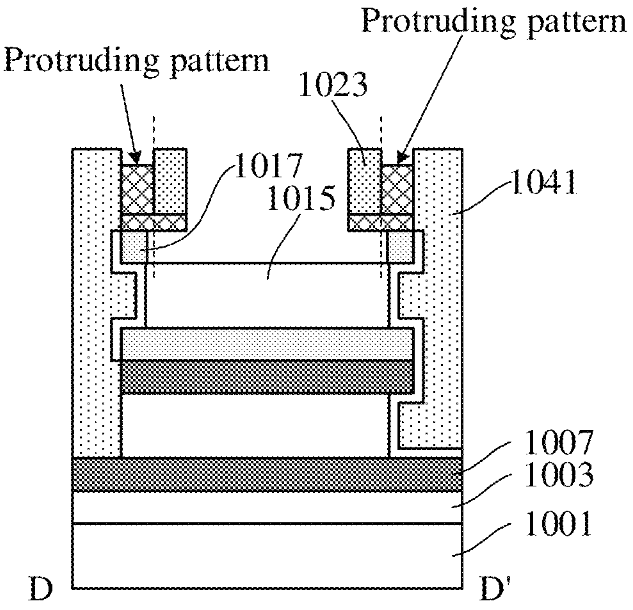

As described above, four n-type transistors may be formed in the upper layer, including the first pull-down transistor PD-1, the first pass gate transistor PG-1, the second pull-down transistor PD-2, and the second pass gate transistor PG-2, of which the respective upper source/drain layers (for example, referring to S/D3_U, S/D6_U in FIG. 3(*a*) and S/D1_U, S/D5_U in FIG. 3(*b*) may be separated from each other. These separated source/drain layers may be defined by protruding patterns. For example, as shown in FIG. 20(*a*), FIG. 20(*b*) and FIG. 20(*c*) (which are respectively a cross-sectional view taken along line AA', a cross-sectional view taken along line CC', and a cross-sectional view taken along line DD'), a further selective etching, such as a wet etching, may be performed on the second source/drain layer 1017 for the n-type transistors, so that the second source/drain layer 1017 is separated into, for example, four portions corresponding to the four transistors. The etching may be performed from an inner side of the ring-shaped second source/drain layer 1017, so that a portion of the second source/drain layer 1017 that overlaps with the ring-shaped spacer 1023 in the vertical direction may be removed first. An etching depth may be controlled to be, for example, greater than the line width of the spacer 1023, so that the portion of the second source/drain layer 1017 that overlaps with the ring-shaped spacer 1023 in the vertical direction may be completely removed, while a portion of the second source/drain layer 1017 that overlaps with the protruding pattern in the vertical direction may be (at least partially) retained. ALE may be adopted to better control the etching depth. Then, the second source/drain layer 1017 is separated into four separate portions corresponding to the protruding patterns. To ensure a process margin, the etching may be performed to the outer side of the spacer 1023. Accordingly, as shown by the dashed lines in the cross-sectional views of FIG. 20(*b*) and FIG. 20(*c*), the inner sidewalls of the separate portions of the second source/drain layer 1017 may be located on the outer side of the spacer 1023.

Figure 21A:
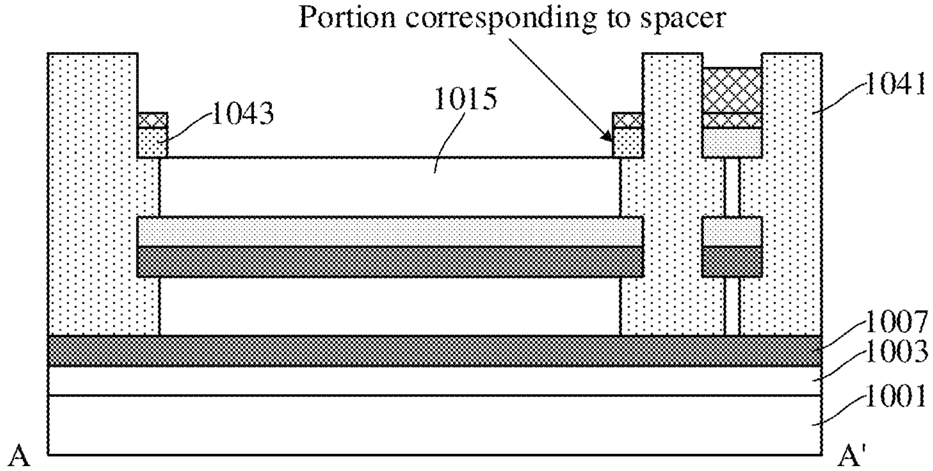
Figure 21B:
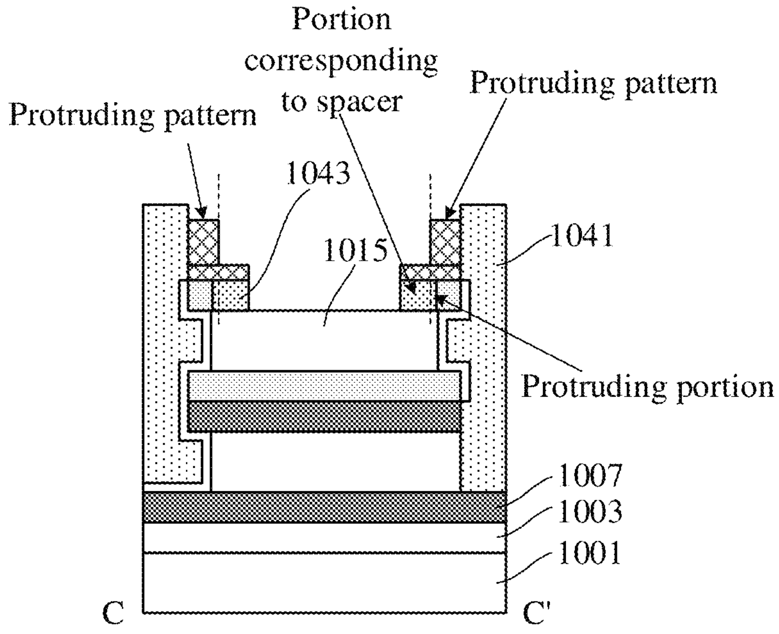
Figure 21C:
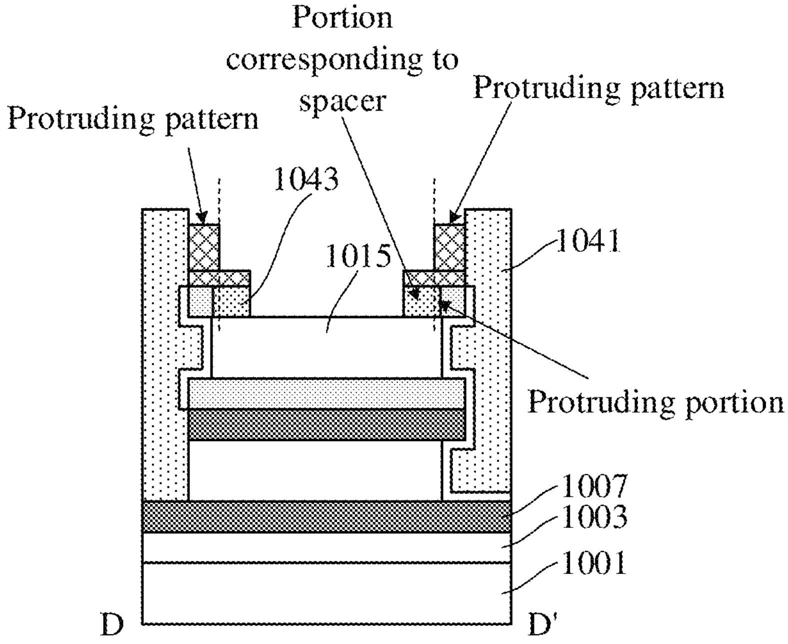

To ensure an integrity of patterns, a region where the second source/drain layer 1017 is removed may be filled by an occupying layer under the ring-shaped spacer 1023 (and possibly under the protruding patterns, in a case that the inner sidewalls of the separate portions of the second source/drain layer 1017 are located on the outer side of the spacer 1023). For example, as shown in FIG. 21(*a*), FIG. 21(*b*) and FIG. 21(*c*) (which are respectively a cross-sectional view taken along line AA', a cross-sectional view taken along line CC', and a cross-sectional view taken along line DD'), an occupying layer 1043 may be formed by depositing, for example, a nitride (with an amount of deposition that is sufficient to fill a gap under the spacer 1023 and a gap possibly existing under the protruding pattern), and etching back the deposited nitride by, for example, RIE in vertical direction. Here, a reason for selecting the nitride is at least to consider the etching selectivity with respect to the existing layers in the structure, such as the aluminum oxide layer 1019, the shielding layer 1041, etc.

Thus, the occupying layer 1043 may have a rectangular ring pattern corresponding to the spacer 1023, and may have a protruding portion corresponding to the separate portion of the second source/drain layer 1017 (extending from under the spacer 1023 towards the separate portion of the second source/drain layer 1017). When the nitride is etched back, the spacer 1023 which is also a nitride may also be removed in this example. However, the obtained structure still contains a ring-shaped structure, including the aluminum oxide layer 1019 (with a protruding pattern on the outer side) and the occupying layer 1043 (possibly with protruding portion).

Figure 22A:
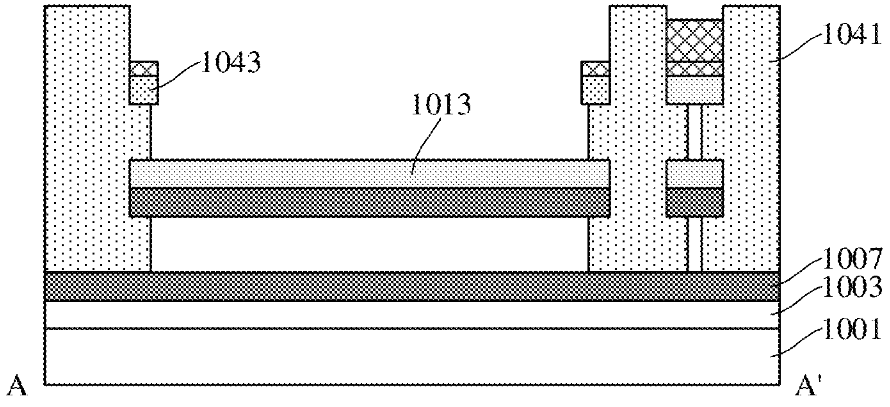
Figure 22B:
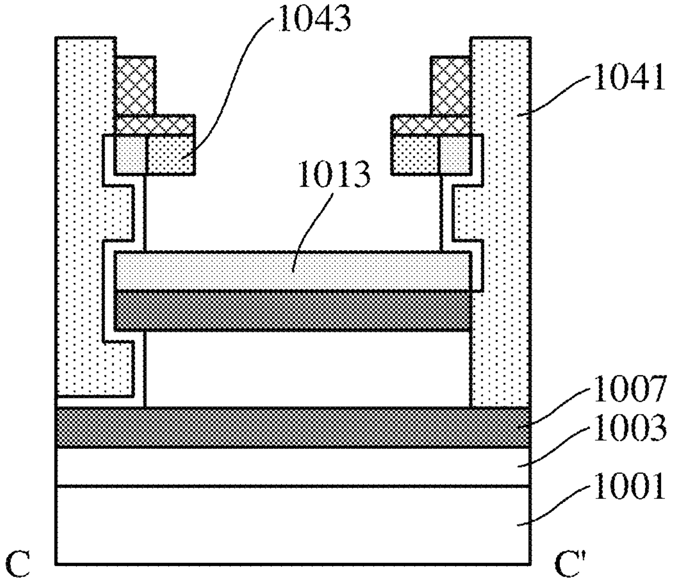
Figure 22C:
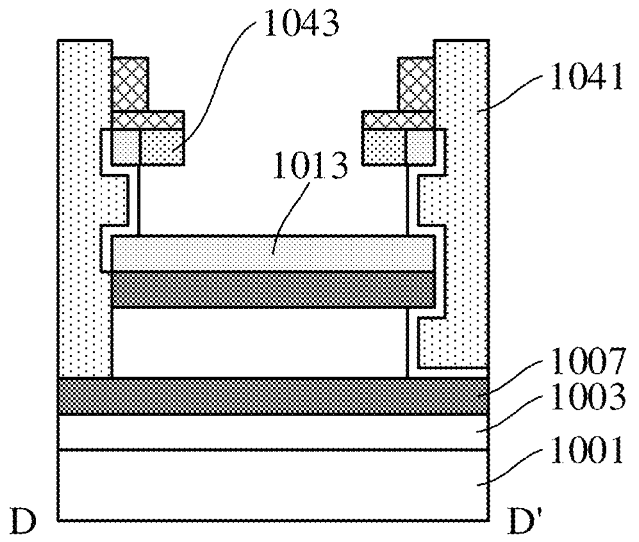

The channel defining layer 1015 is exposed due to the patterning of the second source/drain layer 1017 and may therefore be removed. For example, as shown in FIG. 22(*a*), FIG. 22(*b*) and FIG. 22(*c*) (which are respectively a cross-sectional view taken along line AA', a cross-sectional view taken along line CC', and a cross-sectional view taken along line DD'), a selective etching, such as a wet etching, may be performed on the channel defining layer 1015 to remove the channel defining layer 1015. Accordingly, the channel layer 1039 may extend vertically between the first source/drain layer 1013 and the second source/drain layer 1017 on the outer side of the ring-shaped pattern (currently defined by the aluminum oxide layer 1019).

Figure 23A:
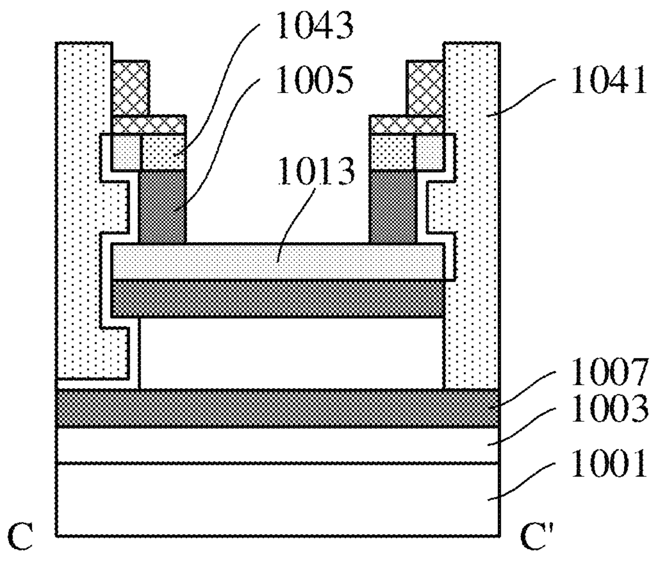
Figure 23B:
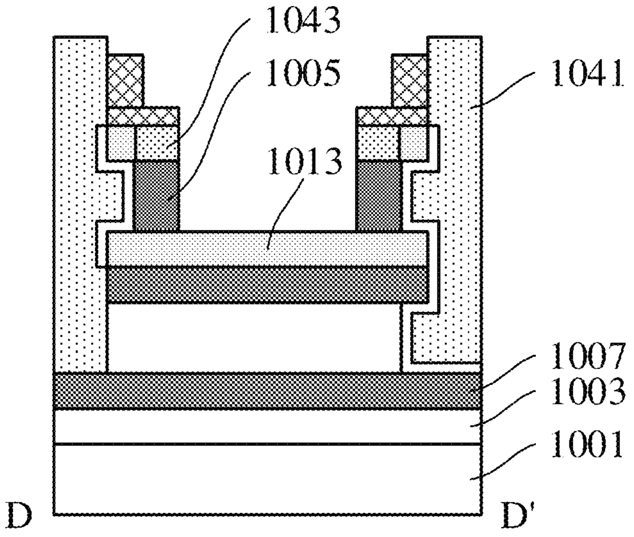

Similarly, to ensure the integrity of the pattern, an occupying layer may be formed in a gap formed by a recess of the channel layer relative to the periphery of the hard mask (a gate stack may be subsequently formed in that gap, and the occupying layer occupying that gap may also be referred to as a "sacrificial gate"). For example, as shown in FIG. 23(*a*) and FIG. 23(*b*) (which are respectively a cross-sectional view taken along line CC' and a cross-sectional view taken along line DD'), a sacrificial gate 1005 may be formed by depositing, for example, a nitrogen oxide (such as silicon nitride) and etching back the deposited nitrogen oxide by, for example, RIE in vertical direction. Here, a reason for selecting the nitrogen oxide is at least to consider the etching selectivity with respect to the existing layers in the structure, such as the hard mask layer, the shielding layer 1041, the occupying layer 1043, etc.

Figure 24A:
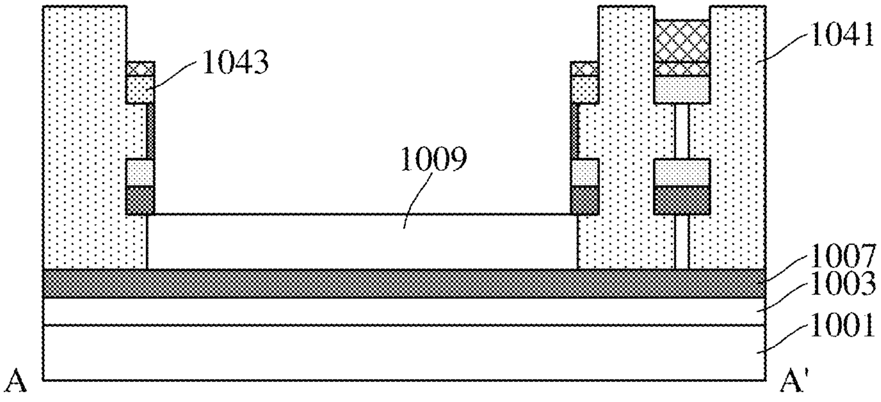
Figure 24B:
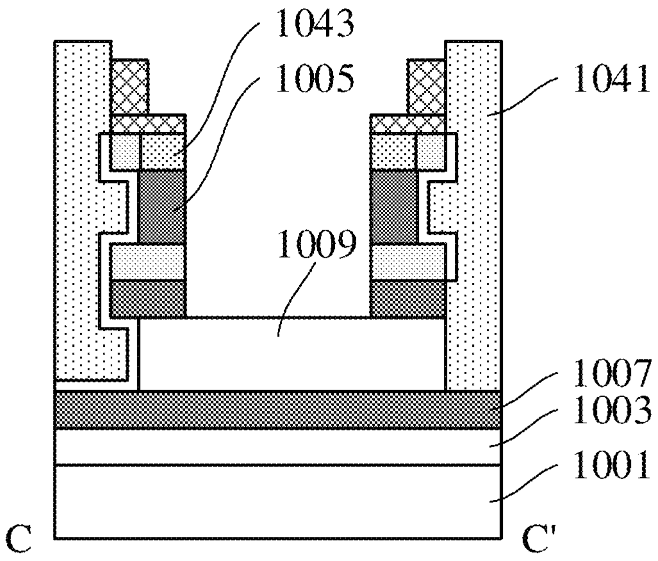
Figure 24C:
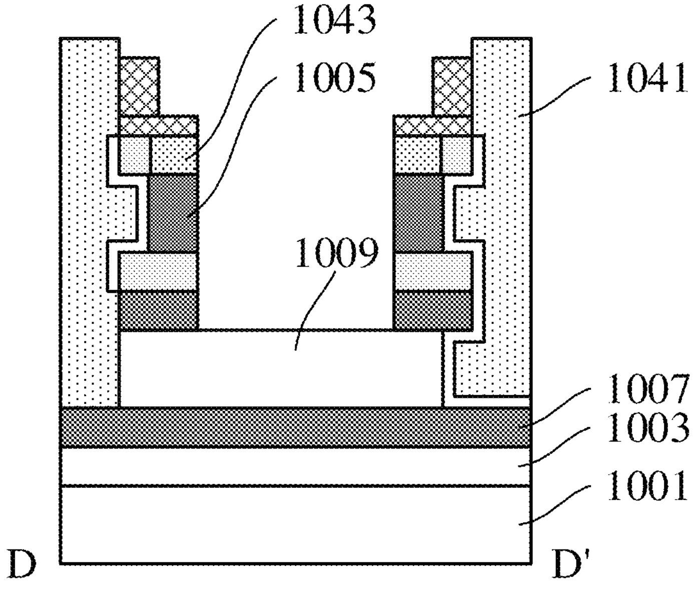

Next, the first source/drain layer 1013 for the n-type transistors and the second source/drain layer 1011 for the p-type transistors may be patterned. As described above, these two layers may be patterned in the same way and may be used to form the interconnection structure. For example, as shown in FIG. 24(*a*), FIG. 24(*b*) and FIG. 24(*c*) (which are respectively a cross-sectional view taken along line AA', a cross-sectional view taken along line CC', and a cross-sectional view taken along line DD'), an anisotropic etching may be performed on the first source/drain layer 1013 for the n-type transistors and the second source/drain layer 1011 for the p-type transistors by, for example, RIE in vertical direction, and the etching may stop at the channel defining layer 1009. Accordingly, the first source/drain layer 1013 for the n-type transistors and the second source/drain layer 1011 for the p-type transistors may be formed as a rectangular ring pattern corresponding to the hard mask layer, with a protruding pattern on the outer side. Two interconnection structures may be separated from the rectangular ring pattern. According to embodiments, a separation of the interconnection structures may be performed later when both sides of the first source/drain layer 1013 for the n-type transistors and the second source/drain layer 1011 for the p-type transistors are exposed (referring to the following description with reference to FIG. 31(*a*) to FIG. 32(*c*)).

Figure 25A:
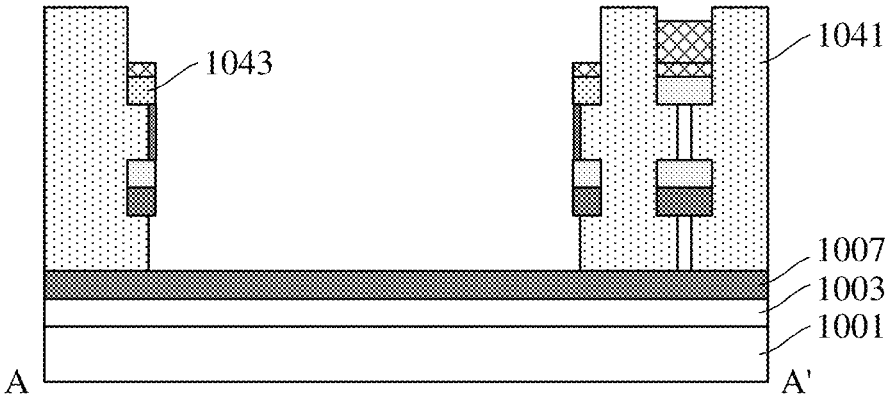
Figure 25B:
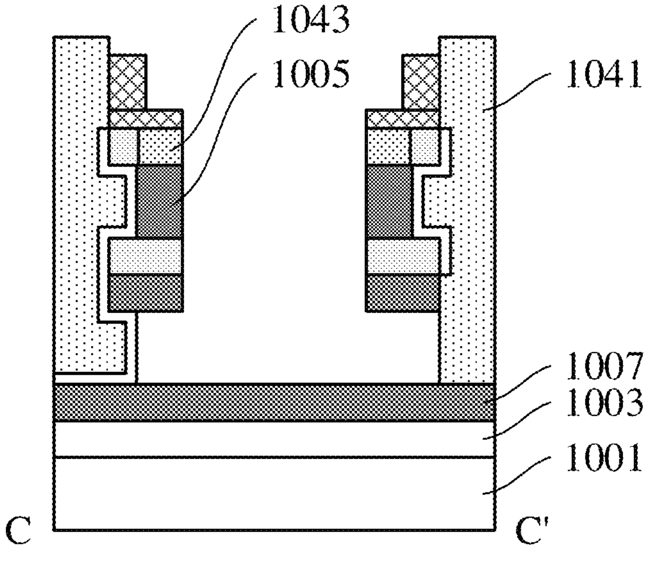
Figure 25C:
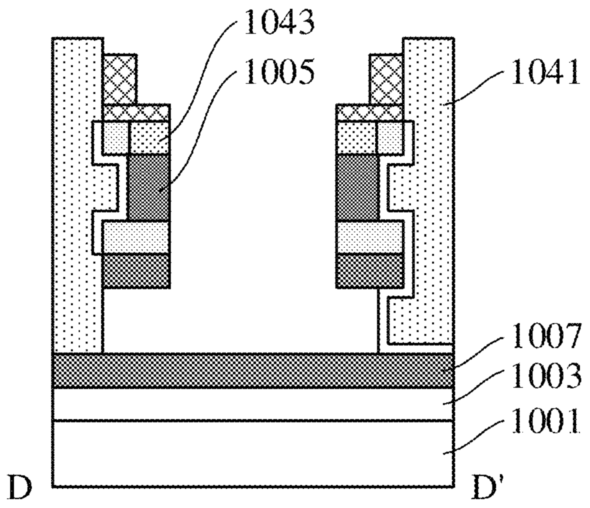

Similarly, as shown in FIG. 25(*a*), FIG. 25(*b*) and FIG. 25(*c*) (which are respectively a cross-sectional view taken along line AA', a cross-sectional view taken along line CC', and a cross-sectional view taken along line DD'), a selective etching, such as a wet etching, may be performed on the channel defining layer 1009 to remove the channel defining layer 1009. Accordingly, the channel layer 1039 may extend vertically between the first source/drain layer 1007 and the second source/drain layer 1013 on the outer side of the ring-shaped pattern (currently defined by the aluminum oxide layer 1019).

Thus, except for the first source/drain layer 1007 and the contact layer 1003 at the bottom (which will be patterned at the end), the position of the active material layer on the inner side is substantially defined using the inner side of the pattern of the hard mask (the rectangular ring pattern and the protruding pattern described above). Accordingly, the active material layer (except for the first source/drain layer 1007 and the contact layer 1003) is patterned on both inner and outer sides based on the hard mask.

In the obtained structure, the occupying layer 1043 and the source/drain layer 1017 on the sidewall of the occupying layer 1043 are together patterned as a pattern of the hard mask (the rectangular ring pattern and the protruding pattern), and the source/drain layers 1013 and 1011 are patterned as a pattern of the hard mask. These two patterns are self-aligned with each other and may substantially overlap completely in the vertical direction.

Based on the hard mask, an occupying layer may be filled between the occupying layer 1043+the source/drain layer 1017 and the source/drain layers 1013, 1011, and between the source/drain layers 1013, 1011 and the source/drain layer 1007. The occupying layer formed in this way may have a pattern defined by the hard mask and may become a sacrificial gate self-aligned with the channel layer 1039.

Considering that a layout difference between devices in the upper and lower layers (for example, four transistors may be formed in the upper layer while two transistors may be formed in the lower layer) may lead to different gate layouts of devices in the upper and lower layers, the sacrificial gates may be formed, for example, from top to bottom respectively for the devices in upper and lower layers.

Figure 26A:
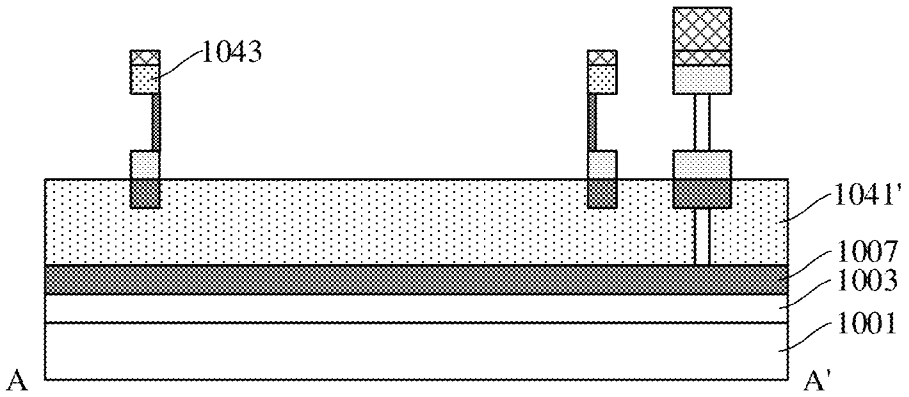
Figure 26B:
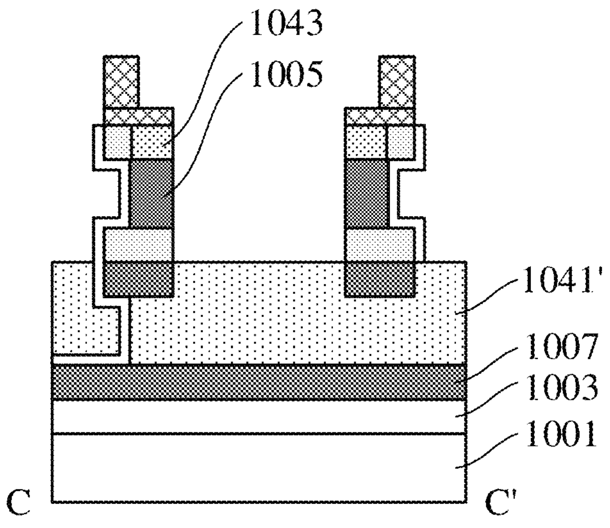
Figure 26C:
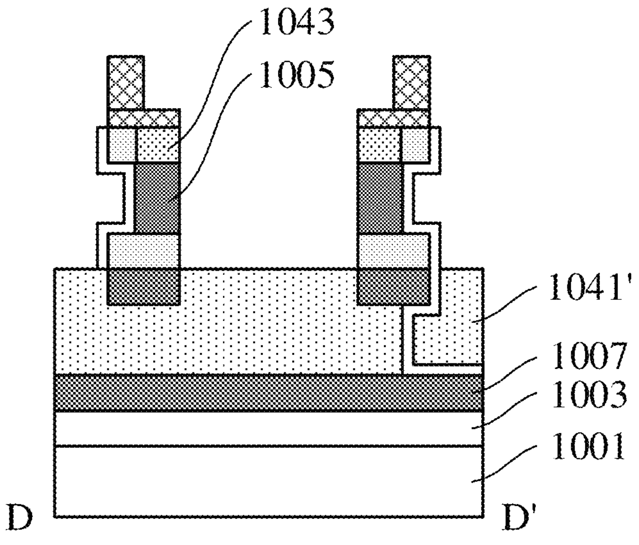

For example, as shown in FIG. 26(*a*), FIG. 26(*b*) and FIG. 26(*c*) (which are respectively a cross-sectional view taken along line AA', a cross-sectional view taken along line CC', and a cross-sectional view taken along line DD'), an adjusted shielding layer 1041' may be obtained by depositing, for example, an oxide, performing a planarization such as CMP on the deposited oxide, and etching back the planarized oxide. The adjusted shielding layer 1041' may have a substantially flat top surface and may shield the lower active layer (for the p-type transistors) while exposing the upper active layer (for the n-type transistors). For example, the top surface of the filling layer 1041' may be located at or near an interface between the second source/drain layer 1011 for the p-type transistors and the first source/drain layer 1013 for the n-type transistors.

Figure 27A:
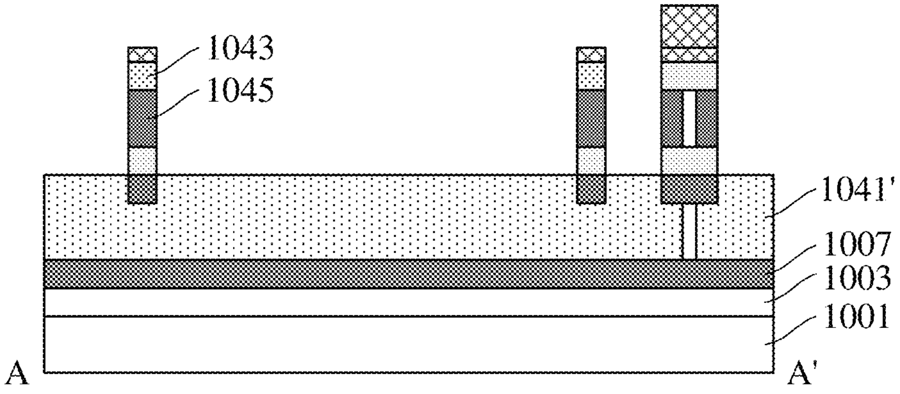
Figure 27B:
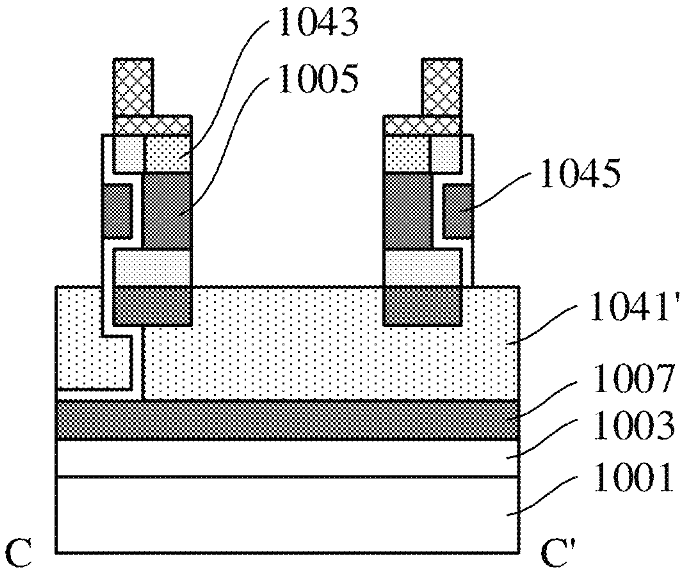
Figure 27C:
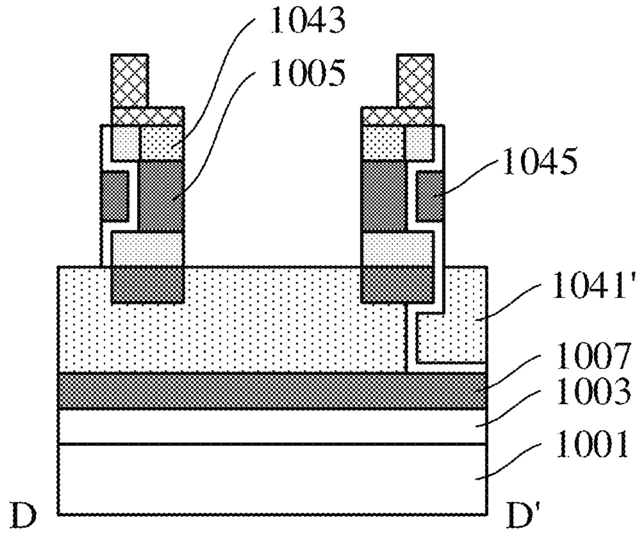

Thus, a space on an outer side of the upper channel layer is released (as described above, the inner side of the upper channel layer has been already formed with the sacrificial gate 1005). A sacrificial gate may be similarly formed in such a released space. For example, as shown in FIG. 27(*a*), FIG. 27(*b*) and FIG. 27(*c*) (which are respectively a cross-sectional view taken along line AA', a cross-sectional view taken along line CC', and a cross-sectional view taken along line DD'), a sacrificial gate 1045 may be formed by depositing, for example, a nitrogen oxide, and etching back the deposited nitrogen oxide by, for example, RIE in vertical direction. Here, a reason for selecting the nitrogen oxide is that the nitrogen oxide may have the same etching selectivity as the previously formed sacrificial gate 1005, and may be removed together in a replacement gate process of forming the gate stack. It should be noted that in the cross-sectional view of FIG. 27(*a*), the previously formed sacrificial gate 1005 is shown together as the sacrificial gate 1045, because they may be treated in the same way in the subsequent processes.

Therefore, the sacrificial gates 1005 and 1045 as a whole may form a rectangular ring pattern with the protruding pattern on the outer side defined by the hard mask. The presence of the protruding pattern allows the sacrificial gates 1005 and 1045 to surround the channel layer. Accordingly, a gate-all-around structure may be formed. In addition, the sacrificial gates 1005 and 1045 may occupy an original position of the channel defining layer 1015, and extend between the first source/drain layer 1013 and the second source/drain layer 1017 for the n-type transistors (most of which have been replaced by the occupying layer 1043, only with the separated four portions left under the protruding patterns). Therefore, replacing the sacrificial gates 1005 and 1045 later may be self-aligned with the channel layer 1039 between the upper and lower source/drain layers.

A sacrificial gate may be formed similarly for the lower channel layer.

Figure 28A:
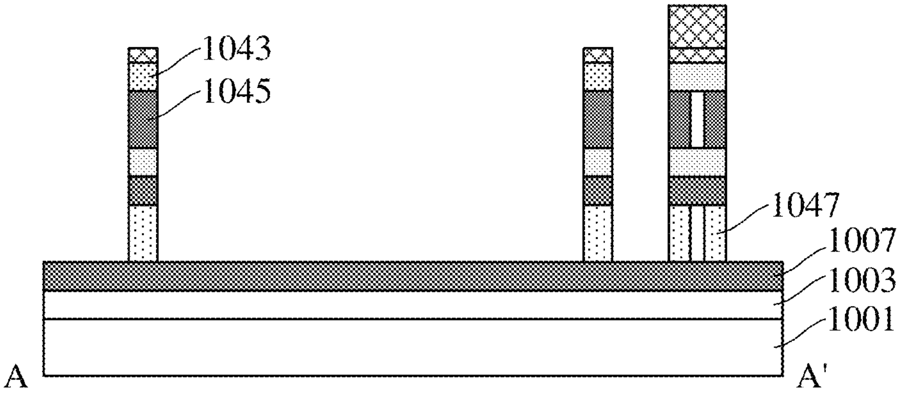
Figure 28B:
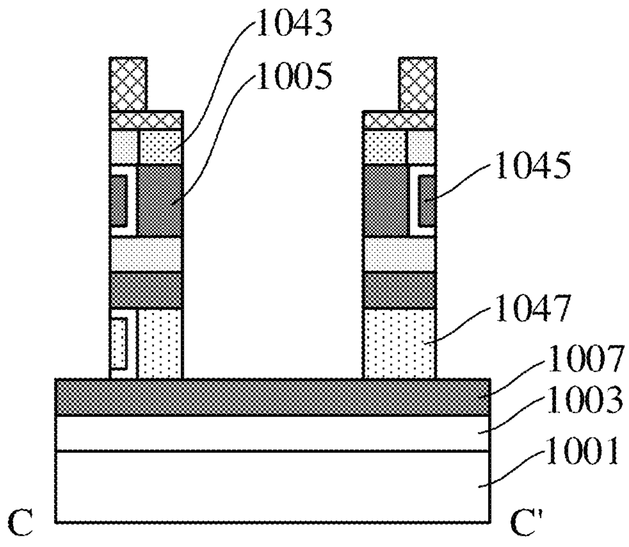
Figure 28C:
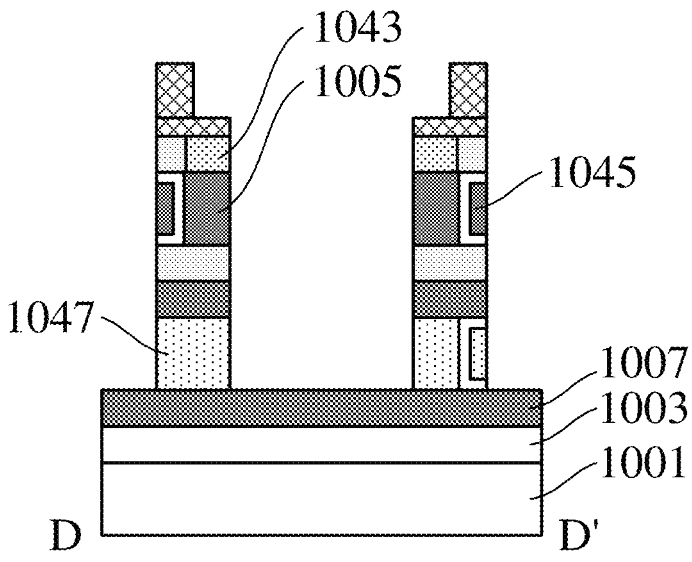
Figure 29A:
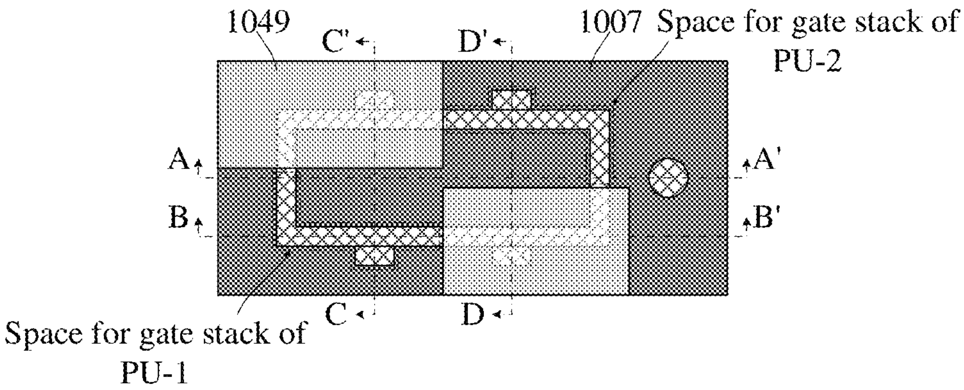
Figure 29B:
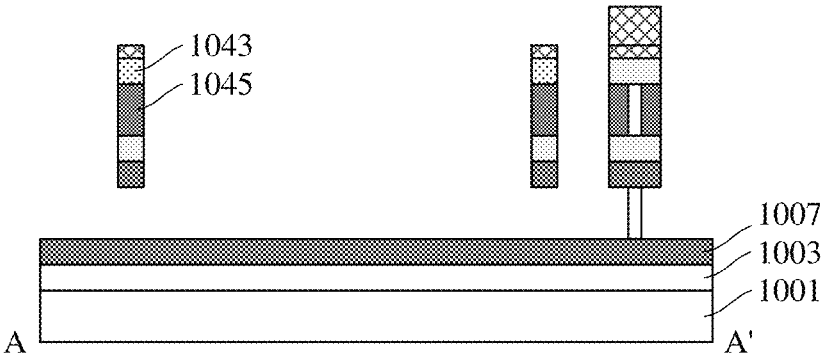
Figure 29C:
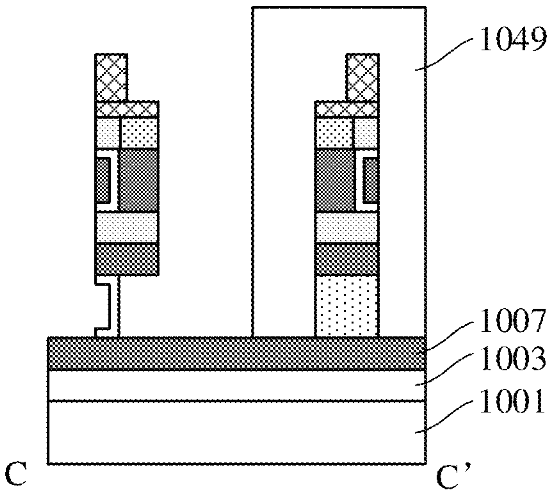
Figure 29D:
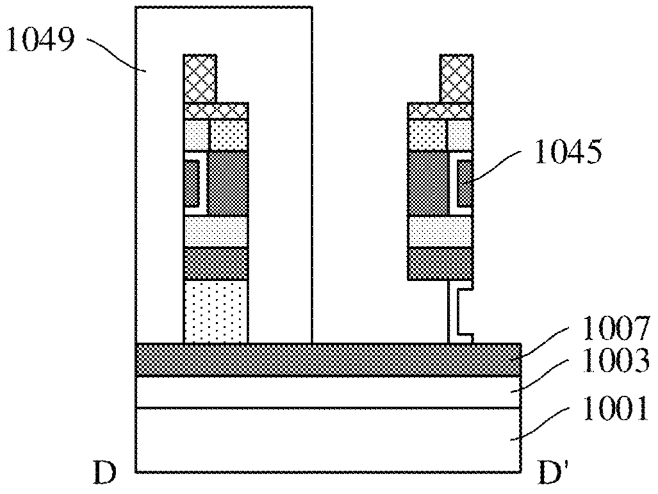

Considering an electrical isolation between the gate stacks of the two p-type transistors in the lower layer, an occupying layer may be formed first. For example, as shown in FIG. 28(*a*), FIG. 28(*b*) and FIG. 28(*c*) (which are respectively a cross-sectional view taken along line AA', a cross-sectional view taken along line CC', and a cross-sectional view taken along line DD'), an anisotropic etching may be performed on the shielding layer 1041' by, for example, RIE in vertical direction, and the etching may stop at the first source/drain layer 1007. Then, the remaining shielding layer 1041' (hereinafter referred to as an occupying layer 1047) as a whole may be form as a rectangular ring pattern with a protruding pattern on the outer side defined by the hard mask layer.

Next, the occupying layer 1047 may be patterned to leave a space for a formation of the gate stack for the p-type transistors. As shown in FIG. 29(*a*), FIG. 29(*b*), FIG. 29(*c*) and FIG. 29(*d*) (which are respectively a top view, a cross-sectional view taken along line AA', a cross-sectional view taken along line CC', and a cross-sectional view taken along line DD',), a photoresist 1049 may be formed on the obtained structure, and the photoresist 1049 may be patterned to expose a region where the gate stack for the p-type transistors needs to be formed. Specifically, in this example, as shown in the top view of FIG. 29(*a*), a space for the formation of the gate stacks for the p-type transistors is left in a region around the protruding pattern on a left side of the first side S1 (which defines the position of the channel layer of the first pull-up transistor PU-1) and the protruding pattern on a right side of the third side S3 (which defines the position of the channel layer of the second pull-up transistor PU-2) in the mask pattern. In addition, in this example, the photoresist 1049 further exposes a part of the fourth side S4, so that the subsequently formed gate stack of the first pull-up transistor PU-1 may extend into that region, so as to be electrically connected to the gate stack of the above first pull-down transistor PD-1. Similarly, the photoresist 1049 further exposes a part of the second side S2, so that the subsequently formed gate stack of the second pull-up transistor PU-2 may extend into that region, so as to be electrically connected to the gate stack of the above second pull-down transistor PD-2.

In addition, the photoresist 1049 may also expose a region corresponding to the circular portion in the mask pattern. Accordingly, nanowires in the channel defining layers 1009 and 1015 are left in the region corresponding to the circular portion in the mask pattern, and the left nanowires may be surrounded by the sacrificial gate (referring to FIG. 30(*a*)). The sacrificial gate may be subsequently replaced with a gate electrode layer in the replacement gate process (for example, referring to the following description with reference to FIG. 40(*a*) to FIG. 43(*d*)), so that a contact resistance may be reduced.

A selective etching may be performed on the occupying layer 1047 with the above-mentioned patterned photoresist 1049 as an etching mask. As shown in FIG. 29(*c*) and FIG. 29(*d*), the selective etching performed on the occupying layer 1047 may leave a space around the lower channel layer.

Figure 30A:
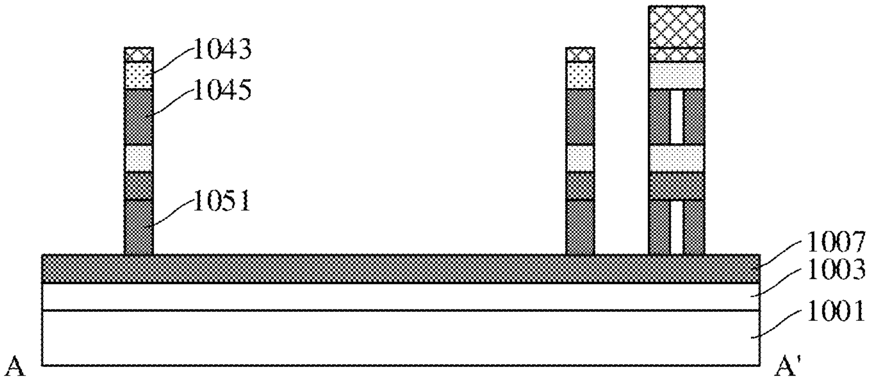
Figure 30B:
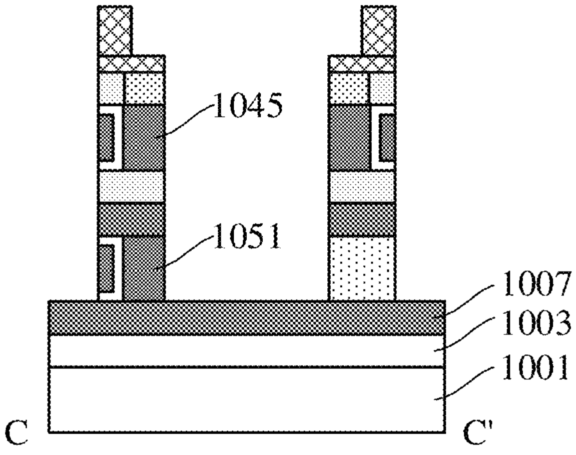
Figure 30C:
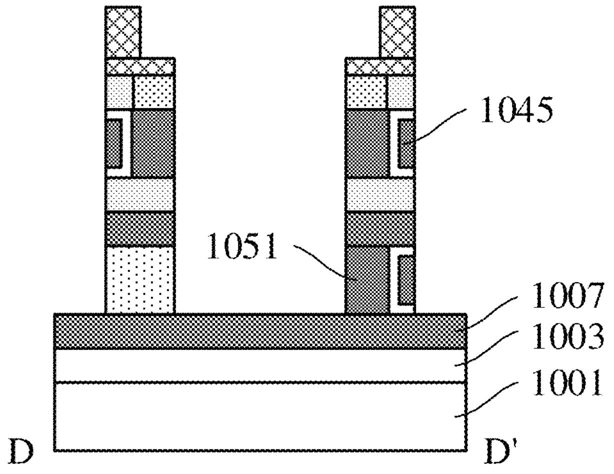
Figure 31A:
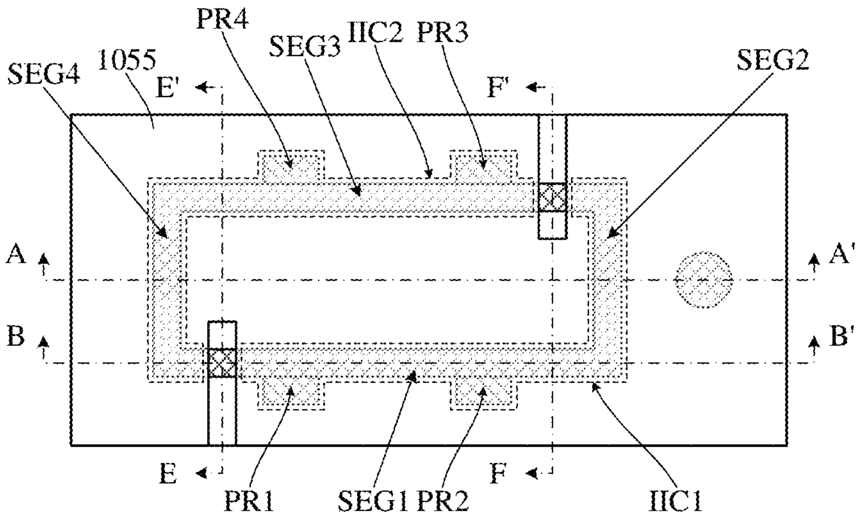
Figure 31B:
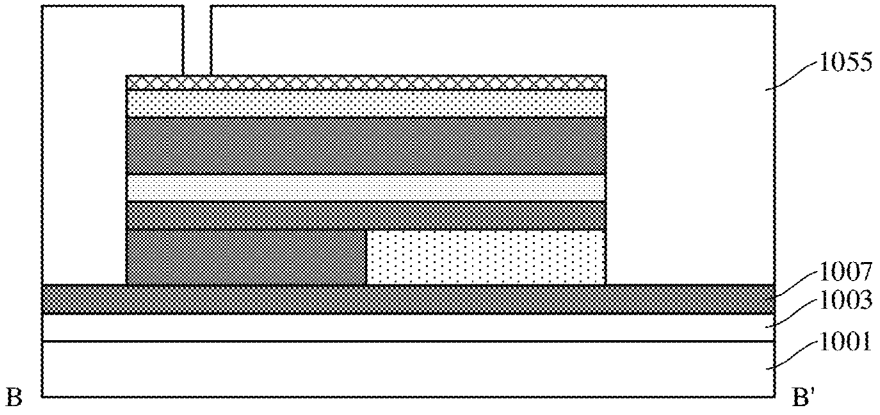
Figure 31C:
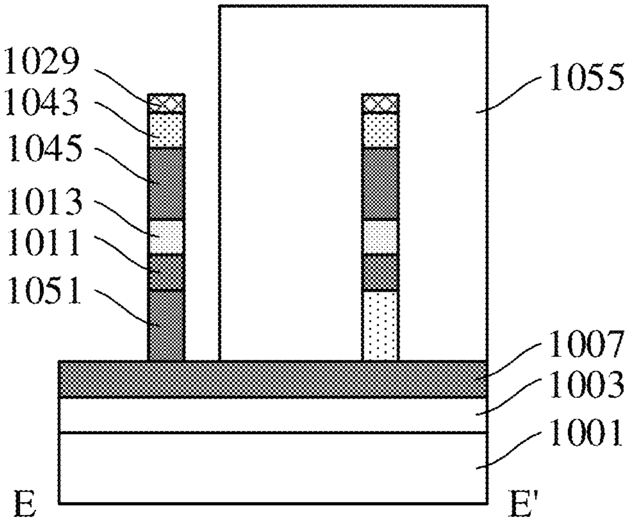
Figure 31D:
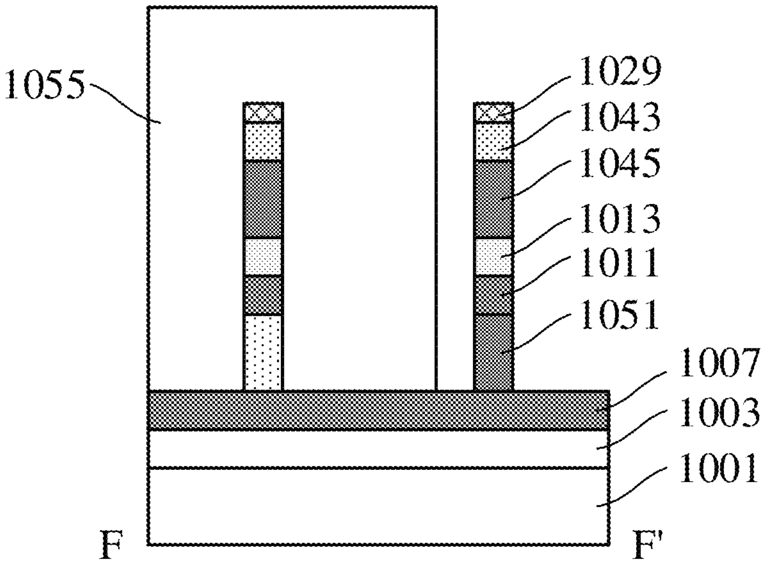

Then, a sacrificial gate may be formed around the lower channel layer. For example, as shown in FIG. 30(*a*), FIG. 30(*b*) and FIG. 30(*c*) (which are respectively a cross-sectional view taken along line AA', a cross-sectional view taken along line CC', and a cross-sectional view taken along line DD'), a sacrificial gate 1051 may be formed by depositing, for example, a nitrogen oxide, and etching back the deposited nitrogen oxide by, for example, RIE in vertical direction. Here, a reason for selecting the nitrogen oxide is that the nitrogen oxide may have the same etching selectivity as the previously formed sacrificial gates 1005 and 1045, so that they may be removed together in the replacement gate process for forming the gate stack.

Therefore, the sacrificial gate 1051 and the occupying layer 1047 as a whole may be formed as a rectangular ring pattern with a protruding pattern on the outer side defined by the hard mask. The sacrificial gate 1051 may include two portions respectively used for the first pull-up transistor PU-1 and the second pull-up transistor PU-2, and the two portions are isolated from each other by the occupying layer 1047.

In the above example, the occupying layer 1047 is formed first, and then the occupying layer 1047 is patterned to replace a part of the occupying layer 1047 with the sacrificial gate 1051. However, the present disclosure is not limited thereto. For example, it is also possible to first form a sacrificial gate (for example, as a rectangular ring pattern with a protruding pattern on the outer side defined by the hard mask), and then pattern the sacrificial gate (for example, using a photoresist with a complementary pattern to the photoresist 1049) to replace a part of the sacrificial gate with the occupying layer.

In addition, in this example, the sacrificial gate 1051 in the lower layer is patterned before a replacement gate process is performed, because it is difficult to pattern the gate stack in the lower layer after the replacement gate process is performed. The sacrificial gates 1005 and 1045 in the upper layer may be patterned to achieve an appropriate electrical isolation after the replacement gate process is performed. Certainly, similar to the sacrificial gate 1051 in the lower layer, the sacrificial gates 1005 and 1045 in the upper layer may also be patterned before the replacement gate process is performed. In this case, similar to the process of forming the sacrificial gate 1051 in the lower layer, an occupying layer may be formed and patterned (the pattern is described below with reference to FIG. 46(*a*)) before the formation of the sacrificial gates 1005 and 1045, and then the sacrificial gates 1005 and 1045 may be formed.

Next, the interconnection structures may be patterned.

The first source/drain layer 1013 for the n-type transistors and the second source/drain layer 1011 for the p-type transistors may be patterned according to a layout of the first interconnection structure and the second interconnection structure. For example, as shown in FIG. 31(*a*), FIG. 31(*b*), FIG. 31(*c*) and FIG. 31(*d*) (which are respectively a top view, a cross-sectional view taken along line BB', a cross-sectional view taken along line EE', and a cross-sectional view taken along line FF'), a photoresist 1055 may be formed on the obtained structure. The photoresist 1055 may be patterned to expose a region in which the first interconnection structure and the second interconnection structure needs to be isolated.

As shown in the dashed boxes in the top view of FIG. 31(*a*), the first interconnection structure IIC1 and the second interconnection structure IIC2 may be formed as two L-shaped structures that are opposite to and spaced apart from each other. The first interconnection structure IIC1 may include a first segment SEG1 extending in the first direction and a second segment SEG2 extending in the second direction. Similarly, the second interconnection structure IIC2 may include a third segment SEG3 extending in the first direction and a fourth segment SEG4 extending in the second direction.

The subsequently formed gate stack of the first pull-up transistor PU-1 may extend to overlap with the fourth segment SEG4 in the vertical direction (referring to the top view in FIG. 29(*a*)). As described above, the gate stack of the first pull-up transistor PU-1 may be electrically connected to the second interconnection structure IIC2. To ensure a process margin, the second interconnection structure IIC2 may include a small segment extending on the first side S1 from the fourth segment SEG4. Similarly, the subsequently formed gate stack of the second pull-up transistor PU-2 may extend to overlap with the second segment SEG2 in the vertical direction (referring to the top view in FIG. 29(*a*)). As described above, the gate stack of the second pull-up transistor PU-2 may be electrically connected to the first interconnection structure IIC1. To ensure a process margin, the first interconnection structure IIC1 may include a small segment extending on the third side S3 from the second segment SEG2. Therefore, an isolation between the first interconnection structure IIC1 and the second interconnection structure IIC2 (defined by an opening in the photoresist 1055) may be located on the first side S1 and the third side S3.

Figure 32A:
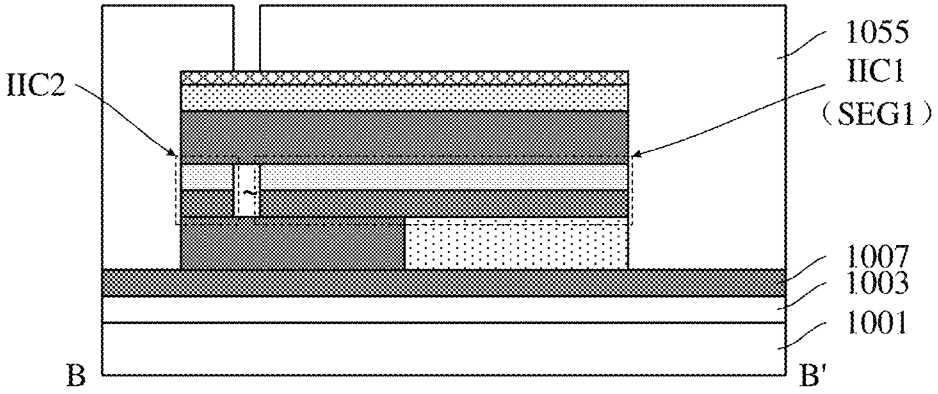
Figure 32B:
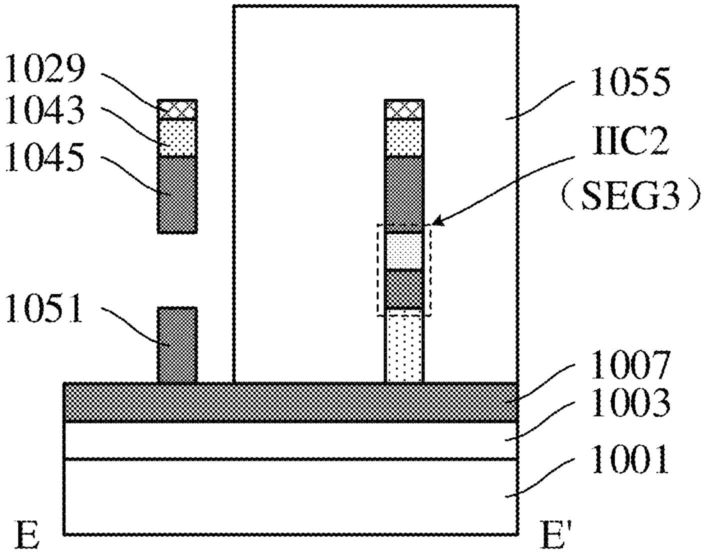
Figure 32C:
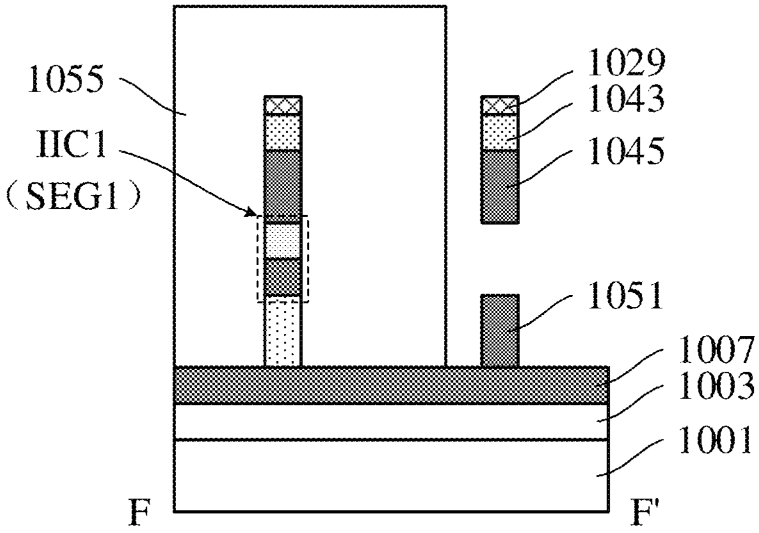

Then, as shown in FIG. 32(*a*), FIG. 32(*b*) and FIG. 32(*c*) (which are respectively a cross-sectional view taken along line BB', a cross-sectional view taken along EE', and a cross-sectional view taken along FF'), with the photoresist 1055 as an etching mask, a selective etching, such as ALE, may be performed on the first source/drain layer 1013 for the n-type transistors and the second source/drain layer 1011 for the p-type transistors, so as to cut off the first source/drain layer 1013 for the n-type transistors and the second source/drain layer 1011 for the p-type transistors. Therefore, the first source/drain layer 1013 for the n-type transistors and the second source/drain layer 1011 for the p-type transistors may be separated into the first interconnection structure IIC1 and the second interconnection structure IIC2.

The first interconnection structure IIC1 may include a protruding portion (on the first segment SEG1) defined by the protruding pattern. More specifically, the first segment SEG1 may include a first protruding portion PR1 and a second protruding portion PR2. The first protruding portion PR1 is used as the upper source/drain layer (referring to S/D4_U in FIG. 3(*a*)) of the first pull-up transistor PU-1 and the lower source/drain layer (referring to S/D3_L in FIG. 3(*a*)) of the first pull-down transistor PD-1. The second protruding portion PR2 is used as the lower source/drain layer (referring to S/D6_L in FIG. 3(*a*)) of the first pass gate transistor PG-1.

Similarly, the second interconnection structure IIC2 may include a protruding portion (on the third segment SEG3) defined by the protruding pattern. More specifically, the third segment SEG3 may include a third protruding portion PR3 and a fourth protruding portion PR4. The third protruding portion PR3 is used as the upper source/drain layer (referring to S/D2_U in FIG. 3(*c*)) of the second pull-up transistor PU-2 and the lower source/drain layer (referring to S/D1_L in FIG. 3(*b*)) of the second pull-down transistor PD-2. The fourth protruding portion PR4 is used as the lower source/drain layer (referring to S/D5_L in FIG. 3(*b*)) of the second pass gate transistor PG-2.

Figure 33A:
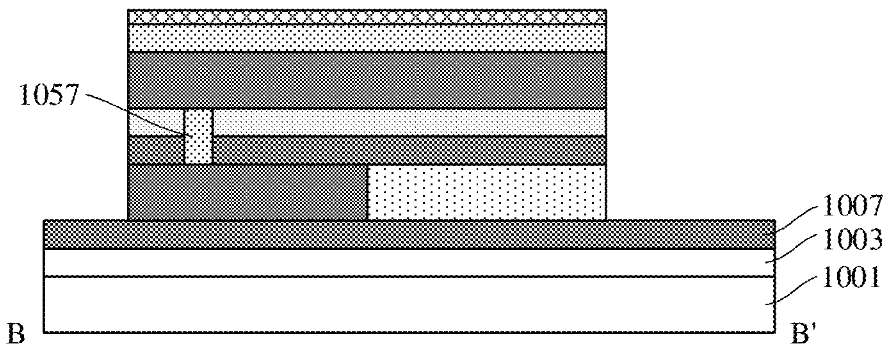
Figure 33B:
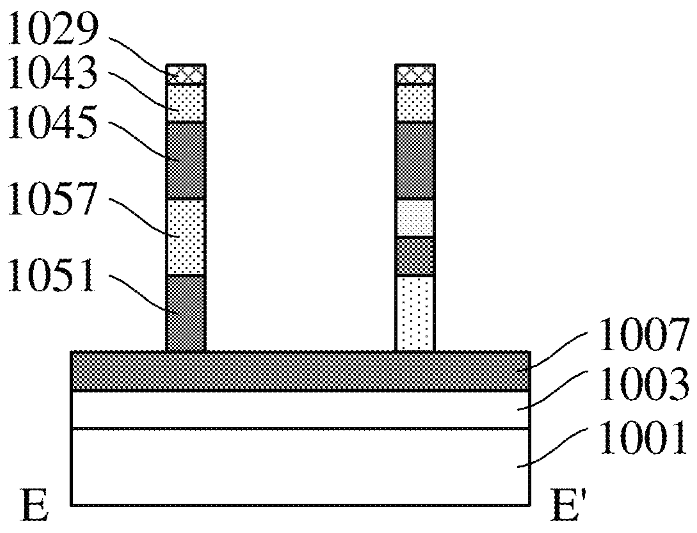
Figure 33C:
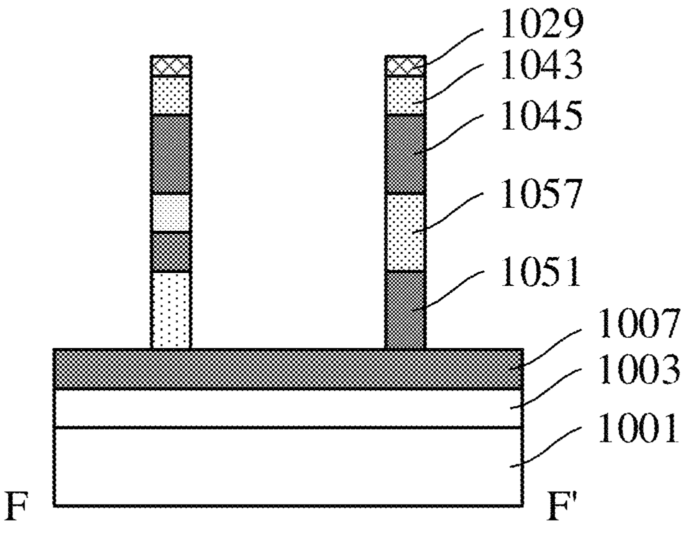

An occupying layer may be formed in a gap formed under the hard mask due to the etching described above. For example, as shown in FIG. 33(*a*), FIG. 33(*b*) and FIG. 33(*c*) (which are respectively a cross-sectional view taken along line BB', a cross-sectional view taken along line EE', and a cross-sectional view taken along line FF'), an occupying layer 1057 may be formed by depositing, for example, a nitride, and etching back the deposited nitride by, for example, RIE in vertical direction. Therefore, the occupying layer 1057 may be formed between the first interconnection structure IIC1 and the second interconnection structure IIC2 on the first side S1 and between the first interconnection structure IIC1 and the second interconnection structure IIC2 on the third side S3. Here, a reason for selecting the nitride is that the nitride may have an etching selectivity with respect to the previously formed sacrificial gate, and may have the same etching selectivity as the occupying layer 1043.

Figure 34A:
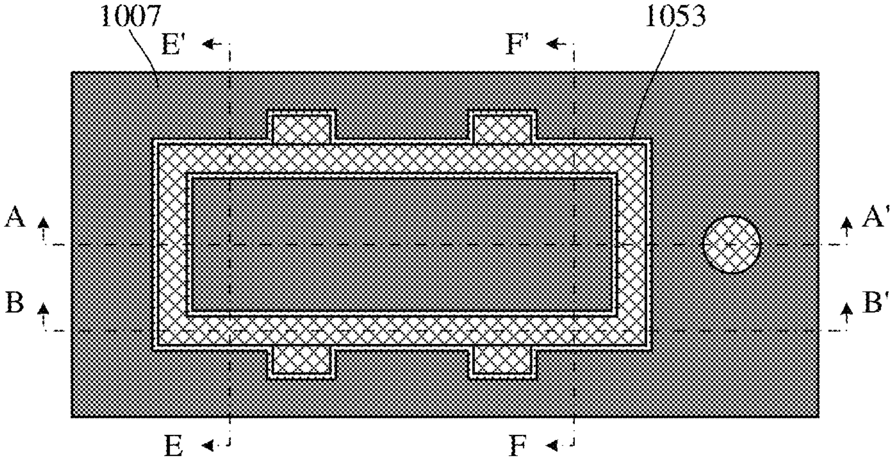
Figure 34B:
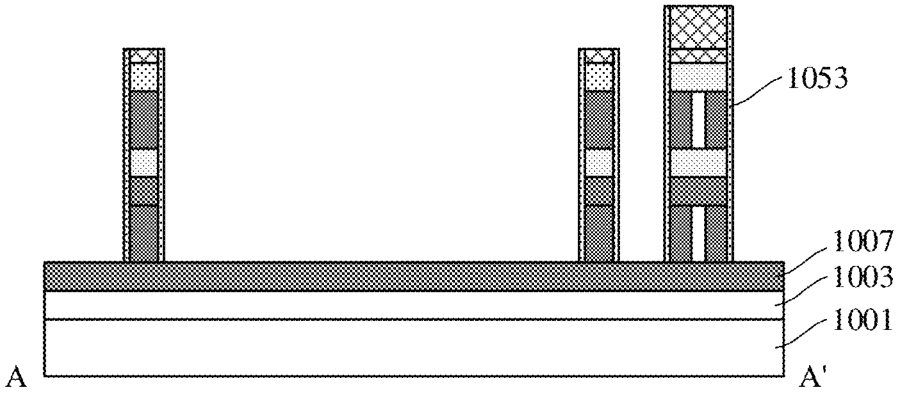
Figure 34C:
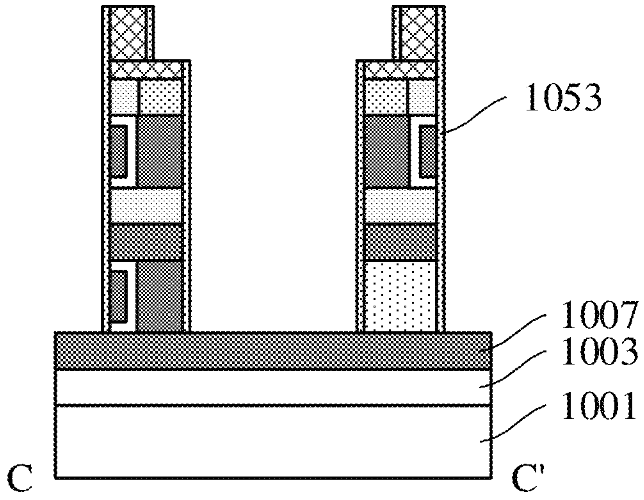

In addition, in order to avoid affecting the interconnection structures (the first source/drain layer 1013 for the n-type transistors and the second source/drain layer 1011 for the p-type transistors) in the following process of patterning the first source/drain layer 1007 for the p-type transistors, it is possible to form a protective layer on the sidewall of the obtained structure. For example, as shown in FIG. 34(*a*), FIG. 34(*b*) and FIG. 34(*c*) (which are respectively a top view, a cross-sectional view taken along line AA', and a cross-sectional view taken along line CC'), a protective layer 1053 may be formed on the sidewall of the obtained structure by a spacer formation process. The protective layer 1053 may contain a material having a desired etching selectivity (for example, with respect to the first source/drain layer 1007, etc.), such as a nitride.

Figure 35A:
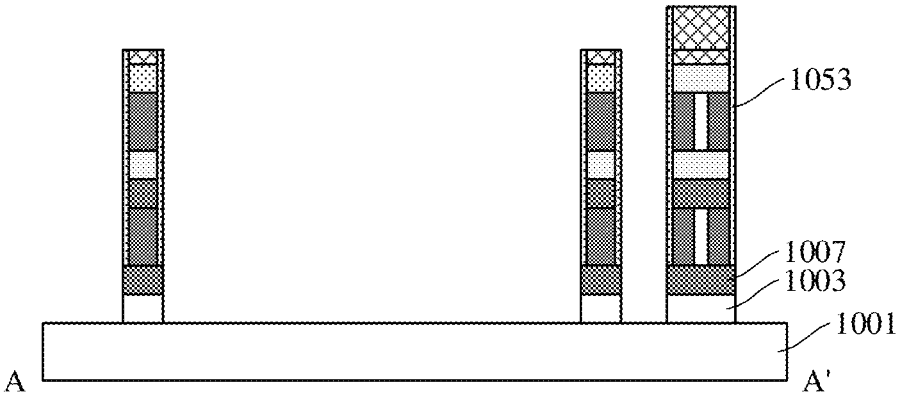
Figure 35B:
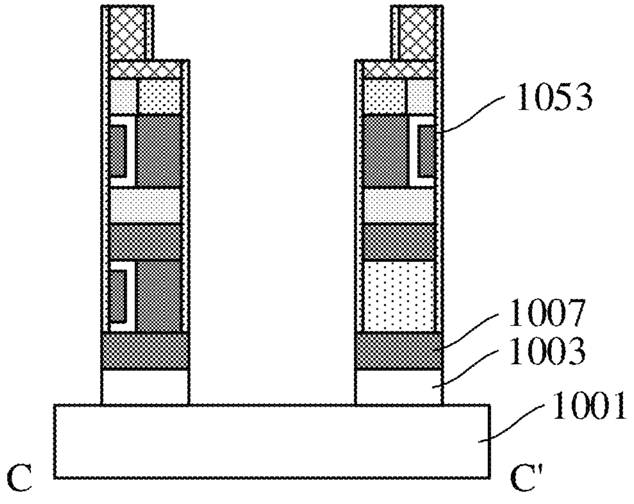
Figure 35C:
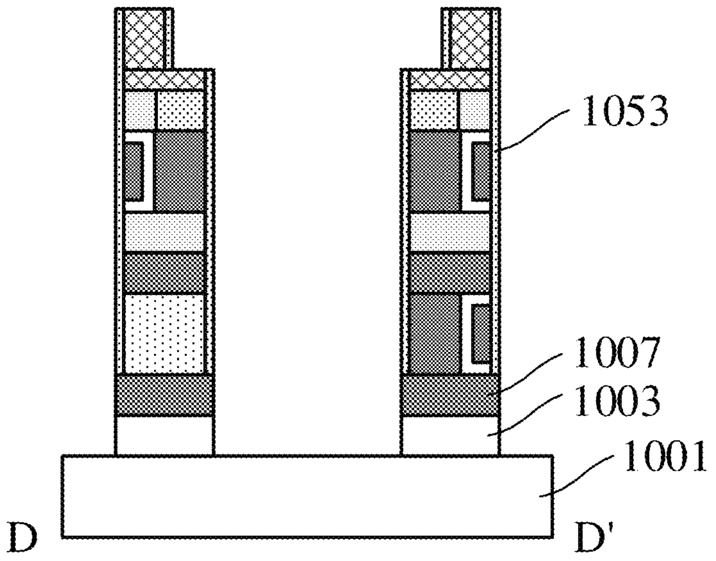

After that, the first source/drain layer 1007 may be patterned. For example, as shown in FIG. 35(*a*), FIG. 35(*b*) and FIG. 35(*c*) (which are respectively a cross-sectional view taken along line AA', a cross-sectional view taken along line CC', and a cross-sectional view taken along line DD'), with the hard mask as an etching mask, an anisotropic etching may be performed on the first source/drain layer 1007 by, for example, RIE in vertical direction. Here, the anisotropic etching may also be performed on the contact layer 1003 together. The etching may stop at the substrate 1001. Accordingly, the first source/drain layer 1007 and the contact layer 1003 may be formed as a rectangular ring pattern with a protruding pattern on the outer side defined by the hard mask.

Figure 36A:
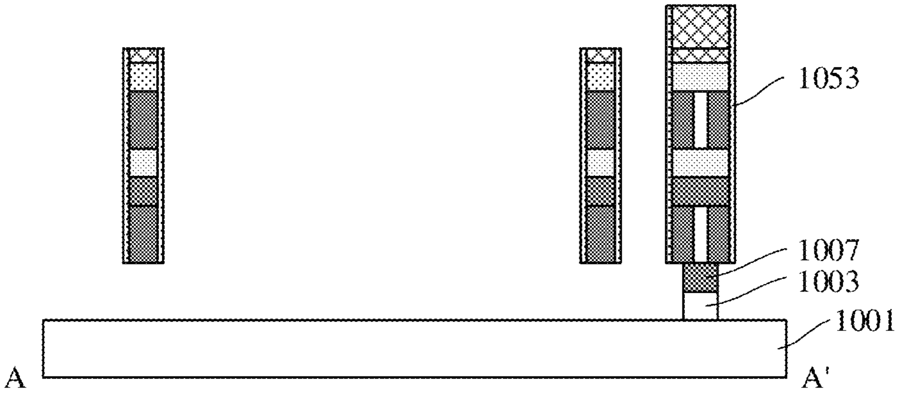
Figure 36B:
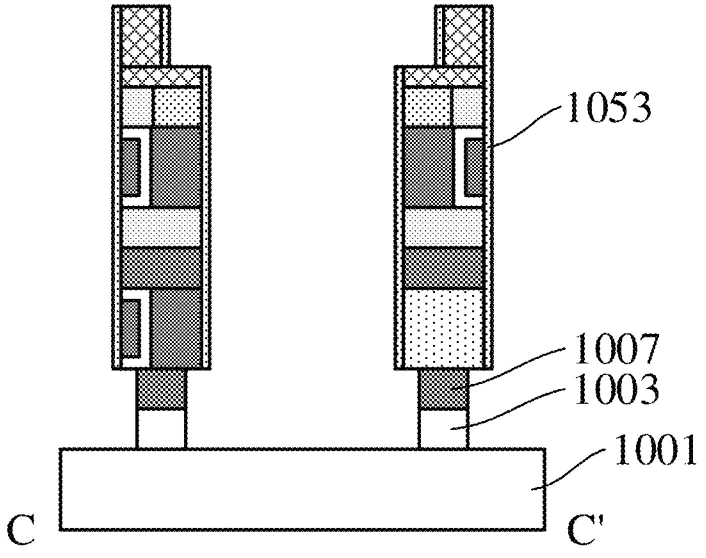
Figure 36C:
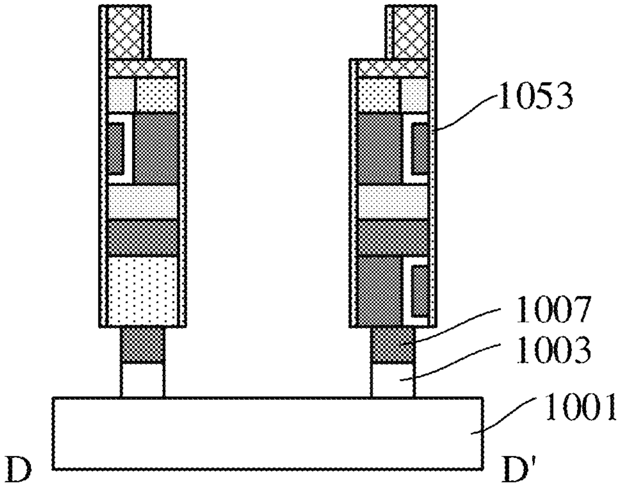

As described above with reference to FIG. 20(*a*), FIG. 20(*b*) and FIG. 20(*c*), the first source/drain layer 1007 may be separated into portions corresponding to the transistors. For example, as shown in FIG. 36(*a*), FIG. 36(*b*) and FIG. 36(*c*) (which are respectively a cross-sectional view taken along line AA', a cross-sectional view taken along line CC', and a cross-sectional view taken along line DD'), a further selective etching, such as a wet etching, may be performed on the first source/drain layer 1007, so that the first source/drain layer 1007 is separated into, for example, four portions corresponding to the four protruding patterns. Unlike the separation of the second source/drain layer 1017 for the n-type transistors as described above with reference to FIG. 20(*a*), FIG. 20(*b*) and FIG. 20(*c*) (as described above, the etching is performed from the inner side), the etching may be performed from both inner and outer sides of the first source/drain layer 1007. An etching depth may be controlled to be, for example, slightly greater than half of the line width of the spacer 1023, so that a portion of the first source/drain layer 1007 that overlaps with the circular pattern in the vertical direction may be completely removed, while a portion of the first source/drain layer 1007 that overlaps with the protruding pattern in the vertical direction may be (at least partially) retained. ALE may be adopted to better control the etching depth.

Although the four portions obtained by separating the second source/drain layer 1017 for the n-type transistors (as described above, etched from the inner side) may not overlap completely with the four portions obtained by separating the first source/drain layer 1007 for the p-type transistors (as described above, etched from both inner and outer sides) in the vertical direction due to different etching conditions, they may be self-aligned with each other, because their positions are all defined based on the protruding patterns of the hard mask.

Here, the contact layer 1003 is used to facilitate a contact between the substrate and the source/drain layer separated from the first source/drain layer 1007. Therefore, the contact layer 1003 may be processed similarly. The four portions obtained by separating the contact layer 1003 may be respectively self-aligned with the four portions obtained by separating the first source/drain layer 1007, and may substantially overlap completely with the four portions obtained by separating the first source/drain layer 1007 in the vertical direction.

So far, a layout definition of the SRAM cell (including transistors and interconnection structures) has been substantially completed. Then, a replacement gate process may be performed to complete the production of transistors, and interconnections between these transistors may be formed to complete the production of the SRAM cell.

To enhance contact and/or reduce resistance, a silicification may be performed on the source/drain layers.

Figure 37A:
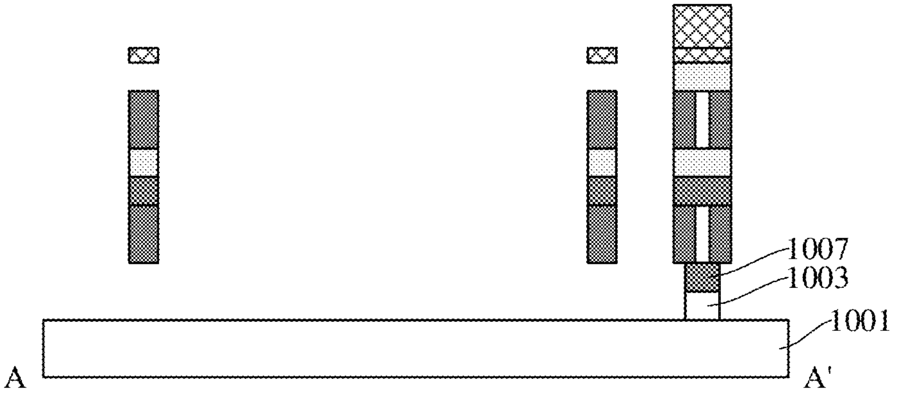
Figure 37B:
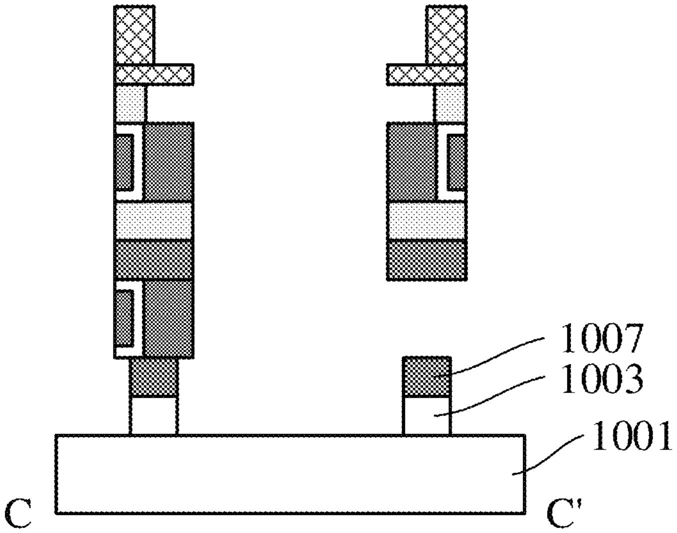
Figure 37C:
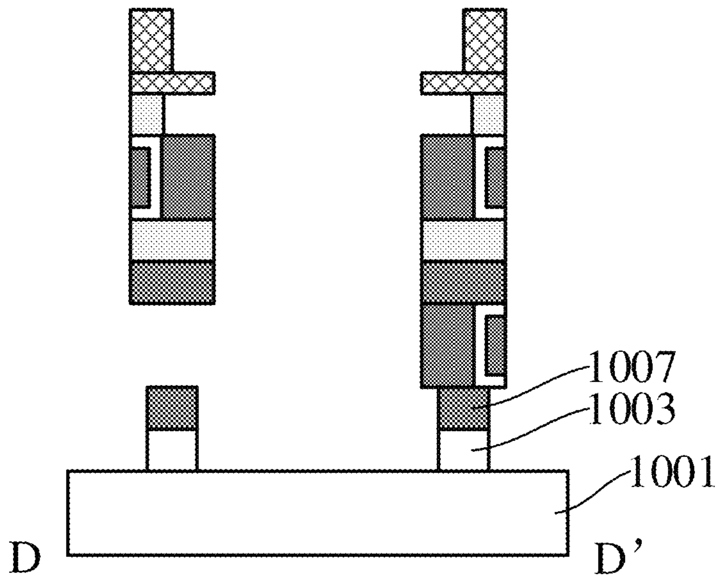
Figure 38A:
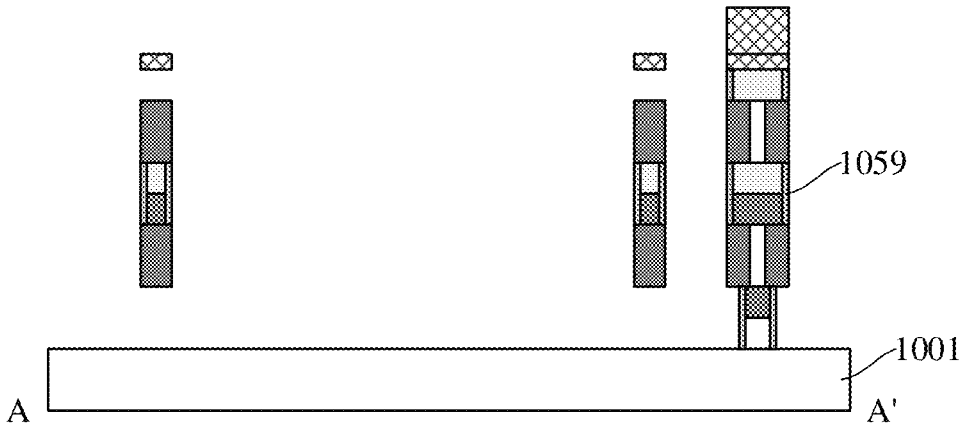
Figure 38B:
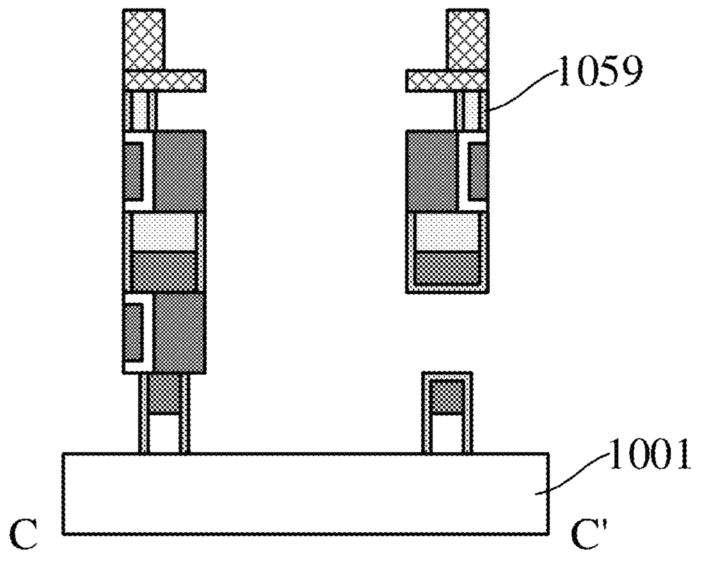
Figure 38C:
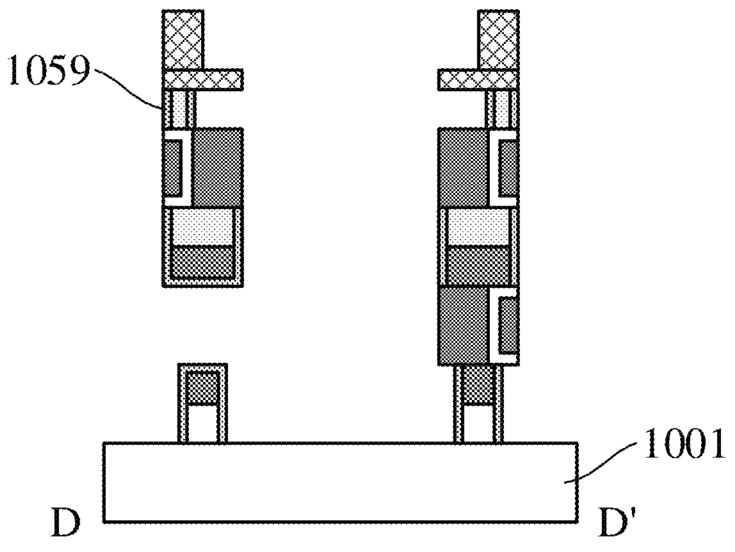

For example, as shown in FIG. 37(*a*), FIG. 37(*b*) and FIG. 37(*c*) (which are respectively a cross-sectional view taken along line AA', a cross-sectional view taken along CC', and a cross-sectional view taken along line DD'), a selective etching, such as a wet etching with hot phosphoric acid, may be performed to remove the protective layer 1053 (which is nitride in this example), and remove the occupying layers 1043, 1057 (which are nitrides in this example) and 1047 (which is an oxide in this example) except for the sacrificial gate in the obtained structure, so as to fully expose each source/drain layer (with the channel layer, especially the vertical extension portion of the channel layer being surrounded by the sacrificial gate). A silicification may be performed to at least partially or even completely silicify each exposed source/drain layer, thereby forming a silicide layer 1059, as shown in FIG. 38(*a*), FIG. 38(*b*) and FIG. 38(*c*) (which are respectively a cross-sectional view taken along line AA', a cross-sectional view taken along line CC', and a cross-sectional view taken along line DD'). The silicification may include, for example, depositing a metal such as NiPt alloy, and performing a heat treat at a temperature of, for example, about 200 to 600 °C, so that the deposited metal reacts with a semiconductor element such as Si and/or Ge in the source/drain layer to form a compound of metal and semiconductor element, such as silicide, germanide, or silicon germanide (hereinafter referred to as silicide). After that, an unreacted excess metal may be removed.

It should be noted that although the silicide layer 1059 is shown here as a thin layer, some sites may be completely converted into silicide according to a size of the site where the silicification reaction occurs and a time length of the silicification reaction.

Figure 39A:
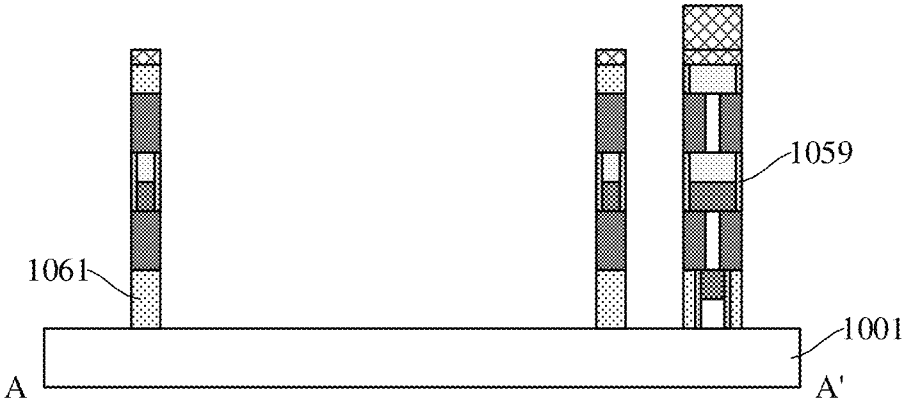
Figure 39B:
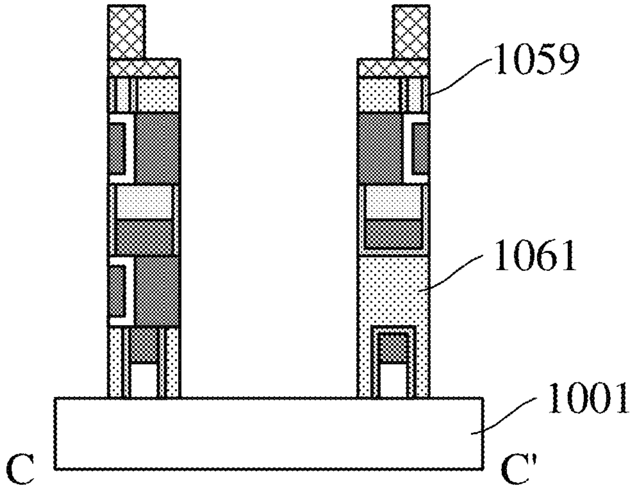
Figure 39C:
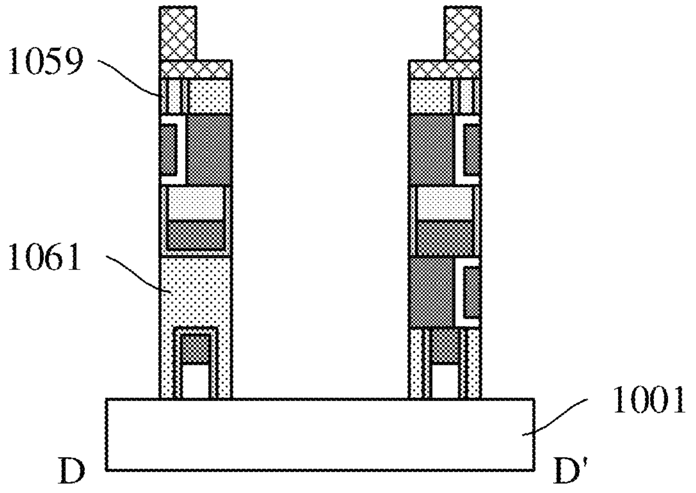

To help form a self-aligned gate stack, an occupying layer may be re-formed in a gap under the hard mask. For example, as shown in FIG. 39(*a*), FIG. 39(*b*) and FIG. 39(*c*) (which are respectively a cross-sectional view taken along line AA', a cross-sectional view taken along line CC', and a cross-sectional view taken along line DD'), an occupying layer 1061 may be re-formed by depositing a nitride, and performing an anisotropic etching, such as RIE in vertical direction, on the deposited nitride. The occupying layer 1061 may occupy the positions of the previously removed occupying layers 1043, 1047 and 1057. Here, a reason for selecting the nitride is that the nitride has an etching selectivity with respect to the sacrificial gate and the hard mask.

Next, a replacement gate process may be performed.

Figure 40A:
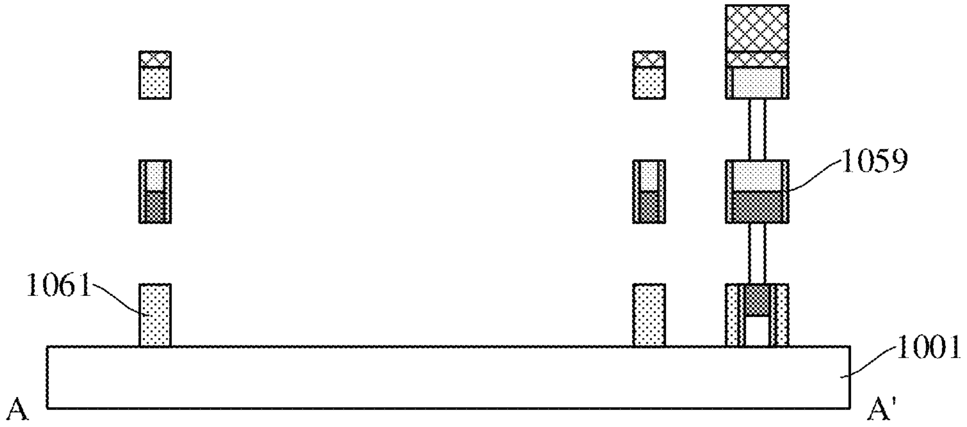
Figure 40B:
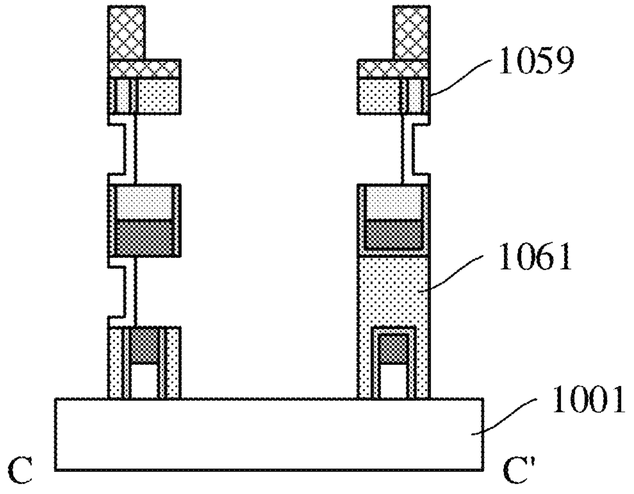
Figure 40C:
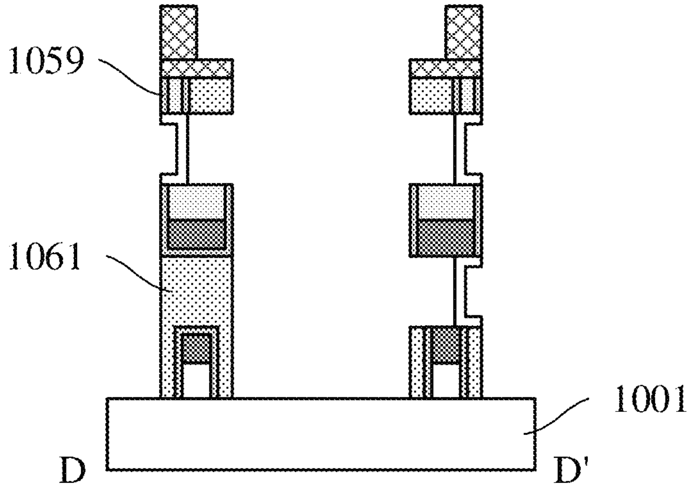
Figure 41A:
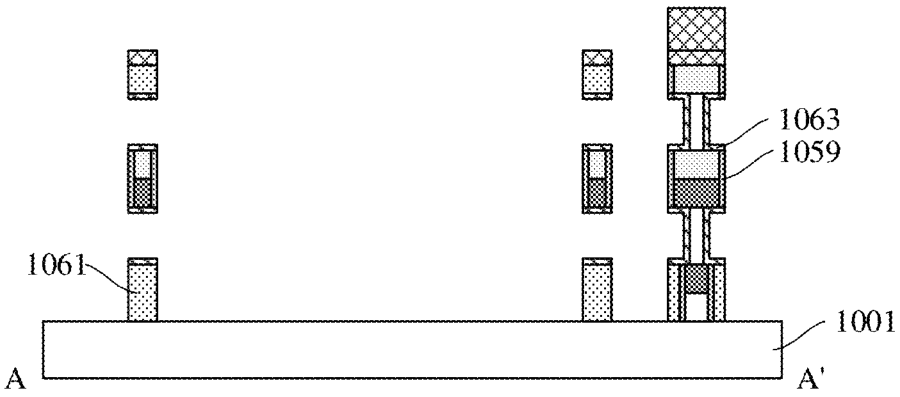
Figure 41B:
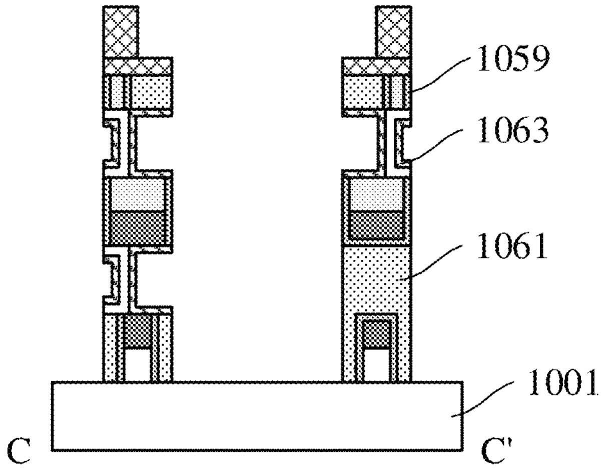
Figure 41C:
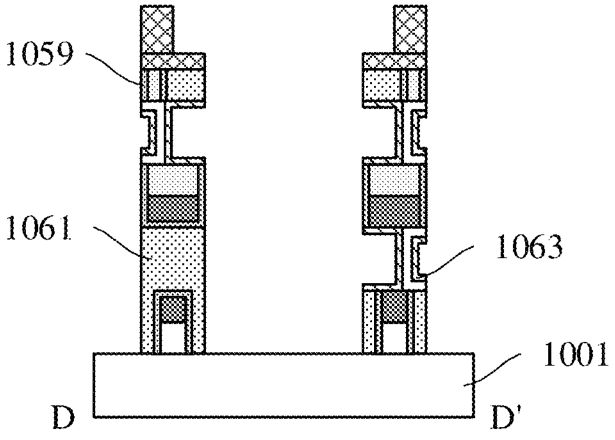
Figure 42A:
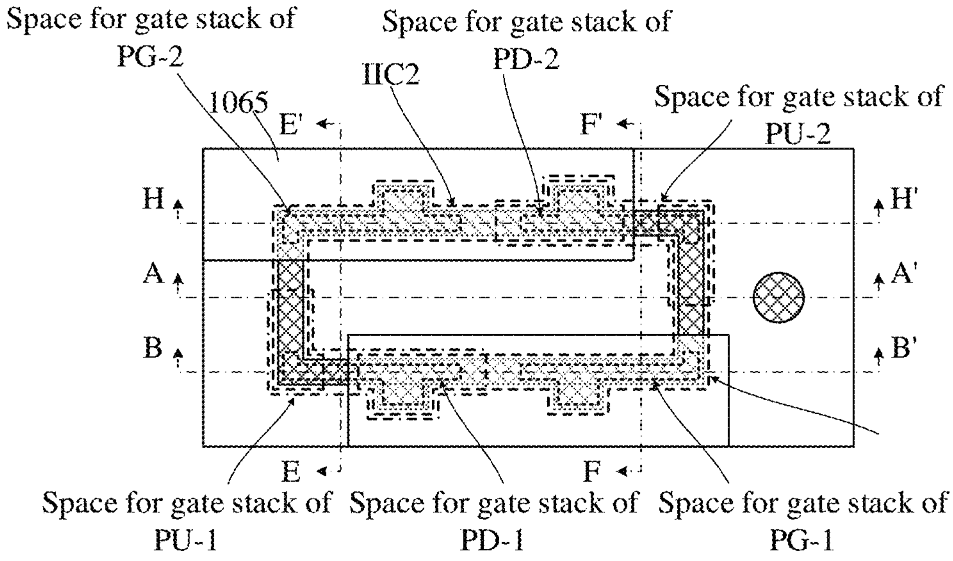
Figure 42B:
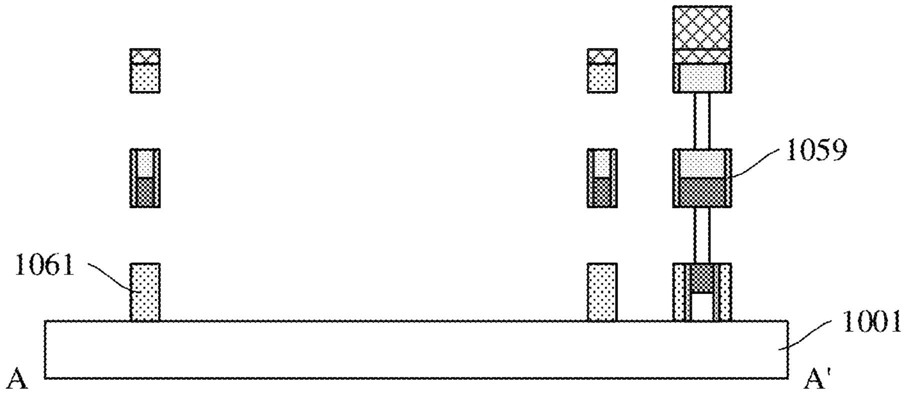
Figure 42C:
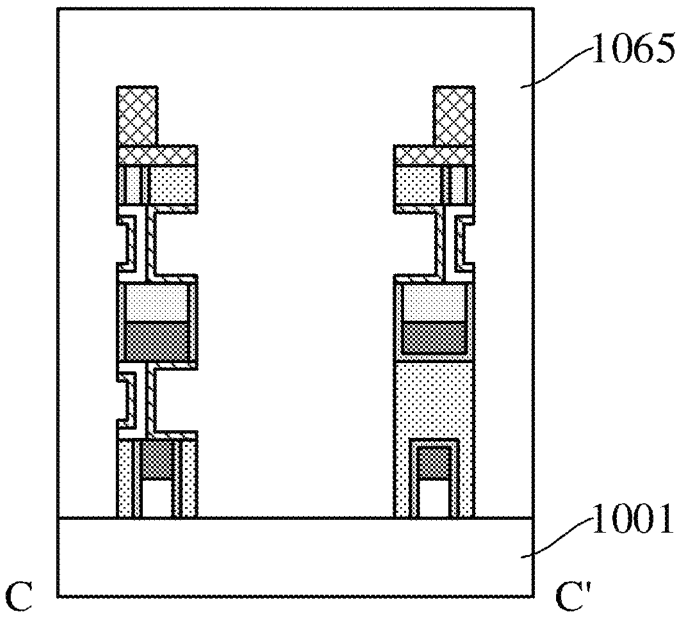
Figure 42D:
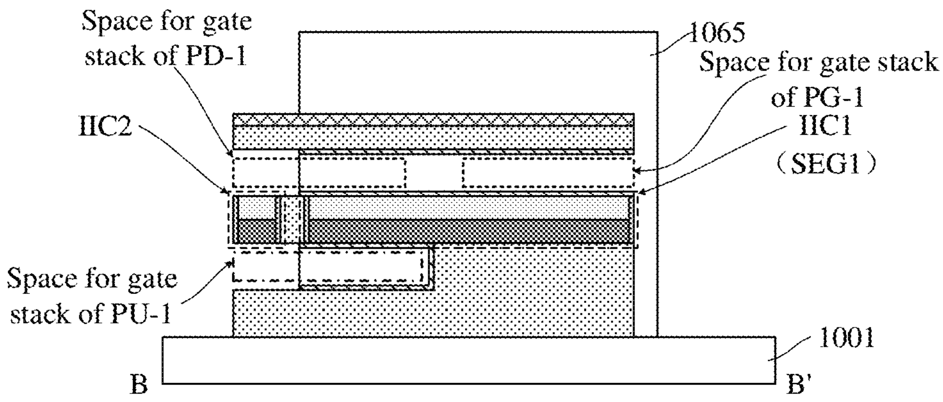
Figure 42E:
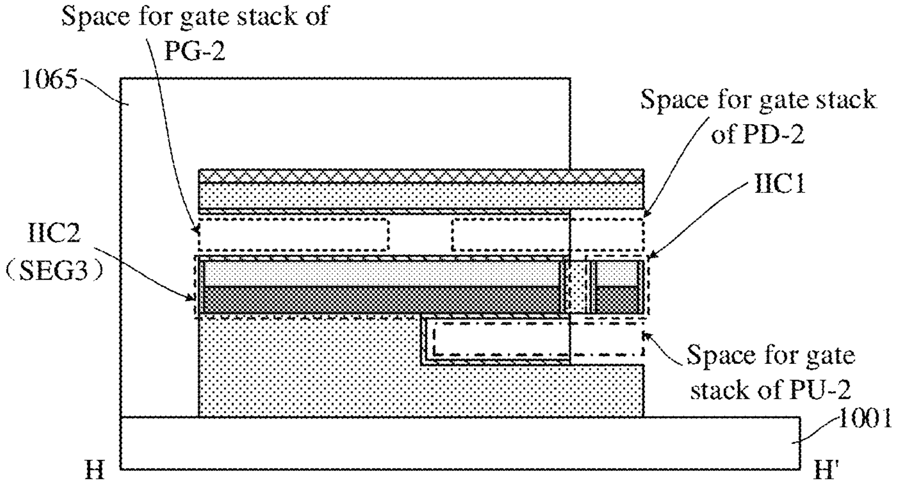
Figure 43A:
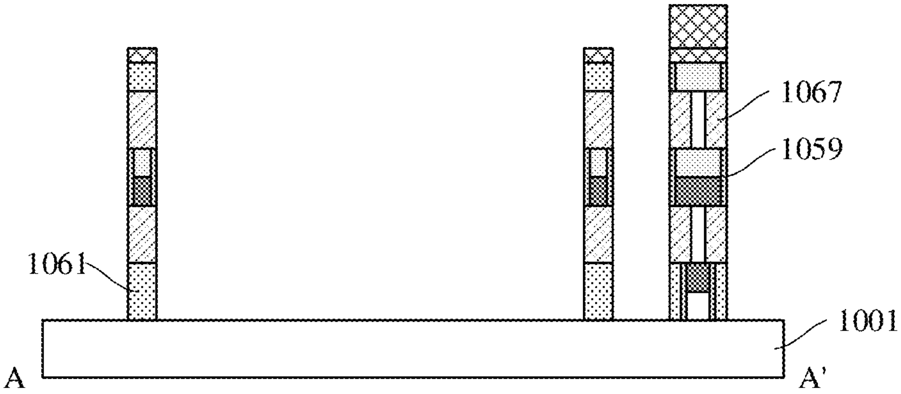
Figure 43B:
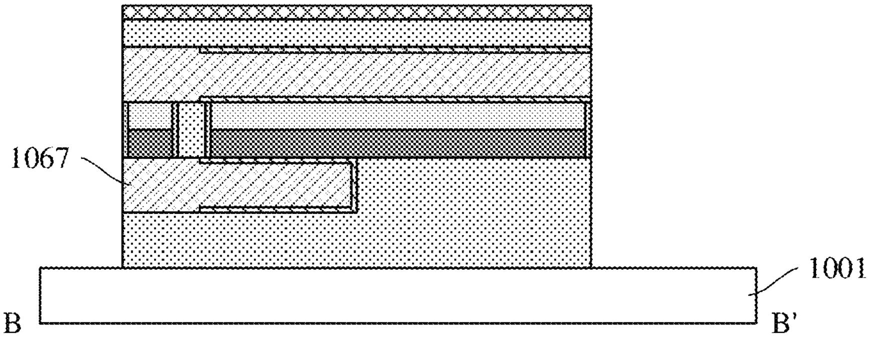
Figure 43C:
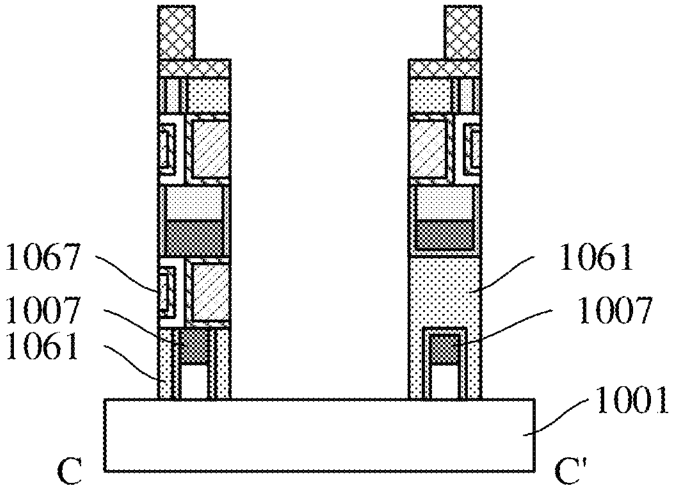
Figure 43D:
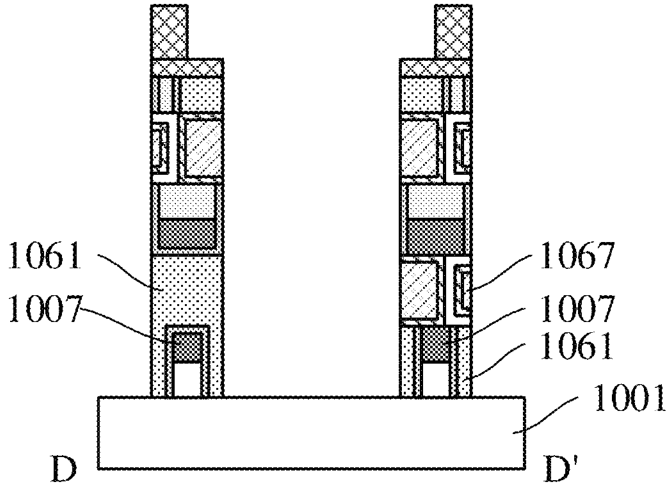

For example, as shown in FIG. 40(*a*), FIG. 40(*b*) and FIG. 40(*c*) (which are respectively a cross-sectional view taken along line AA', a cross-sectional view taken along line CC', and a cross-sectional view taken along line DD'), the sacrificial gates 1005, 1045 and 1051 may be removed by a selective etching. Thus, the channel layer 1039 may be exposed. In addition, at the column structure corresponding to the circular pattern, the channel defining layer may be exposed. Then, as shown in FIG. 41(*a*), FIG. 41(*b*) and FIG. 41(*c*) (which are respectively a cross-sectional view taken along line AA', a cross-sectional view taken along line CC', and a cross-sectional view taken along line DD'), a gate dielectric layer 1063 may be formed on a surface of the channel layer by deposition, such as an atomic layer deposition (ALD). The gate dielectric layer 1063 may be formed in a substantially conformal manner. The gate dielectric layer 1063 may contain a suitable dielectric, for example, a high-k dielectric such as $HfO_2$, with a thickness in a range of about 0.5 to 4 nm.

It should be noted that the gate dielectric layer 1063 may have a portion extending on a vertical sidewall of the structure, a portion extending on a top surface of the hard mask, a portion extending on the surface of the substrate, etc. These portions do not affect the progress of subsequent processes, and are not shown for clarity.

However, the gate dielectric layer is thus formed on the surface of the first interconnection structure and the surface of the second interconnection structure, which may hinder an electrical connection between the first and second interconnection structures and the subsequently formed gate electrode layer. Therefore, the gate dielectric layer on the surfaces of the first and second interconnection structures (and optionally, the channel defining layer at the column structure) may be removed. For example, as shown in FIG. 42(*a*), FIG. 42(*b*), FIG. 42(*c*), FIG. 42(*d*) and FIG. 42(*e*) (which are respectively a top view, a cross-sectional view taken along line AA', a cross-sectional view taken along line CC', a cross-sectional view taken along line BB', and a cross-sectional view taken along line HH'), a photoresist 1065 may be formed on the obtained structure. The photoresist 1065 may be patterned to expose a region where the gate dielectric layer needs to be removed, while covering a region where the gate dielectric layer needs to be retained.

In the top view of FIG. 42(*a*), the space for the gate stack and the interconnection structures are shown in the form of dashed lines, dotted lines, etc. In the figure, for clarity, the space for the gate stack and the interconnection structures shown slightly increase or decrease relative to the hard mask pattern (in fact, the space used for the gate stack as described above is defined by the hard mask pattern, and therefore may overlap with the hard mask pattern in the top view). For the interconnection structures IIC1 and IIC2, reference may be made to the description above, especially that with reference to FIG. 31(*a*); for the space used for the gate stacks of the pull-up transistors PU-1 and PU-2, reference may be made to the description above, especially that with reference to FIG. 29(*a*). In addition, for the space used for the gate stacks of the pull-down transistors PD-1 and PD-2 and for the gate stacks of the pass gate transistors PG-1 and PG-2, reference may be made to the following description, especially that with reference to FIG. 46(*a*).

As described above, the gate stack of the first pull-up transistor PU-1 and the gate stack of the first pull-down transistor PD-1 may be electrically connected to each other and may be together electrically connected to the second interconnection structure IIC2. Therefore, in a region where the space for the gate stack of the first pull-up transistor PU-1, the space for the gate stack of the first pull-down transistor PD-1, and the second interconnection structure IIC2 overlap with each other in the vertical direction (a lower left corner region of the ring-shaped pattern), the gate dielectric layer 1063 (especially the portion on the upper and lower surfaces of the second interconnection structure IIC2) may be exposed by the photoresist 1065 so that it may be subsequently removed.

Similarly, the gate stack of the second pull-up transistor PU-2 and the gate stack of the second pull-down transistor PD-2 may be electrically connected to each other and may be together electrically connected to the first interconnection structure IIC1. Therefore, in a region where the space for the gate stack of the second pull-up transistor PU-2, the space for the gate stack of the second pull-down transistor PD-2, and the first interconnection structure IIC1 overlap with each other in the vertical direction (an upper right corner region of the ring-shaped pattern), the gate dielectric layer 1063 (especially the portion on the upper and lower surfaces of the first interconnection structure IIC1) may be exposed by the photoresist 1065 so that it may be subsequently removed.

In addition, in a region where the space for the gate stack of the first pull-up transistor PU-1, the space for the gate stack of the first pull-down transistor PD-1, and the first interconnection structure IIC1 overlap with each other in the vertical direction and in a region where the space for the gate stack of the first pass gate transistor PG-1 and the first interconnection structure IIC1 overlap with each other in the vertical direction (mainly on the first side S1 of the ring-shaped pattern), the gate dielectric layer 1063 (especially the portion on the upper and lower surfaces of the first interconnection structure IIC1) may be covered by the photoresist 1065 so that it may be retained later, so as to ensure that the first interconnection structure IIC1 is electrically isolated from the gate stack of the first pull-up transistor PU-1, the gate stack of the first pull-down transistor PD-1, and the gate stack of the first pass gate transistor PG-1.

Similarly, in a region where the space for the gate stack of the second pull-up transistor PU-2, the space for the gate stack of the second pull-down transistor PD-2, and the second interconnection structure IIC2 overlap with each other in the vertical direction and in a region where the space for the gate stack of the second pass gate transistor PG-2 and the second interconnection structure IIC2 overlap with each other in the vertical direction (mainly on the third side S3 of the ring-shaped pattern), the gate dielectric layer 1063 (especially the portion on the upper and lower surfaces of the second interconnection structure IIC2) may be covered by the photoresist 1065, so that it may be retained later, so as to ensure that the second interconnection structure IIC2 is electrically isolated from the gate stack of the second pull-up transistor PU-2, the gate stack of the second pull-down transistor PD-2, and the gate stack of the second pass gate transistor PG-2.

With the photoresist 1065 as an etching mask, a selective etching may be performed on the gate dielectric layer 1063 to remove an exposed portion of the gate dielectric layer 1063. After that, the photoresist 1065 may be removed.

As shown in the cross-sectional view of FIG. 42(*d*), in the region corresponding to the lower left corner of the top view of FIG. 42(*a*) (exposed by the photoresist 1065), i.e., in the left region in the cross-sectional view taken along line BB' in FIG. 42(*d*), the gate dielectric layer on the upper and lower surfaces of the second interconnection structure IIC2 may be removed, and the second interconnection structure IIC2 may be therefore in contact with the gate electrode layer in the gate stacks (the gate stack of the first pull-up transistor PU-1 below and the gate stack of the first pull-down transistor PD-1 above) subsequently formed in the corresponding gate stack spaces, so as to form an electrical connection. In addition, on the first segment SEG1, the gate dielectric layer on the upper and lower surfaces of the first interconnection structure IIC1 may be covered by the photoresist 1065 and thus retained, and may be therefore electrically isolated from the gate electrode layer in the gate stacks (the gate stack of the first pull-up transistor PU-1 below, the gate stack of the first pull-down transistor PD-1 above, and the gate stack of the first pass gate transistor PG-1 above) subsequently formed in the corresponding gate stack spaces.

Similarly, as shown in the cross-sectional view of FIG. 42(*e*), in the region corresponding to the upper right corner of the top view of FIG. 42(*a*) (exposed by the photoresist 1065), i.e., in the right region of the cross-sectional view taken along line HH' in FIG. 42(*e*), the gate dielectric layer on the upper and lower surfaces of the first interconnection structure IIC1 may be removed, and the first interconnection structure IIC1 may be therefore in contact with the gate electrode layer in the gate stacks (the gate stack of the second pull-up transistor PU-2 below and the gate stack of the second pull-down transistor PD-2 above) subsequently formed in the corresponding gate stack spaces. In addition, on the third segment SEG3, the gate dielectric layer on the upper and lower surfaces of the second interconnection structure IIC2 may be covered by the photoresist 1065 and thus retained, and may be therefore electrically isolated from the gate electrode layer in the gate stacks (the gate stack of the second pull-up transistor PU-2 below, the gate stack of the second pull-down transistor PD-2 above, and the gate stack of the second pass gate transistor PG-2 above) subsequently formed in the corresponding gate stack spaces.

On the first segment SEG1 and the third segment SEG3, the gate dielectric layer may extend onto the occupying layer 1057 to ensure a valid electrical isolation.

After the gate dielectric layer 1063 is patterned, a gate electrode layer may be formed. For example, as shown in FIG. 43(*a*), FIG. 43(*b*), FIG. 43(*c*) and FIG. 43(*d*) (which are respectively a cross-sectional view taken along line AA', a cross-sectional view taken along line BB', a cross-sectional view taken along line CC' and a cross-sectional view taken along line DD'), a gate electrode layer 1067 may be formed in a gap under the hard mask (the space where the sacrificial gate was originally located) by deposition and then etching back. For example, the gate electrode layer 1067 may include a work function layer and a conductive filling layer. For example, for the p-type transistors, the work function layer may contain TiN, TiN, or a combination thereof, with a thickness in a range of about 1 to 7 nm; the conductive filling layer may contain W and/or Ti, with a thickness sufficient to fill the gap under the hard mask.

For a further improvement of performance, different gate electrode layers, such as gate electrode layers with different effective work functions may be formed for the p-type transistors and the n-type transistors. For example, the gate electrode layer 1067 formed as above, especially the work function layer therein, may be specific to the p-type transistors. Then, a gate electrode layer may be formed for the upper n-type transistors. For example, it is possible to remove the gate electrode layer 1067 formed in the upper layer, and additionally form a gate electrode layer for the n-type transistors.

Figure 44:
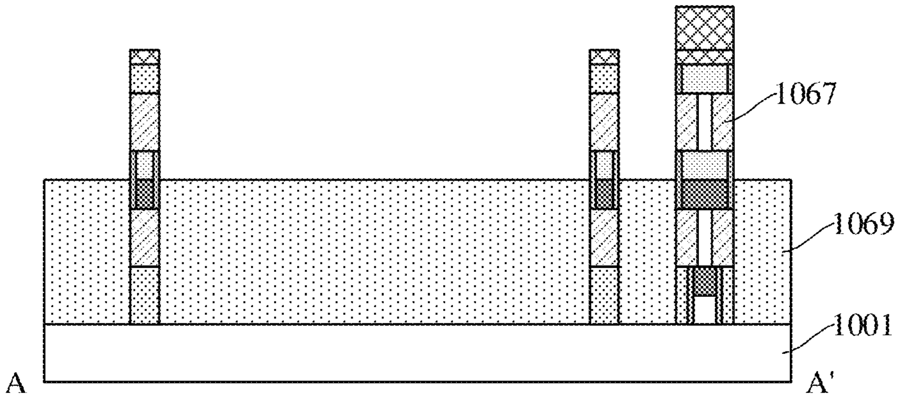
Figure 45A:
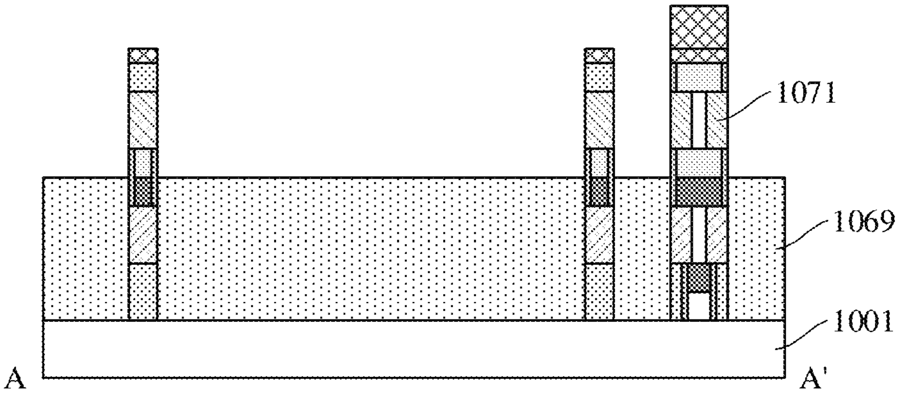
Figure 45B:
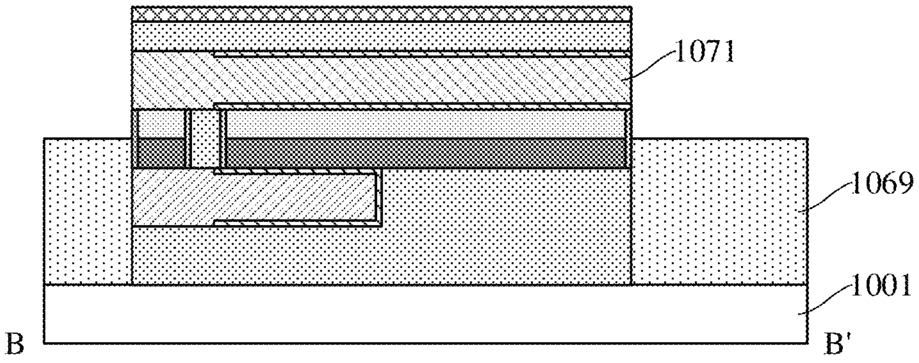
Figure 45C:
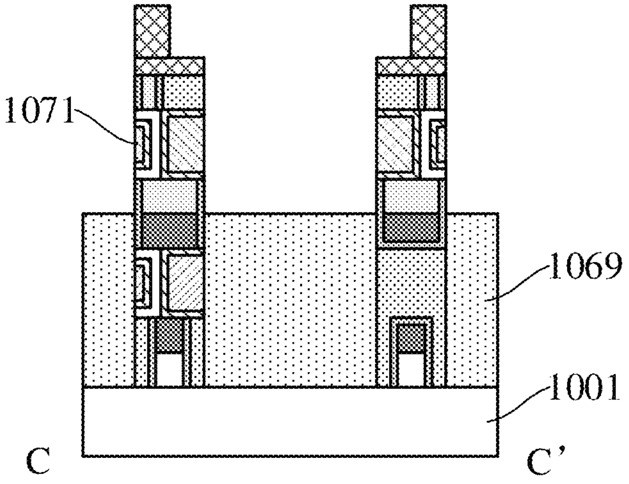
Figure 45D:
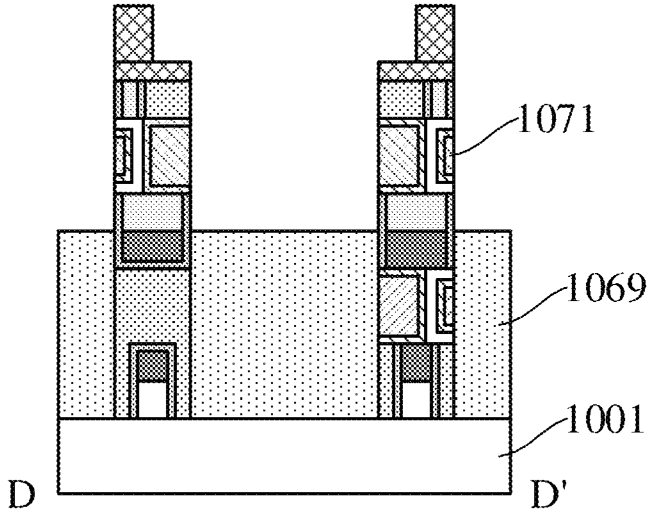

To avoid affecting the lower gate electrode layer 1067, it is possible to shield the lower gate electrode layer 1067. For example, as shown in FIG. 44 (which is a cross-sectional view taken along line AA'), a shielding layer 1069 may be formed on the obtained structure by depositing an oxide and then etching back the deposited oxide. Here, a main reason for selecting the oxide is the etching selectivity with respect to the hard mask. Before the etching back, a planarization such as CMP may be performed on the deposited oxide. To fully shield the lower layer and expose the upper layer, after the etching back, a top surface of the shielding layer 1069 may be located between the upper layer and the lower layer, for example, at or near an interface between the first source/drain layer 1013 for the n-type transistors and the second source/drain layer 1011 for the p-type transistors. After that, as shown in FIG. 45(*a*), FIG. 45(*b*), FIG. 45(*c*) and FIG. 45(*d*) (which are respectively a cross-sectional view taken along line AA', a cross-sectional view taken along line BB', a cross-sectional view taken along line CC', and a cross-sectional view taken along line DD'), the upper gate electrode layer 1067 may be removed by a selective etching, and a gate electrode layer 1071 for the n-type transistors may be formed in the upper layer in the same way as forming the gate electrode layer 1067. For example, the gate electrode layer 1071 may include a work function layer and a conductive filling layer. For example, for the n-type transistors, the work function layer may contain TiN, TiNa, TiAlC or a combination thereof, with a thickness in a range of about 1 to 7 nm; the conductive filling layer may contain W and/or Ti, with a thickness sufficient to fill the gap under the hard mask.

Figure 46A:
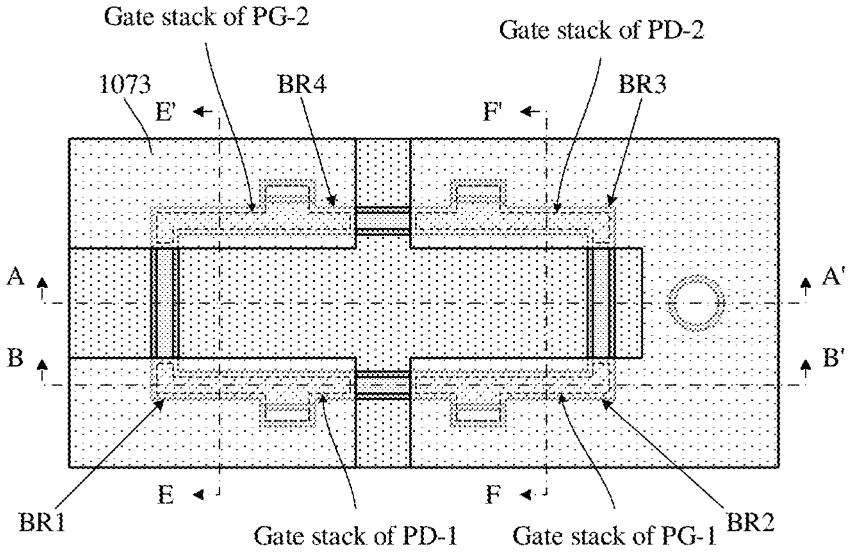
Figure 46B:
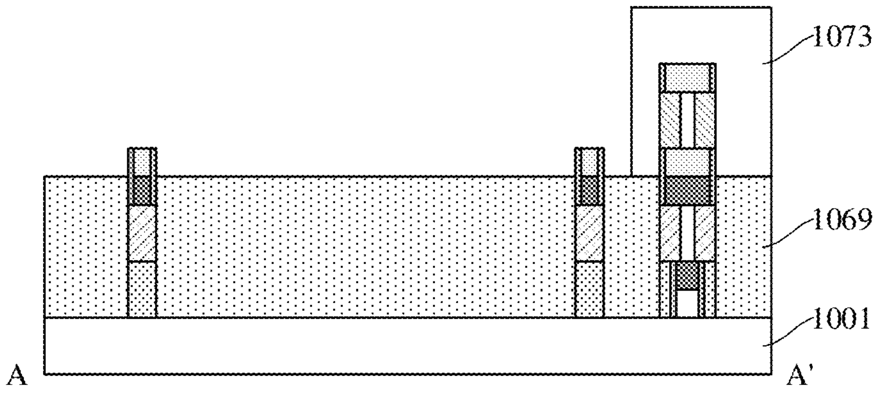
Figure 46C:
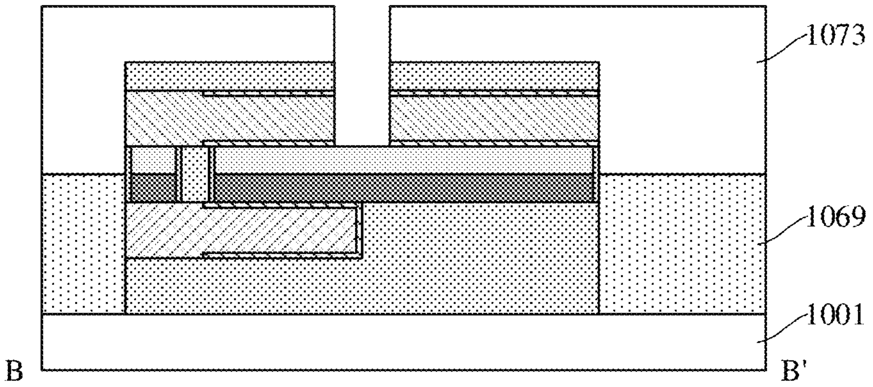

Currently, the upper gate electrode layer 1071 extends continuously, and an isolation is required between the pull-down transistor and the pass gate transistor and between the first group of transistors and the second group of transistors. For example, as shown in FIG. 46(*a*), FIG. 46(*b*) and FIG. 46(*c*) (which are respectively a top view, a cross-sectional view taken along line AA', and a cross-sectional view taken along line BB'), the currently remaining hard mask (specifically, the aluminum oxide layers 1019 and 1025) may be removed by a selective etching, and a photoresist 1073 may be formed on the obtained structure. The photoresist 1073 is patterned to expose a region where an isolation is required. Specifically, in the top view of FIG. 46(*a*), on the first side S1, a region between the first pull-down transistor PD-1 and the first pass gate transistor PG-1 may be exposed; on the third side S3, a region between the second pull-down transistor PD-2 and the second pass gate transistor PG-2 may be exposed. In addition, a region between the two groups (corresponding to the first side S1 and the third side S3 respectively) may also be exposed. More specifically, the region between the first pull-down transistor PD-1 and the second pass gate transistor PG-2 may be exposed on the second side S2, and the region between the second pull-down transistor PD-2 and the first pass gate transistor PG-1 may be exposed on the fourth side S4. With the photoresist 1073 as an etching mask, each layer (for example, the occupying layer 1061, the gate dielectric layer 1063, and the gate electrode layer 1071) may be etched downward by, for example, RIE, until the gate electrode layer 1071 is cut off. In a case of a small device size or a small opening in the photoresist 1073, an isotropic etching may be performed on the gate electrode layer 1071, so as to cut off the gate electrode layer 1071 under the occupying layer 1049 by undercutting.

Therefore, the gate electrode layer 1071 may be separated into four portions respectively for the first pull-down transistor PD-1, the first pass gate transistor PG-1, the second pull-down transistor PD-2 and the second pass gate transistor PG-2 (referring to FIG. 46(*a*)), and these four portions are separated from each other.

In addition, the occupying layer 1061 (corresponding to the second source/drain layer 1017) above the gate electrode layer 1071 may be similarly divided into four branches, including a branch BR1 corresponding to the first pull-down transistor PD-1 (hereinafter referred to as a "first pull-down branch"), a branch BR2 corresponding to the first pass gate transistor PG-1 (hereinafter referred to as a "first pass gate branch"), a branch BR3 corresponding to the second pull-down transistor PD-2 (hereinafter referred to as a "second pull-down branch"), and a branch BR4 corresponding to the second pass gate transistor PG-2 (hereinafter referred to as a "second pass gate branch"). These branches are separated by the same etching process as the gate stacks in the upper layer, and therefore may be self-aligned with the corresponding gate stacks in the upper layer.

The first pull-down branch BR1, the first pass gate branch BR2, the second pull-down branch BR3, and the second pass gate branch BR4 substantially extend along the ring-shaped pattern of the hard mask, and therefore may be self-aligned with other structures defined by the hard mask in the device (such as the interconnection structures, and a dielectric ring to be described later, etc.). The first pull-down branch BR1 and the first pass gate branch BR2 extend mainly in the first direction and may be substantially aligned with each other in the first direction (originating from the same side S1 of the ring-shaped pattern). The second pull-down branch BR3 and the second pass gate branch BR4 extend mainly in the first direction and may be substantially aligned with each other in the first direction (originating from the same side S3 of the ring-shaped pattern).

The upper source/drain layer of the first pull-up transistor may be provided on an outer sidewall of the first pull-down branch BR1, the upper source/drain layer of the first pass gate transistor may be provided on an outer sidewall of the first pass gate branch BR2, the upper source/drain layer of the second pull-up transistor may be provided on an outer sidewall of the second pull-down branch BR3, and the upper source/drain layer of the second pass gate transistor may be provided on an outer sidewall of the second pass gate branch BR4.

So far, the production of the SRAM cell is substantially completed. Next, interconnection structures, such as various via holes and wires, may be produced, which will not be described in detail here.

FIG. 47 schematically shows a perspective view of an SRAM cell according to embodiments of the present disclosure. A back side of the device is not clearly shown in the perspective view of FIG. 47 due to the angle of view. However, as described above, the SRAM cell according to embodiments of the present disclosure may have a substantially symmetrical structure, and those skilled in the art may clearly understand an overall structure of the SRAM cell according to previous relevant descriptions.

As shown in FIG. 47, the SRAM cell may have a stack, including from bottom to top: a first level, including a dielectric ring DILR (formed by the occupying layer 1061); a second level, including a gate stack for a lower-layer transistor, where the corresponding channel layer surrounded by the gate stack is also located in this level; a third level, including the first interconnection structure IIC1 and the second interconnection structure IIC2; a fourth level, including a gate stack for an upper-layer transistor, where the corresponding channel layer surrounded by the gate stack is also located in this level; a fifth level, including branches BR1 to BR4 and the upper source/drain layer for the upper-layer transistors.

The SRAM cell as a whole may in a form of a ring-shaped pattern with a protruding pattern defined by the hard mask as previously described (without considering the contact plug on one side). Specifically, each level may substantially present this pattern. Various levels may be self-aligned with each other and may overlap with each other in the vertical direction.

The dielectric ring DILR may include a fifth protruding portion PR5, and the lower source/drain layer of the first pull-up transistor PU-1 may be embedded in the fifth protruding portion PR5 (for example, referring to the cross-sectional view shown in FIG. 43(*c*), where the first source/drain layer 1007 is embedded in the occupying layer 1061). That is to say, the fifth protruding portion PR5 may have a hole or cavity to accommodate the lower source/drain layer of the first pull-up transistor PU-1. In addition, the dielectric ring DILR may include a seventh protruding portion PR7, and the dummy source/drain layer may be embedded in the seventh protruding portion PR7 (for example, referring to the cross-sectional view shown in FIG. 43(*d*), where the first source/drain layer 1007 is embedded in the occupying layer 1061). That is to say, the seventh protruding portion PR7 may have a hole or cavity to accommodate the dummy source/drain layer.

Similarly, although not shown in the perspective view of FIG. 47, the dielectric ring DILR may include a sixth protruding portion, and the lower source/drain layer of the second pull-up transistor PU-2 may be embedded in the sixth protruding portion (for example, referring to the cross-sectional view shown in FIG. 43(*d*)). That is to say, the sixth protruding portion may have a hole or cavity to accommodate the lower source/drain layer of the second pull-up transistor PU-2. In addition, the dielectric ring DILR may include an eighth protruding portion, and the dummy source/drain layer may be embedded in the eighth protruding portion (for example, referring to the cross-sectional view shown in FIG. 43(*c*)). That is to say, the eighth protruding portion may have a hole or cavity to accommodate the dummy source/drain layer.

No channel layer or gate stack is formed between the dummy source/drain layer and the interconnection structure. The dielectric ring DILR may include a portion between the dummy source/drain layer and the interconnection structure above.

According to embodiments of the present disclosure, the constitute transistors of the SRAM cell may be arranged in a vertical stack, so as to save an area. The transistors in upper and lower layers may be stacked in a self-aligning manner, so that the area may be further saved. The channel layer of the transistor may be formed by a separate epitaxial process, thus ensuring a material quality of a grown film and accurately controlling a film thickness. In addition, a channel width of the pull-down transistor and a channel width of the pass gate transistor in the SRAM cell may be flexibly defined by a photolithography process, and a channel length of the pull-up transistor may be continuously adjusted by a control of the thickness of the epitaxially grown film. Therefore, the entire SRAM cell may flexibly adjust a transistor driving force for each type of transistor. The constituent transistors in the SRAM cell may be interconnected with each other through a silicon interconnection technology, so that the area may be saved, and a pressure of back channel metal interconnection may be relieved.

The SRAM cell according to embodiments of the present disclosure may be applied to various electronic apparatuses. For example, a memory may be formed based on such SRAM cell, and an electronic apparatus may be constructed accordingly. Therefore, the present disclosure further provides a memory including the SRAM cell described above and an electronic apparatus including such memory. The electronic apparatus may further include components such as a processor compatible with the memory. Such electronic apparatus may include, for example, a smart phone, a computer, a tablet computer (PC), a wearable smart device, a mobile power supply, etc.

The present disclosure further relates to the following aspects.

1. A method of manufacturing a static random access memory (SRAM) cell, including:

providing a stack of a first source/drain layer, a first channel defining layer and a second source/drain layer in a first group and a first source/drain layer, a second channel defining layer and a second source/drain layer in a second group sequentially on a substrate;

forming a hard mask layer on the stack, where the hard mask has a rectangular ring pattern, a first protruding pattern, a second protruding pattern, a third protruding pattern, and a fourth protruding pattern, where the rectangular ring pattern has a first side and a third side extending in a first direction and opposite to each other, and a second side and a fourth side extending in a second direction intersecting with the first direction and opposite to each other, the first protruding pattern and the second protruding pattern are provided on the first side of the rectangular ring pattern, and the third protruding pattern and the fourth protruding pattern are provided on the third side of the rectangular ring pattern;

patterning an outer side of the stack by using the hard mask layer;

refining the channel defining layers so that a first pull-up portion and a second pull-up portion that respectively overlap with the first protruding pattern and the third protruding pattern in the vertical direction are retained in the first channel defining layer and are respectively recessed laterally relative to the first protruding pattern and the third protruding pattern, and that a first pull-down portion, a first pass gate portion, a second pull-down portion and a second pass gate portion that respectively overlap with the first protruding pattern to the fourth protruding pattern in the vertical direction are retained in the second channel defining layer and are respectively recessed laterally relative to the first protruding pattern to the fourth protruding pattern;

forming channel layers on vertical sidewalls of end portions in the second direction of the first pull-up portion, the second pull-up portion, the first pull-down portion, the first pass gate portion, the second pull-down portion and the second pass gate portion of the channel defining layers; and patterning an inner side of the stack using the hard mask layer, where the patterning further includes:

performing a selective etching on the second source/drain layer in the second group, so that the second source/drain layer in the second group is separated into four separate portions respectively corresponding to the first protruding pattern to the fourth protruding pattern;

removing the second channel defining layer;

cutting off the second source/drain layer in the first group and the first source/drain layer in the first group in a region between the first protruding pattern and the fourth side and in a region between the third protruding pattern and the second side, so as to form a first interconnection structure and a second interconnection structure; and removing the first channel defining layer.

2. The method according to aspect 1, where the rectangular ring pattern of the hard mask layer is defined by a spacer.

3. The method according to aspect 1 or 2, where the first protruding pattern and the third protruding pattern are aligned with each other in the second direction, and the second protruding pattern and the fourth protruding pattern are aligned with each other in the second direction.

4. The method according to any one of the above aspects, where the first protruding pattern and the third protruding pattern are defined by a strip structure extending across the rectangular ring pattern in the second direction, and the second protruding pattern and the fourth protruding pattern are defined by another strip structure extending across the rectangular ring pattern in the second direction.

5. The method according to aspect 4, where the patterning the outer side of the stack includes: patterning the outer side of the stack in the presence of the strip structure, and where the refining the channel defining layer includes: performing a first refinement on the channel defining layer; forming a shielding layer to shield the outer side of the stack; performing an inter-device isolation in the second direction, so that the strip pattern is cut off to define the protruding patterns in an isolation process; forming a shielding layer to shield a portion of the first channel defining layer that overlaps with the second protruding pattern and the fourth protruding pattern in the vertical direction; and performing a second refinement on the channel defining layer.

In the above descriptions, the technical details such as patterning and etching of each layer are not described in detail. However, those skilled in the art should understand that various technical means may be used to form layers, regions, etc. of desired shapes. In addition, in order to form the same structure, those skilled in the art may further design a method that is not completely the same as the methods described above. In addition, although various embodiments are described above separately, this does not mean that the measures in the various embodiments may not be advantageously used in combination.

Embodiments of the present disclosure have been described above. However, these embodiments are just for illustrative purposes, and are not intended to limit the scope of the present disclosure. The scope of the present disclosure is defined by the appended claims and their equivalents. Those skilled in the art may make various substitutions and modifications without departing from the scope of the present disclosure, and those substitutions and modifications should all fall within the scope of the present disclosure.

What is claimed is:

1. A static random access memory (SRAM) cell, comprising:

a substrate;

a first interconnection structure and a second interconnection structure on the substrate, wherein the first interconnection structure and the second interconnection structure extend substantially parallel to an upper surface of the substrate and are opposite to each other;

a first pull-down transistor and a first pass gate transistor, wherein the first pull-down transistor and the first pass gate transistor are arranged on the first interconnection structure;

a second pull-down transistor and a second pass gate transistor, wherein the second pull-down transistor and the second pass gate transistor are arranged on the second interconnection structure;

a first pull-up transistor arranged under the first interconnection structure and at least partially overlapping with the first pull-down transistor in a vertical direction; and a second pull-up transistor arranged under the second interconnection structure and at least partially overlapping with the second pull-down transistor in the vertical direction, wherein each of the first pull-up transistor, the second pull-up transistor, the first pull-down transistor, the second pull-down transistor, the first pass gate transistor and the second pass gate transistor comprises a first source/drain layer, a channel layer and a second source/drain layer arranged sequentially in the vertical direction, wherein the channel layer of the first pull-up transistor, the channel layer of the first pull-down transistor and the channel layer of the first pass gate transistor are offset relative to the first interconnection structure on a side away from the second interconnection structure, and wherein the channel layer of the second pull-up transistor, the channel layer of the second pull-down transistor and the channel layer of the second pass gate transistor are offset relative to the second interconnection structure on a side away from the first interconnection structure.

2. The SRAM cell according to claim 1, wherein each of the channel layer of the first pull-up transistor, the channel layer of the second pull-up transistor, the channel layer of the first pull-down transistor, the channel layer of the second pull-down transistor, the channel layer of the first pass gate transistor and the channel layer of the second pass gate transistor comprises a first lateral extension portion extending on a top surface of the first source/drain layer, a second lateral extension portion extending on a bottom surface of the second source/drain layer, and a vertical portion extending vertically and connecting the first lateral extension portion and the second lateral extension portion.

3. The SRAM cell according to claim 2, wherein:

the channel layer of the first pull-down transistor is in a C-shape with an opening away from the second pass gate transistor, the channel layer of the first pass gate transistor is in a C-shape with an opening away from the second pull-down transistor, the channel layer of the second pull-down transistor is in a C-shape with an opening away from the first pass gate transistor, the channel layer of the second pass gate transistor is in a C-shape with an opening away from the first pull-down transistor, the channel layer of the first pull-up transistor is in a C-shape with an opening facing a same direction as the opening of the C-shape of the channel layer of the first pull-down transistor, and the channel layer of the second pull-up transistor is in a C-shape with an opening facing a same direction as the opening of the C-shape of the channel layer of the second pull-down transistor.

4. The SRAM cell according to claim 3, wherein the channel layer of the first pull-up transistor, the channel layer of the second pull-up transistor, the channel layer of the first pull-down transistor, the channel layer of the second pull-down transistor, the channel layer of the first pass gate transistor, and the channel layer of the second pass gate transistor are self-aligned between respective first source/drain layers and respective second source/drain layers.

5. The SRAM cell according to claim 1, wherein the channel layer is a nanosheet or nanowire.

6. The SRAM cell according to claim 1, wherein the first interconnection structure comprises a first segment and a second segment, the first segment extends in a first direction substantially parallel to the upper surface of the substrate, and the second segment extends in a second direction substantially parallel to the upper surface of the substrate and intersecting with the first direction, and the second interconnection structure comprises a third segment extending in the first direction and a fourth segment extending in the second direction, the first segment and the third segment are opposite to each other, and the second segment and the fourth segment are opposite to each other, wherein the first segment comprises a first protruding portion and a second protruding portion, the first protruding portion and the second protruding portion protrude in a direction away from the third segment, the first protruding portion forms the first source/drain layer of the first pull-down transistor and the second source/drain layer of the first pull-up transistor, and the second protruding portion forms the first source/drain layer of the first pass gate transistor, and wherein the third segment comprises a third protruding portion and a fourth protruding portion, the third protruding portion and the fourth protruding portion protrude in a direction away from the first segment, the third protruding portion forms the first source/drain layer of the second pull-down transistor and the second source/drain layer of the second pull-up transistor, and the fourth protruding portion forms the first source/drain layer of the second pass gate transistor.

7. The SRAM cell according to claim 6, wherein the second source/drain layer of the first pull-down transistor, the second source/drain layer of the second pull-down transistor, the second source/drain layer of the first pass gate transistor, and the second source/drain layer of the second pass gate transistor are separated from each other and self-aligned with respective first source/drain layers.

8. The SRAM cell according to claim 6, wherein the first interconnection structure comprises a first interconnection sub-structure and a second interconnection sub-structure stacked on the first interconnection sub-structure, a portion of the first protruding portion on the first interconnection sub-structure forms the second source/drain layer of the first pull-up transistor, and a portion of the first protruding portion on the second interconnection sub-structure forms the first source/drain layer of the first pull-down transistor, and wherein the second interconnection structure comprises a third interconnection sub-structure and a fourth interconnection sub-structure stacked on the third interconnection sub-structure, a portion of the third protruding portion on the third interconnection sub-structure forms the second source/drain layer of the second pull-up transistor, and a portion of the third protruding portion on the fourth interconnection sub-structure forms the first source/drain layer of the second pull-down transistor.

9. The SRAM cell according to claim 6, further comprising:

a ring structure of dielectric, wherein the ring structure comprises a first side corresponding to the first segment, a second side corresponding to the second segment, a third side corresponding to the third segment, and a fourth side corresponding to the fourth segment, wherein the first side comprises a fifth protruding portion protruding in a direction away from the third side, and a hole formed in the fifth protruding portion accommodates the first source/drain layer of the first pull-up transistor, and wherein the third side comprises a sixth protruding portion protruding in a direction away from the first side, and a hole formed in the sixth protruding portion accommodates the first source/drain layer of the second pull-up transistor.

10. The SRAM cell according to claim 9, wherein the first source/drain layer of the first pull-up transistor and the first source/drain layer of the second pull-up transistor are self-aligned with respective second source/drain layers.

11. The SRAM cell according to claim 9, wherein the first side, the second side, the third side, and the fourth side are self-aligned with the first segment, the second segment, the third segment, and the fourth segment, respectively, and the first side, the second side, the third side, and the fourth side overlap with the first segment, the second segment, the third segment, and the fourth segment in the vertical direction, respectively.

12. The SRAM cell according to claim 9, wherein the first side further comprises a seventh protruding portion protruding in the direction away from the third side, and a hole formed in the seventh protruding portion accommodates a first dummy source/drain layer, and the third side further comprises an eighth protruding portion protruding in the direction away from the first side, and a hole formed in the eighth protruding portion accommodates a second dummy source/drain layer, wherein the first dummy source/drain layer and the second dummy source/drain layer comprise substantially a same material as the first source/drain layer of the first pull-up transistor and the first source/drain layer of the second pull-up transistor, and wherein the ring structure comprises a portion between the first dummy source/drain layer and the first interconnection structure and a portion between the second dummy source/drain layer and the second interconnection structure.

13. The SRAM cell according to claim 12, wherein the fifth protruding portion, the sixth protruding portion, the seventh protruding portion, and the eighth protruding portion are self-aligned with the first protruding portion, the third protruding portion, the second protruding portion, and the fourth protruding portion, respectively.

14. The SRAM cell according to claim 9, further comprising:

a first pull-down branch and a first pass gate branch, wherein the first pull-down branch and the first pass gate branch extend at least partially in the first direction and are substantially aligned with each other in the first direction; and a second pull-down branch and a second pass gate branch, wherein the second pull-down branch and the second pass gate branch extend at least partially in the first direction and are substantially aligned with each other in the first direction, the first pull-down branch, the second pull-down branch, the first pass gate branch and the second pass gate branch comprise substantially a same dielectric material, and the first pull-down branch and the first pass gate branch are spaced apart from the second pull-down branch and the second pass gate branch in the second direction, wherein:

the second source/drain layer of the first pull-down transistor is provided on a sidewall of the first pull-down branch away from the second pass gate branch, the second source/drain layer of the first pass gate transistor is provided on a sidewall of the first pass gate branch away from the second pull-down branch, the second source/drain layer of the second pull-down transistor is provided on a sidewall of the second pull-down branch away from the first pass gate branch, and the second source/drain layer of the second pass gate transistor is provided on a sidewall of the second pass gate branch away from the first pull-down branch.

15. The SRAM cell according to claim 14, wherein the first pull-down branch, the first pass gate branch, the second pull-down branch, and the second pass gate branch are self-aligned with the ring structure and overlap with the ring structure in the vertical direction.

16. The SRAM cell according to claim 14, further comprising:

a first pull-down gate stack self-aligned with the first pull-down branch;

a first pass gate stack self-aligned with the first pass gate branch;

a second pull-down gate stack self-aligned with the second pull-down branch; and a second pass gate stack self-aligned with the second pass gate branch.

17. The SRAM cell according to claim 16, wherein:

the first pull-down gate stack comprises:

a first portion arranged between the first protruding portion and the second source/drain layer of the first pull-down transistor and surrounding a vertical portion of the channel layer of the first pull-down transistor; and a second portion extending along the first pull-down branch, wherein the first pull-down gate stack comprises a gate dielectric layer and a gate electrode layer on the gate dielectric layer, the gate electrode layer comprises an extending portion extending beyond the gate dielectric layer, the extending portion of the gate electrode layer of the first pull-down gate stack is electrically connected to the second interconnection structure, and the gate electrode layer of the first pull-down gate stack is electrically insulated from the first interconnection structure by the gate dielectric layer of the first pull-down gate stack, the first pass gate stack comprises:

a first portion arranged between the second protruding portion and the second source/drain layer of the first pass gate transistor and surrounding a vertical portion of the channel layer of the first pass gate transistor; and a second portion extending along the first pass gate branch, wherein the first pass gate stack comprises a gate dielectric layer and a gate electrode layer on the gate dielectric layer, and the gate electrode layer of the first pass gate stack is electrically insulated from the first interconnection structure by the gate dielectric layer of the first pass gate stack, the second pull-down gate stack comprises:

a first portion arranged between the third protruding portion and the second source/drain layer of the second pull-down transistor and surrounding a vertical portion of the channel layer of the second pull-down transistor; and a second portion extending along the second pull-down branch, wherein the second pull-down gate stack comprises a gate dielectric layer and a gate electrode layer on the gate dielectric layer, the gate electrode layer comprises an extending portion extending beyond the gate dielectric layer, the extending portion of the gate electrode layer of the second pull-down gate stack is electrically connected to the first interconnection structure, and the gate electrode layer of the second pull-down gate stack is electrically insulated from the second interconnection structure by the gate dielectric layer of the second pull-down gate stack, and the second pass gate stack comprises:

a first portion arranged between the fourth protruding portion and the second source/drain layer of the second pass gate transistor and surrounding a vertical portion of the channel layer of the second pass gate transistor; and a second portion extending along the second pass gate branch, wherein the second pass gate stack comprises a gate dielectric layer and a gate electrode layer on the gate dielectric layer, and the gate electrode layer of the second pass gate stack is electrically insulated from the second interconnection structure by the gate dielectric layer of the second pass gate stack.

18. The SRAM cell according to claim 9, further comprising:

a first pull-up gate stack self-aligned with the channel layer of the first pull-up transistor and surrounding a vertical portion of the channel layer of the first pull-up transistor; and a second pull-up gate stack self-aligned with the channel layer of the second pull-up transistor and surrounding a vertical portion of the channel layer of the second pull-up transistor.

19. The SRAM cell according to claim 18, wherein the first pull-up gate stack and the second pull-up gate stack are self-aligned with the ring structure and overlap with the ring structure in the vertical direction.

20. The SRAM cell according to claim 18, wherein:

the first pull-up gate stack comprises:

a first portion arranged between the first protruding portion and the fifth protruding portion and surrounding the vertical portion of the channel layer of the first pull-up transistor; and a second portion extending towards the fourth segment along the ring structure, wherein the first pull-up gate stack comprises a gate dielectric layer and a gate electrode layer on the gate dielectric layer, the gate electrode layer comprises an extending portion extending beyond the gate dielectric layer, the extending portion of the gate electrode layer of the first pull-up gate stack is electrically connected to the second interconnection structure, and the gate electrode layer of the first pull-up gate stack is electrically insulated from the first interconnection structure by the gate dielectric layer of the first pull-up gate stack, and the second pull-up gate stack comprises:

a first portion arranged between the third protruding portion and the sixth protruding portion and surrounding the vertical portion of the channel layer of the second pull-up transistor; and a second portion extending towards the second segment along the ring structure, wherein the second pull-up gate stack comprises a gate dielectric layer and a gate electrode layer on the gate dielectric layer, the gate electrode layer comprises an extending portion extending beyond the gate dielectric layer, the extending portion of the gate electrode layer of the second pull-up gate stack is electrically connected to the first interconnection structure, and the gate electrode layer of the second pull-up gate stack is electrically insulated from the second interconnection structure by the gate dielectric layer of the second pull-up gate stack.

21. A memory, comprising the SRAM cell according to claim 1.

22. An electronic apparatus, comprising a memory according to claim 21 and a processor operably coupled with the memory.

23. The electronic apparatus according to claim 22, wherein the electronic apparatus comprises at least one of a smart phone, a computer, a tablet computer, a wearable smart apparatus, an artificial intelligence apparatus, or a mobile power supply.

* * * * *